(12) United States Patent  
Akimoto et al.

(10) Patent No.: US 9,006,729 B2
(45) Date of Patent: Apr. 14, 2015

(54) SEMICONDUCTOR DEVICE AND MANUFACTURING METHOD THEREOF

(75) Inventors: Kengo Akimoto, Atsugi (JP); Junichiro Sakata, Atsugi (JP); Yoshiaki Oikawa, Sagamihara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 821 days.

(21) Appl. No.: 12/943,558

(22) Filed: Nov. 10, 2010

(65) Prior Publication Data

US 2011/0114942 A1    May 19, 2011

(30) Foreign Application Priority Data

Nov. 13, 2009  (JP) .................................. 2009-259859

(51) Int. Cl.
*H01L 29/10* (2006.01)
*H01L 29/12* (2006.01)
*H01L 29/786* (2006.01)
*H01L 29/45* (2006.01)

(52) U.S. Cl.
CPC ............ *H01L 29/7869* (2013.01); *H01L 29/45* (2013.01)

(58) Field of Classification Search
CPC .................... H01L 29/7869; H01L 29/66969; H01L 27/1225
USPC ...................... 257/43, E29.296, 288, 347, 368
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| CN | 101325220 A | 12/2008 |
| EP | 1737044 A | 12/2006 |

(Continued)

OTHER PUBLICATIONS

International Search Report (Application No. PCT/JP2010/068771) Dated Dec. 14, 2010.

(Continued)

*Primary Examiner* — Jarrett Stark
*Assistant Examiner* — John M Parker
(74) *Attorney, Agent, or Firm* — Eric J. Robinson; Robinson Intellectual Property Law Office, P.C.

(57) ABSTRACT

It is an object to provide a method for manufacturing a highly reliable semiconductor device having a thin film transistor formed using an oxide semiconductor and having stable electric characteristics. The semiconductor device includes an oxide semiconductor film overlapping with a gate electrode with a gate insulating film interposed therebetween; and a source electrode and a drain electrode which are in contact with the oxide semiconductor film. The source electrode and the drain electrode include a mixture, metal compound, or alloy containing one or more of a metal with a low electronegativity such as titanium, magnesium, yttrium, aluminum, tungsten, and molybdenum. The concentration of hydrogen in the source electrode and the drain electrode is 1.2 times, preferably 5 times or more as high as that of hydrogen in the oxide semiconductor film.

30 Claims, 30 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,580,276 B2 | 8/2009 | Sawa et al. |
| 7,674,650 B2 | 3/2010 | Akimoto et al. |
| 7,732,819 B2 | 6/2010 | Akimoto et al. |
| 7,737,438 B2 | 6/2010 | Endo et al. |
| 7,791,074 B2 | 9/2010 | Iwasaki |
| 7,804,088 B2 | 9/2010 | Tanaka et al. |
| 7,838,885 B2 | 11/2010 | Yang et al. |
| 7,855,379 B2 | 12/2010 | Hayashi et al. |
| 7,919,365 B2 | 4/2011 | Kim et al. |
| 7,935,582 B2 | 5/2011 | Iwasaki |
| 7,956,361 B2 | 6/2011 | Iwasaki |
| 8,049,255 B2 | 11/2011 | Sakai et al. |
| 8,088,652 B2 | 1/2012 | Hayashi et al. |
| 8,154,024 B2 | 4/2012 | Iwasaki |
| 8,164,256 B2 | 4/2012 | Sano et al. |
| 8,384,077 B2 | 2/2013 | Yano et al. |
| 8,436,349 B2 | 5/2013 | Sano et al. |
| 8,541,944 B2 | 9/2013 | Sano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0164294 A1* | 8/2004 | Son et al. .................. 257/40 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto et al. ............... 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0241327 A1 | 10/2007 | Kim et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0272370 A1* | 11/2008 | Endo et al. ............... 257/43 |
| 2008/0296568 A1 | 12/2008 | Ryu et al. |
| 2009/0001881 A1 | 1/2009 | Nakayama |
| 2009/0045397 A1 | 2/2009 | Iwasaki |
| 2009/0065771 A1* | 3/2009 | Iwasaki et al. ............... 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0250695 A1 | 10/2009 | Tanaka et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0084648 A1 | 4/2010 | Watanabe |
| 2010/0090217 A1 | 4/2010 | Akimoto |
| 2010/0092800 A1 | 4/2010 | Itagaki et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |
| 2010/0283049 A1* | 11/2010 | Sato et al. ............... 257/43 |
| 2010/0289020 A1 | 11/2010 | Yano et al. |
| 2011/0092017 A1 | 4/2011 | Akimoto et al. |
| 2013/0146452 A1 | 6/2013 | Yano et al. |

FOREIGN PATENT DOCUMENTS

| | | |
|---|---|---|
| EP | 1770788 A | 4/2007 |
| EP | 2001046 A | 12/2008 |
| EP | 2003695 A | 12/2008 |
| EP | 2009683 A | 12/2008 |
| EP | 2226847 A | 9/2010 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-031588 A | 1/2003 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2007-096055 | 4/2007 |
| JP | 2007-103918 A | 4/2007 |
| JP | 2007-123861 | 5/2007 |
| JP | 2007-284342 A | 11/2007 |
| JP | 2008-072025 A | 3/2008 |
| JP | 2008-108687 A | 5/2008 |
| JP | 2008-141119 A | 6/2008 |
| JP | 2008-235871 A | 10/2008 |
| JP | 2008-305843 A | 12/2008 |
| JP | 2009-099847 A | 5/2009 |
| JP | 2009-267399 A | 11/2009 |
| WO | WO-2004/114391 | 12/2004 |
| WO | WO-2007/029844 | 3/2007 |
| WO | WO-2008/069286 | 6/2008 |
| WO | WO-2008/105347 | 9/2008 |
| WO | WO-2008/126879 | 10/2008 |
| WO | WO-2009/072532 | 6/2009 |
| WO | WO-2009/075281 | 6/2009 |
| WO | WO 2009072532 A1 * | 6/2009 ............ H01L 29/786 |

OTHER PUBLICATIONS

Written Opinion (Application No. PCT/JP2010/068771) Dated Dec. 14, 2010.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimenional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In-Ga-Zn-Oxide TFTs,", IDW '09 : Proceedings of the 16th International Display Workshops, 2009, pp. 689-692.

(56) References Cited

OTHER PUBLICATIONS

Park.J et al., "Amorphous Indium-Gallium-Zinc Oxide TFTs and their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Chinese Office Action (Application No. 201080052545.7) Dated Jul. 3, 2014.

* cited by examiner

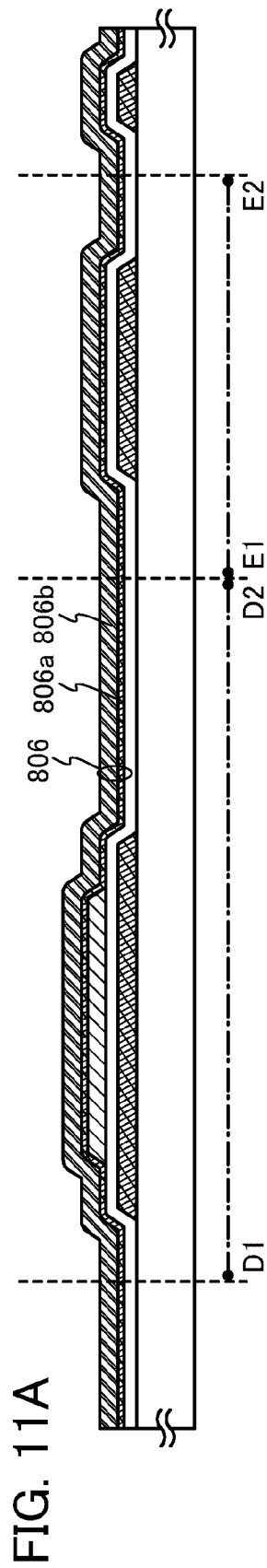
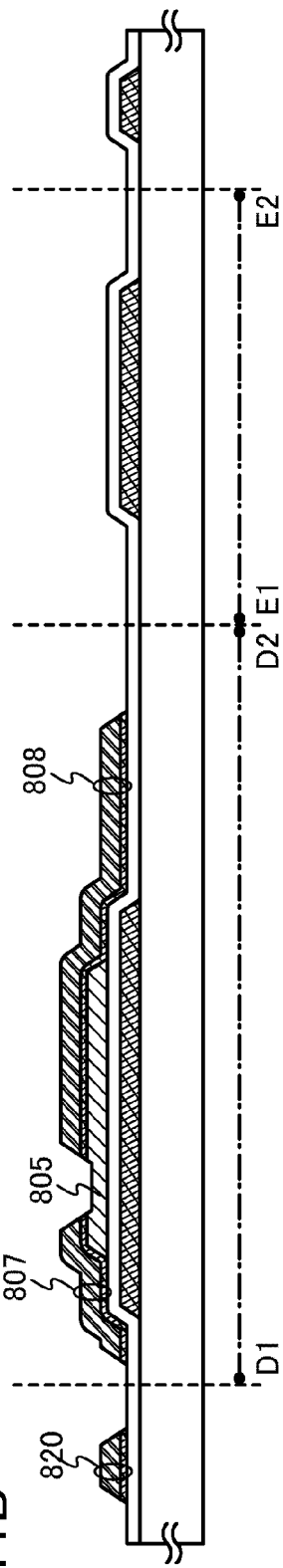
FIG. 11A
FIG. 11B

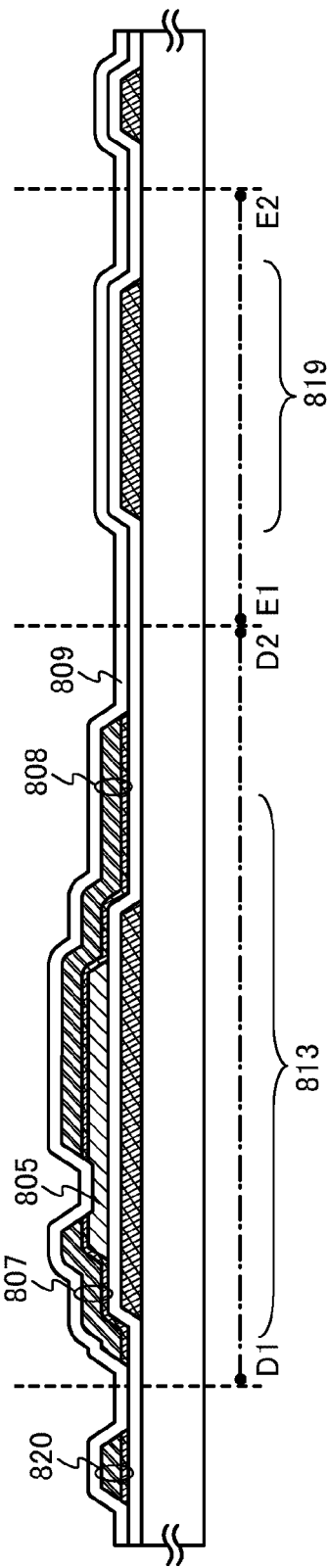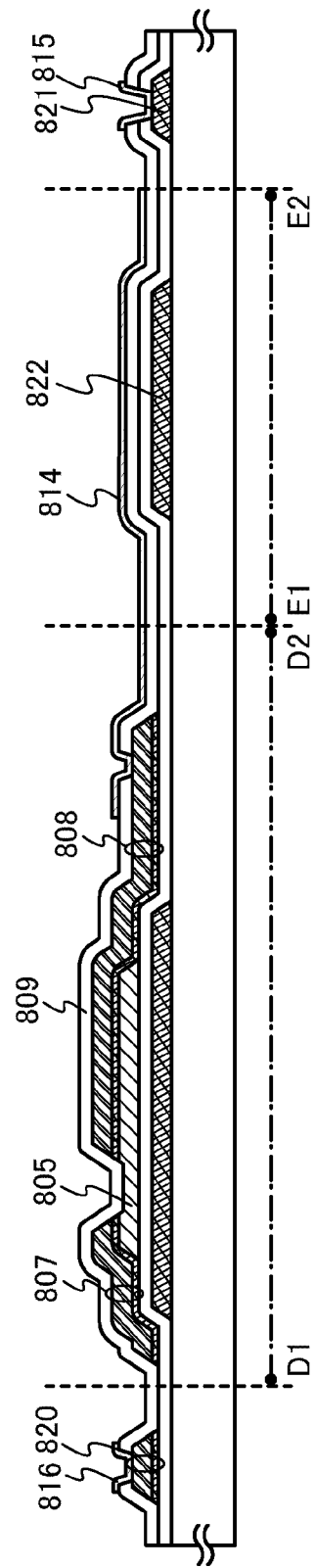

FIG. 13
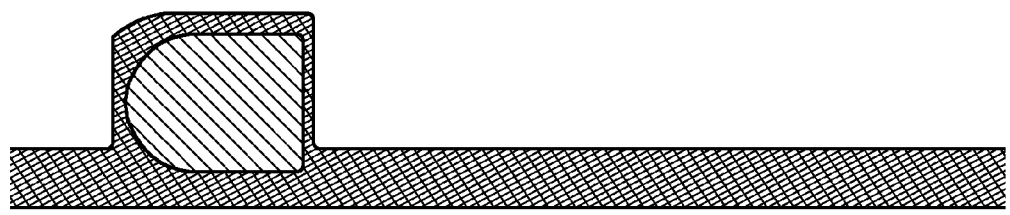
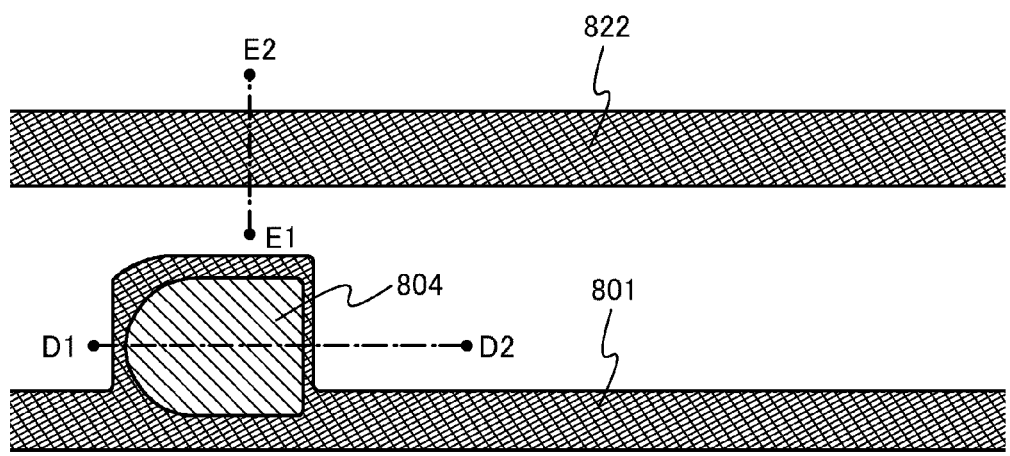

SEMICONDUCTOR DEVICE AND MANUFACTURING METHOD THEREOF

TECHNICAL FIELD

The present invention relates to a semiconductor device including an oxide semiconductor and a manufacturing method thereof.

BACKGROUND ART

A thin film transistor including a semiconductor film formed over an insulating surface is an essential semiconductor element for a semiconductor device. Since manufacturing the thin film transistor is limited in terms of allowable temperature limit of a substrate, a thin film transistor including, as an active layer, amorphous silicon which can be formed at a relatively low temperature, polysilicon which can be obtained by crystallization by using a laser beam or a catalytic element, or the like is mainly used as a transistor for the semiconductor display device.

In recent years, a metal oxide having semiconductor characteristics which is referred to as an oxide semiconductor has attracted attention as a novel semiconductor material which has both high mobility, which is a characteristic of polysilicon, and uniform element characteristics, which is a characteristic of amorphous silicon. The metal oxide is used for various applications. For example, indium oxide is a well-known metal oxide and used as a material of a transparent electrode included in a liquid crystal display device or the like. Examples of such metal oxides having semiconductor characteristics include tungsten oxide, tin oxide, indium oxide, zinc oxide, and the like. A thin film transistor including such a metal oxide having semiconductor characteristics in a channel formation region has been known (Patent Documents 1 and 2).

REFERENCE

[Patent Document 1] Japanese Published Patent Application No. 2007-123861
[Patent Document 2] Japanese Published Patent Application No. 2007-096055

DISCLOSURE OF INVENTION

Transistors used for semiconductor devices preferably have a small variation in threshold voltage, which is caused by degradation over time, low off-state current, or the like. When transistors having a small variation in threshold voltage, which is caused by degradation over time, are used, reliability of semiconductor devices can be increased. In addition, when transistors with low off-state current are used, power consumption of semiconductor devices can be suppressed.

It is an object of the present invention to provide a method for manufacturing a highly reliable semiconductor device. It is another object of the present invention to provide a method for manufacturing a semiconductor device with low power consumption. It is still another object of the present invention to provide a highly reliable semiconductor device. It is an object of the present invention to provide a semiconductor device with low power consumption.

The present inventors have paid their attention to the fact that impurities such as hydrogen or water existing in an oxide semiconductor film cause degradation to transistors over time, such as shifts in threshold voltage. Then, they have thought that a conductive film formed using a metal with a low electronegativity, specifically, a metal with an electronegativity lower than 2.1 which is the electronegativity of hydrogen, is formed so as to be in contact with an oxide semiconductor film, so that impurities such as hydrogen or water in the oxide semiconductor film are absorbed (gettered) by the conductive film to increase purity of the oxide semiconductor film and degradation of a transistor over time is suppressed. The conductive film is processed into a desired shape, so that a source electrode and a drain electrode can be formed.

Specifically, a semiconductor device according to one embodiment of the present invention includes an oxide semiconductor film which overlaps with a gate electrode with a gate insulating film interposed therebetween, and a source electrode and a drain electrode which are in contact with the oxide semiconductor film. The source electrode and the drain electrode have a metal with a low electronegativity. The concentration of hydrogen in the source electrode and the drain electrode is 1.2 times or more as high as that of hydrogen in the oxide semiconductor film, preferably 5 times or more as high as that of hydrogen in the oxide semiconductor film.

As the metal with a low electronegativity, titanium, magnesium, yttrium, aluminum, tungsten, molybdenum, and the like can be given. A mixture, a metal compound, or an alloy which contains one or more of these metals can be used as the conductive film for the source electrode and the drain electrode. Further, the above material may be combined with a heat-resistant conductive material such as an element selected from tantalum, chromium, neodymium, and scandium; an alloy containing one or more of these elements as a component; a nitride containing the element as a component.

Note that the source electrode and the drain electrode may be formed using a single conductive film or a plurality of conductive films stacked. When the source electrode and the drain electrode are formed using a plurality of conductive films stacked, among the plurality of conductive films, at least one conductive film which is in contact with the oxide semiconductor film may be formed using a metal with a low electronegativity such as titanium, magnesium, yttrium, aluminum, tungsten, or molybdenum; a mixture, a metal compound, or an alloy which uses the metal. The concentration of hydrogen in one of the conductive films which is in contact with the oxide semiconductor film is 1.2 times, preferably 5 times or more as high as that of hydrogen in the oxide semiconductor film.

When an oxide semiconductor which is an intrinsic (i-type) semiconductor or a substantially i-type semiconductor can be obtained by elimination of impurities such as moisture or hydrogen, deterioration of characteristics of the transistor due to the impurities, such as shifts in threshold voltage, can be prevented from being promoted and off-state current can be reduced.

The impurities such as hydrogen or water absorbed by the conductive film are easily combined with a metal with a low electronegativity contained in the conductive film. Impurities having a chemical bond with a metal in the conductive film are less likely to be released because the bond with the metal is stable after the impurities are absorbed by the conductive film, compared to hydrogen which exists in the conductive film as a solid solution. Accordingly, in the semiconductor device according to one embodiment of the present invention, a state where impurities such as hydrogen or water are captured in the source electrode and the drain electrode included in the transistor is held, and the concentration of hydrogen in the source electrode and the drain electrode is higher than the concentration of hydrogen in the oxide semiconductor film. Specifically, the concentration of hydrogen in the source electrode and the drain electrode is 1.2 times, preferably 5 times or more as high as that of hydrogen in the oxide semiconductor film.

Specifically, the concentration of hydrogen in the conductive film is greater than or equal to $1\times10^{19}/cm^3$, preferably greater than or equal to $5\times10^{18}/cm^3$, more preferably greater than or equal to $5\times10^{17}/cm^3$, and is 1.2 times, preferably 5 times or more as high as the concentration of hydrogen in the oxide semiconductor film. The concentration of hydrogen in the conductive film is a value measured by secondary ion mass spectroscopy (SIMS).

The analysis of the concentrations of hydrogen in the oxide semiconductor film and the conductive film is described here. The concentrations of hydrogen in the oxide semiconductor film and the conductive film are measured by secondary ion mass spectroscopy (SIMS). It is known that it is difficult to obtain data in the proximity of a surface of a sample or in the proximity of an interface between stacked films formed using different materials by the SIMS analysis in principle. Thus, in the case where distributions of the concentrations of hydrogen in the films in thickness directions are analyzed by SIMS, an average value in a region where the films are provided, the value is not greatly changed, and approximately the same strength can be obtained are employed as the concentration of hydrogen. Further, in the case where the thickness of the film is small, a region where approximately the same strength can be obtained cannot be found in some cases due to the influence of the concentrations of hydrogen in the films adjacent to each other. In that case, the maximum value or the minimum value of the concentration of hydrogen in a region where the films are provided is employed as the concentration of hydrogen in the film. Furthermore, in the case where a mountain-shaped peak having the maximum value and a valley-shaped peak having the minimum value do not exist in the region where the films are provided, the value of the inflection point is employed as the concentration of hydrogen.

The transistor may be a bottom-gate transistor, a top-gate transistor, or a bottom-contact transistor. The bottom-gate transistor includes a gate electrode over an insulating surface; a gate insulating film over the gate electrode; an oxide semiconductor film which overlaps with the gate electrode with the gate insulating film provided therebetween; a source electrode and a drain electrode over the oxide semiconductor film; an insulating film over the source electrode, the drain electrode, and the oxide semiconductor film. The top-gate transistor includes an oxide semiconductor film over an insulating surface; a gate insulating film over the oxide semiconductor film; a gate electrode which overlaps with the oxide semiconductor film over the gate insulating film and functions as a conductive film; a source electrode; a drain electrode; and an insulating film over the source electrode, the drain electrode, and the oxide semiconductor film. The bottom-contact transistor includes a gate electrode over an insulating surface; a gate insulating film over the gate electrode; a source electrode and a drain electrode over the gate insulating film; an oxide semiconductor film which is over the source electrode and the drain electrode and overlaps with the gate electrode with the gate insulating film provided therebetween; and an insulating film over the source electrode, the drain electrode, and the oxide semiconductor film.

Note that among the metals with a low electronegativity, titanium, molybdenum, and tungsten have low contact resistance to the oxide semiconductor film. Therefore, titanium, molybdenum, or tungsten is used for the conductive film which is in contact with the oxide semiconductor film, so that impurities in the oxide semiconductor film can be reduced and the source electrode and the drain electrode which have low contact resistance to the oxide semiconductor film can be formed.

In addition to the above structure, the exposed conductive film for the source electrode and the drain electrode may be subjected to heat treatment in an inert gas atmosphere, so that gettering of impurities such as hydrogen or water in the oxide semiconductor film may be promoted. The temperature range of the heat treatment for promoting gettering is preferably higher than or equal to 100° C. and lower than or equal to 350° C., more preferably, higher than or equal to 220° C. and lower than or equal to 280° C. The heat treatment is performed, so that impurities such as moisture or hydrogen existing in the oxide semiconductor film, the gate insulating film, or at the interface between the oxide semiconductor film and another insulating film and the vicinity of the interface can be easily gettered by the conductive film formed using a metal with a low electronegativity.

Note that it is found that the oxide semiconductor film formed by sputtering or the like includes a large amount of hydrogen or water as impurities. According to one embodiment of the present invention, in order to decrease impurities such as moisture or hydrogen in the oxide semiconductor film, after the oxide semiconductor film is formed, the exposed oxide semiconductor film is subjected to heat treatment in a reduced atmosphere, an inert gas atmosphere of nitrogen, a rare gas, or the like, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb in the case where measurement is performed using a dew-point meter of a cavity ring-down laser spectroscopy (CRDS) system). The heat treatment is preferably performed at a temperature higher than or equal to 500° C. and lower than or equal to 750° C. (or lower than or equal to a strain point of a glass substrate). Note that this heat treatment is performed at a temperature not exceeding the allowable temperature limit of the substrate to be used. An effect of elimination of water or hydrogen by heat treatment is confirmed by thermal desorption spectroscopy (TDS).

Heat treatment in a furnace or a rapid thermal annealing method (RTA method) is used for the heat treatment. As the RTA method, a method using a lamp light source or a method in which heat treatment is performed for a short time while a substrate is moved in a heated gas can be employed. With the use of the RTA method, it is also possible to make the time necessary for heat treatment shorter than 0.1 hours.

Hydrogen or water which is around the oxide semiconductor film is easily absorbed by the oxide semiconductor film not only in film formation by sputtering or the like but also after the film formation. Water or hydrogen easily forms a donor level and thus serves as an impurity in the oxide semiconductor itself. Therefore, according to one embodiment of the present invention, after the source electrode and the drain electrode are formed, an insulating film using an insulating material having a high barrier property may be formed so as to cover the source electrode, the drain electrode, and the oxide semiconductor film. An insulating material having a high barrier property is preferably used for the insulating film. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen than that of the insulating film having a barrier property, such as a silicon oxide film or a silicon oxynitride film, is formed on the side closer to the oxide semiconductor film. Then, the insulating film having a barrier property is formed so as to overlap with the source electrode, the drain electrode, and the oxide semiconductor film with the insulating film having lower proportion of nitrogen between the insulating film having a barrier property and the source electrode, the drain electrode, and the oxide semiconductor film. When the insulating film having a barrier property is used, the impurities such as moisture or hydrogen can be prevented from entering the oxide semiconductor film, the gate insulating film, or the interface between the oxide semiconductor film and another insulating film and the vicinity thereof.

In addition, between the gate electrode and the oxide semiconductor film, a gate insulating film may be formed to have a structure in which an insulating film formed using a material having a high barrier property, and an insulating film having lower proportion of nitrogen, such as a silicon oxide film or a silicon oxynitride film, are stacked. The insulating film such as a silicon oxide film or a silicon oxynitride film is formed between the insulating film having a barrier property and the oxide semiconductor film. The insulating film having a barrier property is used, so that impurities in an atmosphere, such as moisture or hydrogen, or impurities included in a substrate, such as an alkali metal or a heavy metal, can be prevented from entering the oxide semiconductor film, the gate insulating film, or the interface between the oxide semiconductor film and another insulating film and the vicinity thereof.

As the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, or a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor can be used. Note that in this specification, for example, an In—Sn—Ga—Zn—O-based oxide semiconductor means a metal oxide including indium (In), tin (Sn), gallium (Ga), and zinc (Zn). There is no particular limitation on the composition ratio. The above oxide semiconductor may include silicon.

Alternatively, oxide semiconductors can be represented by the chemical formula, $InMO_3(ZnO)_m$ (m>0). Here, M represents one or more metal elements selected from Ga, Al, Mn, and Co.

Impurities such as hydrogen or water contained in an oxide semiconductor are removed, specifically, the value of the concentration of hydrogen in the oxide semiconductor measured by secondary ion mass spectroscopy (SIMS) is less than or equal to $5 \times 10^{19}/cm^3$, preferably less than or equal to $5 \times 10^{18}/cm^3$, more preferably less than or equal to $5 \times 10^{17}/cm^3$, still more preferably, less than $1 \times 10^{16}/cm^3$, and a highly purified oxide semiconductor film whose concentration of hydrogen is sufficiently decreased is used, whereby off-state current of the transistor can be reduced.

Specifically, low off-state current of the transistor in which a highly purified oxide semiconductor film is used as an active layer can be proved by various experiments. For example, even when the channel width of an element is $1 \times 10^6$ μm, and the channel length thereof is 10 μm is used, off-state current (drain current when voltage between a gate electrode and a source electrode is less than or equal to 0 V) can be less than or equal to the measurement limit of a semiconductor parameter analyzer, that is, less than or equal to $1 \times 10^{-13}$ A in the range where the voltage (drain voltage) between the source electrode and the drain electrode is from 1 V to 10 V. In that case, it is found that the off-state current density corresponding to a numerical value which is calculated in such a manner that the off-state current is divided by the channel width of the transistor is less than or equal to 100 zA/μm. Further, an off-state current density is measured by use of a circuit in which a capacitor and the transistor are connected to each other and charge that inflows in the capacitor or outflows from the capacitor is controlled by the transistor. In the measurement, a highly purified oxide semiconductor film is used for a channel formation region of the transistor, and an off-state current density of the transistor is measured by a change in the amount of charge of the capacitor per a unit hour. As a result, it is found that, in the case where the voltage between the source electrode and the drain electrode of the transistor is 3 V, lower off-state current density of several tens of yA/μm is obtained. Thus, in the semiconductor device according to one embodiment of the present invention, off-state current density of the transistor in which the highly purified oxide semiconductor film is used as an active layer can be set to less than or equal to 100 yA/μm, preferably less than or equal to 10 yA/μm, more preferably less than or equal to 1 yA/μm depending on the voltage between the source electrode and the drain electrode. Accordingly, off-state current of the transistor in which the highly purified oxide semiconductor film is used as an active layer is considerably lower than a transistor in which silicon having crystallinity is used.

A method for manufacturing a highly reliable semiconductor device can be provided. A method for manufacturing a semiconductor device with low power consumption can be provided. A highly reliable semiconductor device can be provided. A semiconductor device with low power consumption can be provided.

BRIEF DESCRIPTION OF DRAWINGS

FIGS. 11A and 11B are cross-sectional views illustrating a method for manufacturing a semiconductor device.

FIGS. 12A and 12B are cross-sectional views illustrating a method for manufacturing a semiconductor device.

FIG. 13 is a top view illustrating a method for manufacturing a semiconductor device.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be changed in various ways without departing from the spirit and scope of the present invention. Accordingly, the present invention should not be construed as being limited to the description of the embodiments below.

The present invention can be applied to manufacture of any kind of semiconductor devices including microprocessors, integrated circuits such as image processing circuits, RF tags, and semiconductor display devices. Semiconductor devices means any device which can function by utilizing semiconductor characteristics, and semiconductor display devices, semiconductor circuits, and electronic devices are all included in the category of the semiconductor devices. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a circuit element using a semiconductor film is included in a driver circuit.

Embodiment 1

A bottom gate thin film transistor having a channel-etched structure is taken as an example, and a structure of the transistor included in a semiconductor device according to one embodiment of the present invention will be described.

Figure 1A:
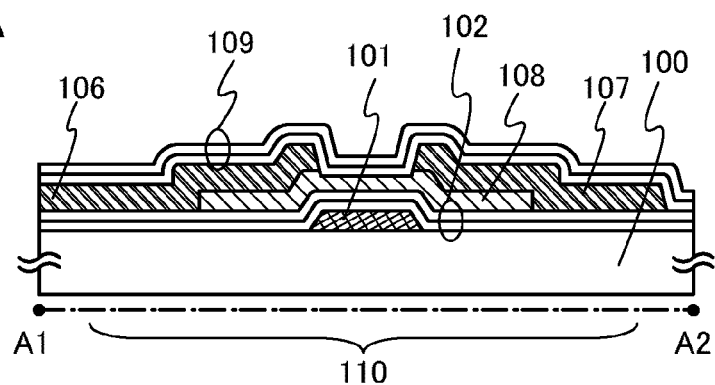
FIGS. 1A to 1C are views illustrating a structure of a semiconductor device.
Figure 1B:
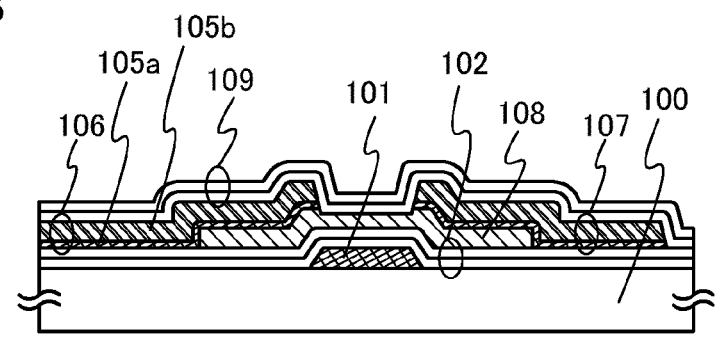
Figure 1C:
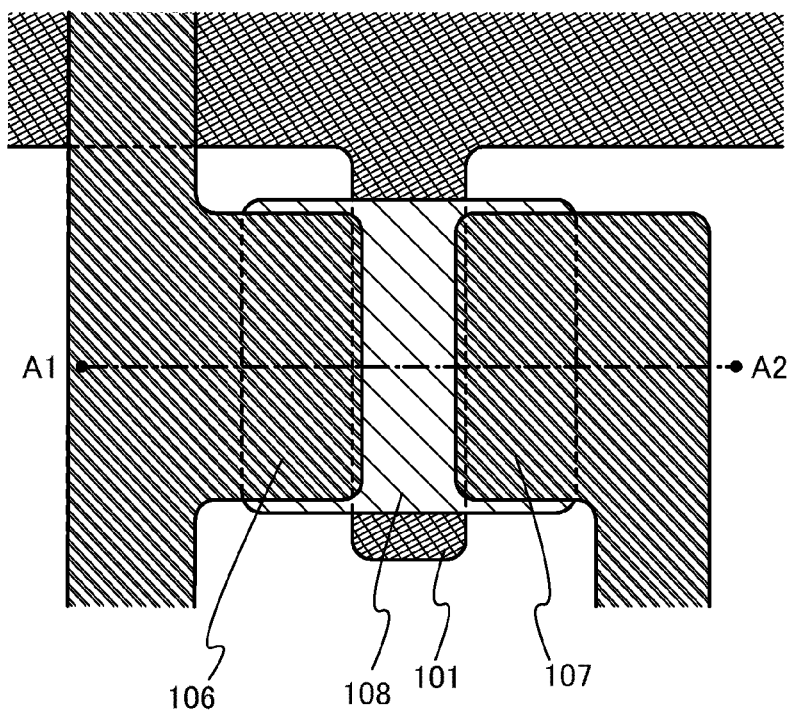

FIG. 1A illustrates a cross-sectional view of a thin film transistor 110 and FIG. 1C illustrates a top view of the thin film transistor 110 illustrated in FIG. 1A. Note that a cross-sectional view taken along dashed line A1-A2 in FIG. 1C corresponds to FIG. 1A.

The thin film transistor 110 includes a gate electrode 101 formed over a substrate 100 having an insulating surface, a gate insulating film 102 over the gate electrode 101, an oxide semiconductor film 108 which is over the gate insulating film 102 and overlaps with the gate electrode 101, and a pair of a source electrode 106 and a drain electrode 107 formed over the oxide semiconductor film 108. Further, the thin film transistor 110 may include an insulating film 109 formed over the oxide semiconductor film 108 as a component. The thin film transistor 110 has a channel-etched structure in which part of the oxide semiconductor film 108 between the source electrode 106 and the drain electrode 107 is etched. An insulating film serving as a base film may be provided between the gate electrode 101 and the substrate 100.

The island-shaped oxide semiconductor film 108 is formed in such a manner that, after an oxide semiconductor film is formed by a sputtering method using an oxide semiconductor target, the oxide semiconductor film is processed into a desired shape by etching or the like. Moreover, the oxide semiconductor film can be formed by a sputtering method in a rare gas (for example, argon) atmosphere, an oxygen atmosphere, or an atmosphere including a rare gas (for example, argon) and oxygen. The thickness of the island-shaped oxide semiconductor film 108 is set to greater than or equal to 10 nm and less than or equal to 300 nm, preferably greater than or equal to 20 nm and less than or equal to 100 nm.

The above oxide semiconductor can be used for the oxide semiconductor film 108.

A highly purified oxide semiconductor film with sufficiently reduced concentration of hydrogen, in which impurities such as hydrogen or water contained in an oxide semiconductor are removed so that the value of the concentration of hydrogen in the oxide semiconductor measured by secondary ion mass spectroscopy (SIMS) is less than or equal to $5\times10^{19}/cm^3$, preferably less than or equal to $5\times10^{18}/cm^3$, more preferably less than or equal to $5\times10^{17}/cm^3$, is used, whereby off-state current of the transistor can be reduced.

In this embodiment, as the oxide semiconductor film 108, an In—Ga—Zn—O-based non-single-crystal film with a thickness of 30 nm, which is obtained by a sputtering method using an oxide semiconductor target including indium (In), gallium (Ga), and zinc (Zn) ($In_2O_3:Ga_2O_3:ZnO=1:1:1$), is used.

After a conductive film for a source electrode and a drain electrode is formed over the island-shaped oxide semiconductor film 108, the conductive film is patterned by etching or the like, so that the source electrode 106 and the drain electrode 107 are formed. When the source electrode 106 and the drain electrode 107 are formed by the above patterning, an exposed portion of the island-shaped oxide semiconductor film 108 is partly etched in some cases. Accordingly, as illustrated in FIG. 1A, when a region of the oxide semiconductor film 108 that is located between the source electrode 106 and the drain electrode 107 is partly etched, the thickness of the region becomes smaller than that of a region which overlaps with the source electrode 106 or the drain electrode 107.

The source electrode 106 and the drain electrode 107 are formed using a metal with a low electronegativity; or a mixture, a metal compound, or an alloy which uses the metal, and the concentration of hydrogen in the source electrode 106 and the drain electrode 107 is 1.2 times, preferably 5 times or more as high as that of hydrogen in the oxide semiconductor film 108.

Specifically, the concentration of hydrogen in the source electrode 106 and the drain electrode 107 is greater than or equal to $1\times10^{19}/cm^3$, preferably greater than or equal to $5\times10^{18}/cm^3$, more preferably greater than or equal to $5\times10^{17}/cm^3$, and is 1.2 times, preferably 5 times or more as high as the concentration of hydrogen in the oxide semiconductor film 108. The concentration of hydrogen in the source electrode 106 and the drain electrode 107 is a value measured by secondary ion mass spectroscopy (SIMS).

As the metal with a low electronegativity, titanium, magnesium, yttrium, aluminum, tungsten, molybdenum, and the like can be given. A mixture, a metal compound, or an alloy which contains one or more of these metals can be used as the source electrode 106 and the drain electrode 107. Further, the above material may be combined with a heat-resistant conductive material such as an element selected from tantalum, chromium, neodymium, and scandium; an alloy containing one or more of these elements as a component; or a nitride containing the element as a component.

In one embodiment of the present invention, since a metal with a low electronegativity; or a mixture, a metal compound, or an alloy which uses the metal is used for the source electrode 106 and the drain electrode 107, impurities such as moisture or hydrogen existing in the oxide semiconductor film 108, the gate insulating film 102, or at the interface between the oxide semiconductor film 108 and another insulating film and the vicinity thereof can be easily gettered by the conductive film used for forming the source electrode 106 and the drain electrode 107. Therefore, the oxide semiconductor film 108 which is an intrinsic (i-type) semiconductor or a substantially i-type semiconductor can be obtained by elimination of impurities such as moisture or hydrogen, and deterioration of characteristics of the transistor 110 due to the impurities, such as shifts in threshold voltage, can be prevented from being promoted and off-state current can be reduced.

Note that among the metals with a low electronegativity, titanium, molybdenum, and tungsten have low contact resistance to the oxide semiconductor film 108. Therefore, titanium, molybdenum, or tungsten is used for the conductive film for forming the source electrode 106 and the drain electrode 107, so that impurities in the oxide semiconductor film 108 can be reduced and the source electrode 106 and the drain electrode 107 which have low contact resistance to the oxide semiconductor film 108 can be formed.

In addition, by secondary ion mass spectroscopy (SIMS), the concentration of hydrogen in the oxide semiconductor film is observed to be as high as approximately $10^{20}/cm^3$ at the point when the oxide semiconductor film is formed. In the present invention, impurities such as water or hydrogen which unavoidably exist in the oxide semiconductor and form a donor level are removed, so that the oxide semiconductor film is highly purified to be an i-type (intrinsic) semiconductor film. In addition, with the removal of water or hydrogen, oxygen which is one of the components of the oxide semiconductor also decreases. Thus, as one of technological thoughts of the present invention, an insulating film containing oxygen is formed so as to be in contact with the oxide semiconductor film, so that sufficient oxygen is supplied to the oxide semiconductor film which has oxygen vacancies.

The amount of hydrogen in the oxide semiconductor film is preferably as small as possible, and carriers in the oxide semiconductor are preferably few. That is, as an index, the concentration of hydrogen is less than or equal to $1\times10^{19}/cm^3$, preferably less than or equal to $5\times10^{18}/cm^3$, more preferably less than or equal to $5\times10^{17}/cm^3$ or less than or equal to $1\times10^{16}/cm^3$. In addition, the carrier density is less than or equal to $1\times10^{14}/cm^3$, preferably less than or equal to $1\times10^{12}/cm^3$. More ideally, the carrier density is substantially zero. In the present invention, the carrier density of the oxide semiconductor film is reduced as much as possible and the ideal carrier density thereof is substantially zero; therefore, the oxide semiconductor film serves as a path through which carriers supplied from the source electrode and the drain electrode of the TFT pass.

The carrier density of the oxide semiconductor film is reduced as much as possible to less than $1\times10^{11}/cm^3$ and ideally substantially zero; consequently, off-state current of the TFT can be decreased as low as possible.

The insulating film 109 is formed to be in contact with the island-shaped oxide semiconductor film 108, the source electrode 106, and the drain electrode 107 by a sputtering method. In this embodiment, the insulating film 109 is formed to have a structure in which a 100-nm-thick silicon nitride film formed by a sputtering method is stacked over a 200-nm-thick silicon oxide film formed by a sputtering method.

Note that in FIG. 1A, the case where the source electrode 106 and the drain electrode 107 are formed using a single-layer conductive film is described. However, one embodiment of the present invention is not limited to this structure, and the source electrode 106 and the drain electrode 107 may be formed using a plurality of conductive films stacked, for example. FIG. 1B is a cross-sectional view of a transistor in the case where the source electrode 106 and the drain electrode 107 each have a first conductive film 105a and a second conductive film 105b which are stacked. Note that in FIG. 1B, a portion having a function similar to that of the transistor 110 illustrated in FIG. 1A is denoted by the same reference numeral.

The source electrode 106 and the drain electrode 107 in the transistor illustrated in FIG. 1B are formed in such a manner that the first conductive film 105a and the second conductive film 105b for the source electrode and the drain electrode are stacked over the island-shaped oxide semiconductor film 108 and then these conductive films are patterned by etching or the like. Accordingly, the source electrode 106 and the drain electrode 107 each have the first conductive film 105a in contact with the oxide semiconductor film 108 and the second conductive film 105b stacked over the first conductive film 105a. Then, the first the conductive film 105a is formed using a metal with a low electronegativity; or a mixture, a metal compound, or an alloy which uses the metal, and the concentration of hydrogen in the first conductive film 105a is 1.2 times, preferably 5 times or more as high as that of hydrogen in the oxide semiconductor film 108.

Specifically, when the concentration of hydrogen in the first conductive film 105a is greater than or equal to $1\times10^{19}/cm^3$, preferably greater than or equal to $5\times10^{18}/cm^3$, and more preferably greater than or equal to $5\times10^{17}/cm^3$, the concentration of hydrogen in the first conductive film 105a is 1.2 times, preferably 5 times or more as high as that of hydrogen in the oxide semiconductor film 108. The concentration of hydrogen in the first conductive film 105a is a value measured by secondary ion mass spectroscopy (SIMS).

Specifically, the second conductive film 105b can be formed to have a single-layer structure or a stacked-layer structure using one or more conductive films using a metal material such as molybdenum, titanium, chromium, tantalum, tungsten, neodymium, or scandium; an alloy material which contains any of these metal materials as its main component; or a nitride which contains any of these metals. Note that for the second conductive film 105*b*, aluminum or copper can also be used as such metal materials if it can withstand the temperature of heat treatment performed in a later process. Aluminum or copper is preferably used in combination with a refractory metal material in order to avoid problems of heat resistance and corrosion. As the refractory metal material, molybdenum, titanium, chromium, tantalum, tungsten, neodymium, scandium, or the like can be used. Alternatively, a light-transmitting oxide conductive film of indium oxide, an indium-oxide tin-oxide alloy, an indium-oxide zinc-oxide alloy, zinc oxide, aluminum zinc oxide, aluminum zinc oxynitride, or gallium zinc oxide may be used as the second conductive film 105*b*.

In particular, when a low resistivity material such as aluminum or copper is used for the second conductive film 105*b*, the combined resistance of the source electrode 106 and the drain electrode 107 which are formed using the first conductive film 105*a* and the second conductive film 105*b* can be reduced.

When the first conductive film 105*a* in contact with the oxide semiconductor film 108 is formed using a metal with a low electronegativity; or a mixture, a metal compound, or an alloy which uses the metal, impurities such as moisture or hydrogen existing in the oxide semiconductor film 108, the gate insulating film 102, or at the interface between the oxide semiconductor film 108 and another insulating film and the vicinity thereof can be easily gettered by the second conductive film 105*b* as in FIG. 1A. Therefore, the oxide semiconductor film 108 which is an intrinsic (i-type) semiconductor or a substantially i-type semiconductor can be obtained by elimination of impurities such as moisture or hydrogen, and deterioration of characteristics of the transistor 110 due to the impurities, such as shifts in threshold voltage, can be prevented from being promoted and off-state current can be reduced.

Note that among the metals with a low electronegativity, titanium, molybdenum, and tungsten have low contact resistance to the oxide semiconductor film 108. Therefore, titanium, molybdenum, or tungsten is used for the first conductive film 105*a*, so that impurities in the oxide semiconductor film 108 can be reduced and the source electrode 106 and the drain electrode 107 which have low contact resistance to the oxide semiconductor film 108 can be formed.

Next, the bottom gate thin film transistor having a channel-etched structure illustrated in FIG. 1B is used as an example, and a more detailed structure of a semiconductor device and a manufacturing method thereof will be described with reference to FIGS. 2A to 2E and FIGS. 3A to 3C.

Figure 2A:
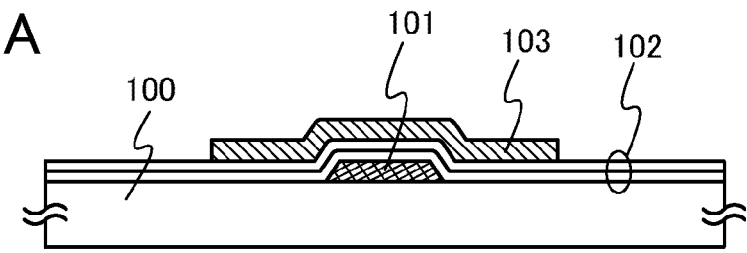
FIGS. 2A to 2E are views illustrating a method for manufacturing a semiconductor device.
Figure 2B:
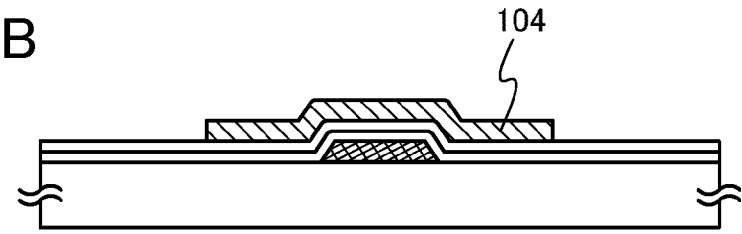

As illustrated in FIG. 2A, the gate electrode 101 is formed over the substrate 100.

An insulating film serving as a base film may be formed between the substrate 100 and the gate electrode 101. As the base film, for example, a single layer or a stacked layer of any one of or a plurality of a silicon oxide film, a silicon oxynitride film, a silicon nitride film, a silicon nitride oxide film, an aluminum nitride film, and an aluminum nitride oxide film can be used. In particular, an insulating film having a high barrier property, for example, a silicon nitride film, a silicon nitride oxide film, an aluminum nitride film, or an aluminum nitride oxide film is used for the base film, so that impurities in an atmosphere, such as moisture or hydrogen, or impurities included in the substrate 100, such as an alkali metal or a heavy metal, can be prevented from entering the oxide semiconductor film, the gate insulating film or the interface between the oxide semiconductor film and another insulating film and the vicinity thereof.

In this specification, oxynitride refers to a substance which includes more oxygen than nitrogen, and nitride oxide refers to a substance which includes more nitrogen than oxygen.

The gate electrode 101 can be formed with a single layer or a stacked layer using one or more of conductive films using a metal material such as molybdenum, titanium, chromium, tantalum, tungsten, neodymium, or scandium; an alloy material which contains any of these metal materials as its main component; or a nitride which contains any of these metals. Note that aluminum or copper can also be used as such metal materials if it can withstand the temperature of heat treatment to be performed in a later process. Aluminum or copper is preferably combined with a refractory metal material in order to avoid problems of heat resistance and corrosion. As the refractory metal material, molybdenum, titanium, chromium, tantalum, tungsten, neodymium, scandium, or the like can be used.

For example, as a two-layer structure of the gate electrode 101, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the gate electrode 101, the following structure is preferable: a stacked structure containing an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, a light-transmitting oxide conductive film of indium oxide, an indium-oxide tin-oxide alloy, an indium-oxide zinc-oxide alloy, zinc oxide, aluminum zinc oxide, aluminum zinc oxynitride, gallium zinc oxide, or the like is used as the gate electrode 101, so that the aperture ratio of a pixel portion can be increased.

The thickness of the gate electrode 101 is 10 nm to 400 nm, preferably 100 nm to 200 nm. In this embodiment, after the conductive film for the gate electrode is formed to have a thickness of 150 nm by a sputtering method using a tungsten target, the conductive film is processed (patterned) into a desired shape by etching, whereby the gate electrode 101 is formed.

Next, the gate insulating film 102 is formed over the gate electrode 101. The gate insulating film 102 can be formed to have a single layer of a silicon oxide film, a silicon nitride film, a silicon oxynitride film, a silicon nitride oxide film, an aluminum oxide film, or a tantalum oxide film, or a stacked layer thereof by a plasma enhanced CVD method, a sputtering method, or the like. It is preferable that the gate insulating film 102 include impurities such as moisture or hydrogen as little as possible. The gate insulating film 102 may have a structure in which an insulating film formed using a material having a high barrier property and an insulating film having lower proportion of nitrogen such as a silicon oxide film or a silicon oxynitride film are stacked. In that case, the insulating film such as a silicon oxide film or a silicon oxynitride film is formed between the insulating film having a barrier property and the oxide semiconductor film. As the insulating film having a high barrier property, a silicon nitride film, a silicon nitride oxide film, an aluminum nitride film, an aluminum nitride oxide film, and the like can be given, for example. The insulating film having a barrier property is used, so that impurities in an atmosphere, such as moisture or hydrogen, or impurities included in the substrate, such as an alkali metal or a heavy metal, can be prevented from entering the oxide semiconductor film, the gate insulating film 102, or the interface between the oxide semiconductor film and another insulating film and the vicinity thereof. In addition, the insulating film having lower proportion of nitrogen such as a silicon oxide film or a silicon oxynitride film is formed so as to be in contact with the oxide semiconductor film, so that the insulating film formed using a material having a high barrier property can be prevented from being in contact with the oxide semiconductor film directly.

In this embodiment, the gate insulating film 102 is formed to have a structure in which a 100-nm-thick silicon oxide film formed by a sputtering method is stacked over a 50-nm-thick silicon nitride film formed by a sputtering method.

Next, an oxide semiconductor film is formed over the gate insulating film 102. The oxide semiconductor film is formed by a sputtering method using an oxide semiconductor target. Moreover, the oxide semiconductor film can be formed by a sputtering method in a rare gas (for example, argon) atmosphere, an oxygen atmosphere, or an atmosphere including a rare gas (for example, argon) and oxygen.

Note that before the oxide semiconductor film is formed by a sputtering method, dust attached to a surface of the gate insulating film 102 is preferably removed by reverse sputtering in which an argon gas is introduced and plasma is generated. The reverse sputtering refers to a method in which, without application of voltage to a target side, an RF power supply is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

For the oxide semiconductor film, such an oxide semiconductor as above described can be used.

The thickness of the oxide semiconductor film is set to 10 nm to 300 nm, preferably, 20 nm to 100 nm. In this embodiment, as the oxide semiconductor film, an In—Ga—Zn—O-based non-single-crystal film with a thickness of 30 nm, which is obtained by a sputtering method using an oxide semiconductor target including indium (In), gallium (Ga), and zinc (Zn) ($In_2O_3$:$Ga_2O_3$:ZnO=1:1:1 or 1:1:2 in a molar ratio), is used. In this embodiment, a DC sputtering method is employed, a flow rate of argon is 30 sccm, a flow rate of oxygen is 15 sccm, and a substrate temperature is a room temperature.

The gate insulating film 102 and the oxide semiconductor film may be formed successively without exposure to air. Successive film formation without exposure to air makes it possible to obtain each interface between stacked layers, which is not contaminated by atmospheric components or impurity elements floating in air, such as water, hydrocarbon, or the like. Therefore, variation in characteristics of the thin film transistor can be reduced.

Next, as illustrated in FIG. 2A, the oxide semiconductor film is processed (patterned) into a desired shape by etching or the like, whereby an island-shaped oxide semiconductor film 103 is formed over the gate insulating film 102 in a position where the island-shaped oxide semiconductor film 103 overlaps with the gate electrode 101.

Then, heat treatment may be performed on the oxide semiconductor film 103 in a reduced atmosphere, an inert gas atmosphere of nitrogen, a rare gas, or the like, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb in the case where measurement is performed using a dew-point meter of a cavity ring-down laser spectroscopy (CRDS) system). When the heat treatment is performed on the oxide semiconductor film 103, an oxide semiconductor film 104 in which moisture or hydrogen is eliminated is formed. Specifically, rapid thermal annealing (RTA) treatment can be performed at a temperature higher than or equal to 500° C. and lower than or equal to 750° C. (or lower than or equal to a strain point of a glass substrate) for approximately greater than or equal to one minute and less than or equal to ten minutes, preferably, at 600° C. for approximately greater than or equal to three minutes and less than or equal to six minutes in an inert gas (nitrogen, helium, neon, argon, or the like) atmosphere. Since dehydration or dehydrogenation can be performed in a short time by an RTA method, treatment can be performed even at a temperature over the strain point of the glass substrate. Note that the heat treatment is not necessarily performed after the island-shaped oxide semiconductor film 103 is formed, and the heat treatment may be performed on the oxide semiconductor film before the island-shaped oxide semiconductor film 103 is formed. The heat treatment may be performed more than once after the oxide semiconductor film 104 is formed. Impurities such as moisture or hydrogen are eliminated by the heat treatment, so that the island-shaped oxide semiconductor film 104 becomes an intrinsic (i-type) semiconductor or a substantially i-type semiconductor; therefore, deterioration of characteristics of the transistor due to the impurities, such as shifts in threshold voltage, can be prevented from being promoted and off-state current can be reduced.

In this embodiment, heat treatment is performed in a nitrogen atmosphere at 600° C. for six minutes in a state where the substrate temperature reaches the set temperature. Further, a heating method using an electric furnace, a rapid heating method such as a gas rapid thermal annealing (GRTA) method using a heated gas or a lamp rapid thermal annealing (LRTA) method using lamp light, or the like can be used for the heat treatment. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

Note that it is preferable that in the heat treatment, moisture, hydrogen, or the like be not contained in nitrogen or a rare gas such as helium, neon, or argon. Alternatively, it is preferable that the purity of nitrogen or the rare gas such as helium, neon, or argon which is introduced into a heat treatment apparatus be set to be higher than or equal to 6N (99.9999%), preferably higher than or equal to 7N (99.99999%) (that is, the impurity concentration is lower than or equal to 1 ppm, preferably lower than or equal to 0.1 ppm).

Figure 2C:
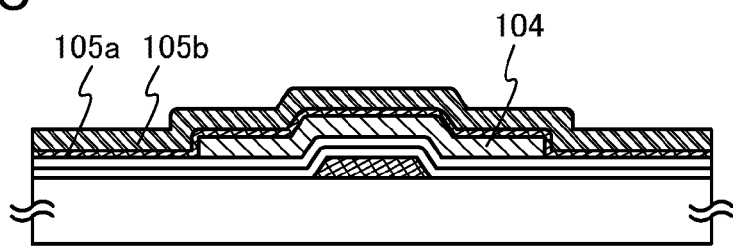

Next, as illustrated in FIG. 2C, a conductive film used for a source electrode and a drain electrode is formed over the island-shaped oxide semiconductor film 104. In this embodiment, the first conductive film 105a which uses a metal with a low electronegativity; or a mixture, a metal compound, or an alloy which uses the metal is formed so as to be in contact with the oxide semiconductor film 104, and then the second conductive film 105b is stacked over the first conductive film 105a.

As the metal with a low electronegativity, titanium, magnesium, yttrium, aluminum, tungsten, molybdenum, and the like can be given. A mixture, a metal compound, or an alloy which contains one or more of these metals can be used as the first conductive film 105a. Further, the above material may be combined with a heat-resistant conductive material such as an element selected from tantalum, chromium, neodymium, and scandium; an alloy containing one or more of these elements as a component; or a nitride containing the element as a component.

Specifically, the second conductive film 105b can be formed to have a single-layer structure or a stacked-layer structure using one or more conductive films using a metal material such as molybdenum, titanium, chromium, tantalum, tungsten, neodymium, or scandium; an alloy material which contains any of these metal materials as its main component; or a nitride which contains any of these metals. Note that for the second conductive film 105b, aluminum or copper can also be used as such metal materials if it can withstand the temperature of heat treatment performed in a later process. Aluminum or copper is preferably used in combination with a refractory metal material in order to avoid problems of heat resistance and corrosion. As the refractory metal material, molybdenum, titanium, chromium, tantalum, tungsten, neodymium, scandium, or the like can be used. Alternatively, a light-transmitting oxide conductive film of indium oxide, an indium-oxide tin-oxide alloy, an indium-oxide zinc-oxide alloy, zinc oxide, aluminum zinc oxide, aluminum zinc oxynitride, or gallium zinc oxide may be used as the second conductive film 105b.

In particular, when a low resistivity material such as aluminum or copper is used for the second conductive film 105b, the combined resistance of the source electrode 106 and the drain electrode 107 which are formed using the first conductive film 105a and the second conductive film 105b can be reduced.

The thickness of the first conductive film 105a is preferably 10 nm to 200 nm, more preferably, 50 nm to 150 nm. The thickness of the second conductive film 105b is preferably 100 nm to 300 nm, more preferably, 150 nm to 250 nm. In this embodiment, a 100-nm-thick titanium film formed by a sputtering method is used as the first conductive film 105a, and a 200-nm-thick aluminum film formed by a sputtering method is used as the second conductive film 105b.

In one embodiment of the present invention, the first conductive film 105a is formed using a metal with a low electronegativity; or a mixture, a metal compound, or an alloy which uses the metal, so that impurities such as moisture or hydrogen existing in the oxide semiconductor film 104, the gate insulating film 102, or at an interface between the oxide semiconductor film 104 and another insulating film and the vicinity thereof are gettered by the first conductive film 105a. Therefore, by elimination of impurities such as moisture or hydrogen, the oxide semiconductor film 108 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

In addition to the above structure, the exposed second conductive film 105b may be subjected to heat treatment in an inert gas atmosphere such as a nitrogen atmosphere or a rare gas (argon, helium, or the like) atmosphere, so that gettering of impurities such as hydrogen or water may be promoted. The temperature range of the heat treatment for promoting gettering is preferably higher than or equal to 100° C. and lower than or equal to 350° C., more preferably, higher than or equal to 220° C. and lower than or equal to 280° C. The heat treatment is performed, so that impurities such as moisture or hydrogen existing in the oxide semiconductor film 104, the gate insulating film 102, or at the interface between the oxide semiconductor film 104 and another insulating film and the vicinity thereof can be easily gettered by the first conductive film 105a.

Figure 2D:
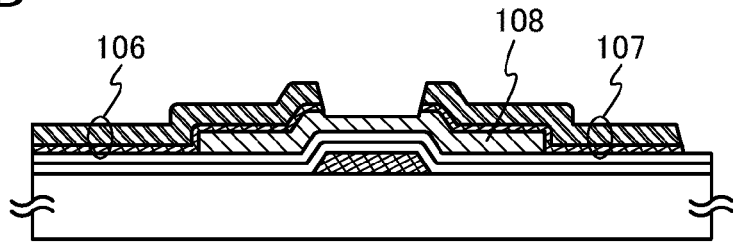

Next, as illustrated in FIG. 2D, the first conductive film 105a and the second conductive film 105b are processed (patterned) into desired shapes by etching or the like, whereby the source electrode 106 and the drain electrode 107 are formed. For example, when a titanium film is used for the first conductive film 105a and an aluminum film is used for the second conductive film 105b, after wet etching is performed on the second conductive film 105b using a solution containing phosphoric acid, wet etching may be performed on the first conductive film 105a using a solution (ammonia peroxide mixture) containing ammonia and hydrogen peroxide water. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, an aqueous solution in which hydrogen peroxide water of 31 wt %, ammonia water of 28 wt %, and water are mixed at a volume ratio of 5:2:2 is used. Alternatively, dry etching may be performed on the first conductive film 105a and the second conductive film 105b using a gas containing chlorine ($Cl_2$), boron chloride ($BCl_3$), or the like.

When the source electrode 106 and the drain electrode 107 are formed by the patterning, part of an exposed portion of the island-shaped oxide semiconductor film 104 is etched in some cases. In this embodiment, the case where the island-shaped oxide semiconductor film 108 having a groove (a depressed portion) is formed is described.

Figure 2E:
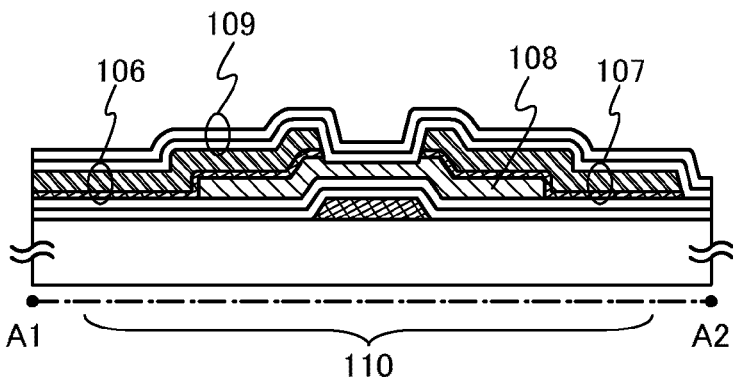

Note that as illustrated in FIG. 2E, after the source electrode 106 and the drain electrode 107 are formed, the insulating film 109 is formed so as to cover the source electrode 106, the drain electrode 107, and the oxide semiconductor film 108. The insulating film 109 preferably includes impurities such as moisture or hydrogen as little as possible, and the insulating film 109 may be formed using a single-layer insulating film or a plurality of insulating films stacked. A material having a high barrier property is preferably used for the insulating film 109. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen than the insulating film having a barrier property, such as a silicon oxide film or a silicon oxynitride film, is formed on the side closer to the oxide semiconductor film 108. Then, the insulating film having a barrier property is formed so as to overlap with the source electrode 106, the drain electrode 107, and the oxide semiconductor film 108 with the insulating film having lower proportion of nitrogen between the insulating film having a barrier property and the source electrode 106, the drain electrode 107, and the oxide semiconductor film 108. When the insulating film having a bather property is used, the impurities such as moisture or hydrogen can be prevented from entering the oxide semiconductor film 108, the gate insulating film 102, or the interface between the oxide semiconductor film 108 and another insulating film and the vicinity thereof. In addition, the insulating film having lower proportion of nitrogen such as a silicon oxide film or a silicon oxynitride film is formed so as to be in contact with the oxide semiconductor film 108, so that the insulating film formed using a material having a high barrier property can be prevented from being in contact with the oxide semiconductor film directly.

In this embodiment, the insulating film 109 is formed to have a structure in which a 100-nm-thick silicon nitride film formed by a sputtering method is stacked over a 200-nm-thick silicon oxide film formed by a sputtering method. The substrate temperature in film formation may be higher than or equal to room temperature and lower than or equal to 300° C. and in this embodiment, is 100° C.

An exposed region of the oxide semiconductor film 108 provided between the source electrode 106 and the drain electrode 107 and silicon oxide which forms the insulating film 109 are provided in contact with each other, so that resistance of the region of the oxide semiconductor film 108 which is in contact with the insulating film 109 is increased by supply of oxygen, whereby the oxide semiconductor film 108 having a channel formation region with high resistance can be formed.

Note that after the insulating film 109 is formed, heat treatment may be performed. The heat treatment is preferably performed at a temperature higher than or equal to 200° C. and lower than or equal to 400° C., for example, higher than or equal to 250° C. and lower than or equal to 350° C. in an air atmosphere or an inert gas (nitrogen, helium, neon, or argon) atmosphere. For example, heat treatment is performed at 250° C. for one hour in a nitrogen atmosphere in this embodiment. Alternatively, before the first conductive film 105a and the second conductive film 105b are formed, RTA treatment at high temperature for a short time may be performed in a manner similar to that of the heat treatment performed on the oxide semiconductor film. By the heat treatment, the oxide semiconductor film 108 is heated while being in contact with silicon oxide which forms the insulating film 109. In addition, the resistance of the oxide semiconductor film 108 is increased by supply of oxygen to the oxide semiconductor film 108. Accordingly, electric characteristics of the transistor can be improved and variation in the electric characteristics thereof can be reduced. There is no particular limitation on when to perform this heat treatment as long as it is performed after the formation of the insulating film 109. When this heat treatment also serves as heat treatment in another step, for example, heat treatment in formation of a resin film or heat treatment for reducing resistance of a transparent conductive film, the number of steps can be prevented from increasing.

Figure 3A:
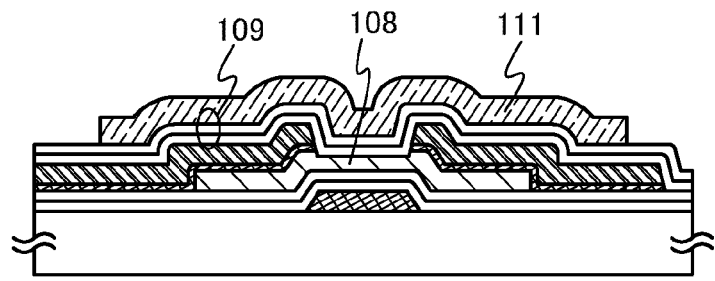
FIGS. 3A to 3C are views illustrating a structure of a semiconductor device.

Next, after a conductive film is formed over the insulating film 109, the conductive film is patterned, so that a back gate electrode 111 may be formed so as to overlap with the oxide semiconductor film 108 as illustrated in FIG. 3A. The back gate electrode 111 can be formed using a material and a structure which are similar to those of the gate electrode 101 or the source electrode 106 and the drain electrode 107.

The thickness of the back gate electrode 111 is 10 nm to 400 nm, preferably 100 nm to 200 nm. In this embodiment, a conductive film in which a titanium film, an aluminum film, and a titanium film are sequentially stacked is formed. Then, a resist mask is formed by a photolithography method, an unnecessary portion is removed by etching and the conductive film is processed (patterned) into a desired shape, whereby the back gate electrode 111 is formed.

Figure 3B:
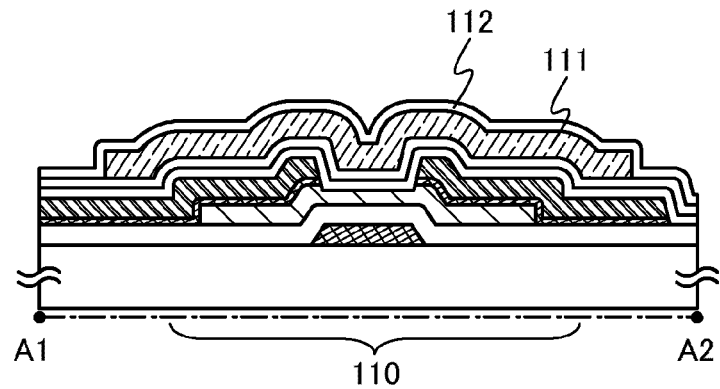

Next, as illustrated in FIG. 3B, an insulating film 112 is formed so as to cover the back gate electrode 111. The insulating film 112 is preferably formed using a material having a high bather property which can prevent moisture, hydrogen, oxygen, or the like in the atmosphere from affecting the characteristics of the transistor 110. For example, the insulating film 112 can be formed to have a single layer or a stacked layer using an insulating film having a high barrier property such as a silicon nitride film, a silicon nitride oxide film, an aluminum nitride film, an aluminum nitride oxide film, or the like by a plasma enhanced CVD method, a sputtering method, or the like. The insulating film 112 is preferably formed to have a thickness of, for example, 15 nm to 400 nm in order to obtain an effect of a barrier property.

In this embodiment, an insulating film is formed to have a thickness of 300 nm by a plasma enhanced CVD method. The insulating film is formed under the following conditions: the flow rate of silane gas is 4 sccm; the flow rate of dinitrogen monoxide ($N_2O$) is 800 sccm; and the substrate temperature is 400° C.

Figure 3C:
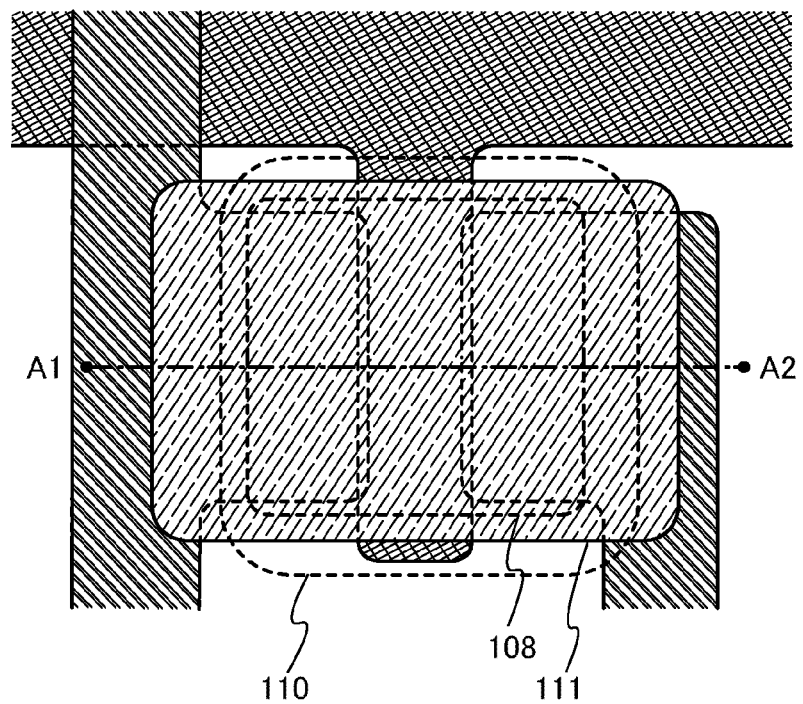

FIG. 3C is a top view of the semiconductor device in FIG. 3B. FIG. 3B corresponds to a cross-sectional view taken along dashed line A1-A2 in FIG. 3C.

Note that in FIG. 3B, the case is illustrated in which the back gate electrode 111 covers the entire oxide semiconductor film 108; however, one embodiment of the present invention is not limited to this structure. The back gate electrode 111 may overlap with at least part of the channel formation region included in the oxide semiconductor film 108.

The back gate electrode 111 may be in a floating state, that is, electrically isolated, or a state where a potential is applied. In the latter state, to the back gate electrode 111, a potential which is the same level as the gate electrode 101 may be applied, or a fixed potential such as ground may be applied. The level of the potential applied to the back gate electrode 111 is controlled, so that the threshold voltage of the transistor 110 can be controlled.

Figure 4A:
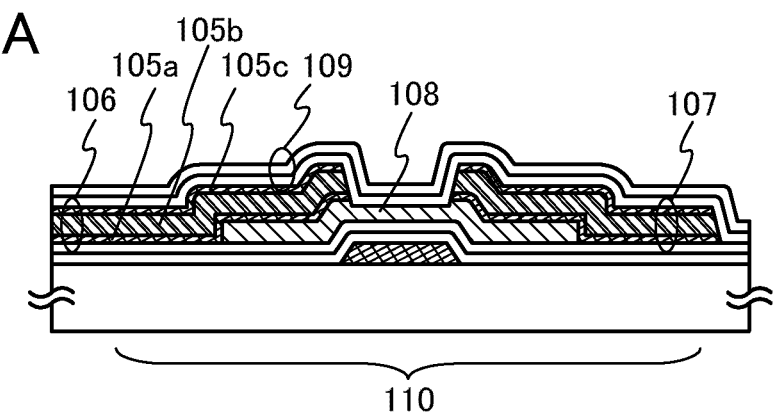
FIGS. 4A and 4B are views illustrating a method for manufacturing a semiconductor device.

Note that the source electrode 106 and the drain electrode 107 in the transistor 110 may be formed using a conductive film having three or more layers. FIG. 4A is a cross-sectional view of the transistor 110 in the case where the source electrode 106 and the drain electrode 107 are formed using the first conductive film 105a, the second conductive film 105b, and a third the conductive film 105c which are stacked. The third conductive film 105c can be formed using the same material as that of the first conductive film 105a and the second conductive film 105b. Note that when the source electrode 106 and the drain electrode 107 are formed using a three-layer conductive film, a conductive material which is less likely to be oxidized is used for the third conductive film 105c, so that the surface of the second conductive film 105b can be prevented from being oxidized. As the material effective in preventing oxidation, for example, titanium, tantalum, tungsten, molybdenum, chromium, neodymium, or scandium; a mixture, a metal compound, or an alloy which contains one or more of these metals can be used for the third conductive film 105c.

Figure 4B:
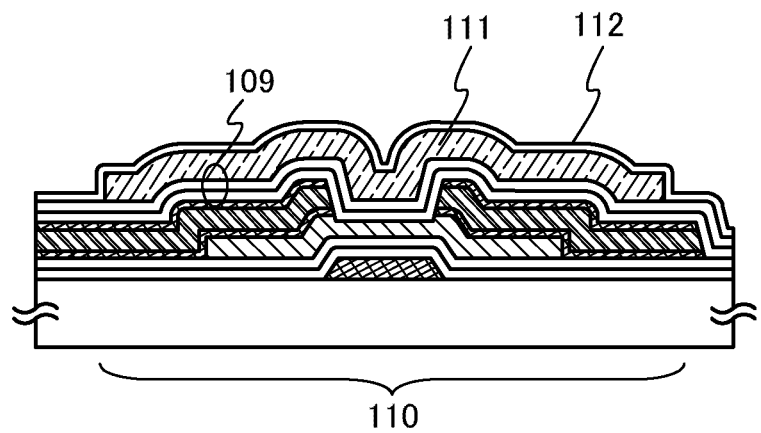

In addition, the transistor 110 illustrated in FIG. 4A may have the back gate electrode 111 as in FIG. 3B. The structure of the transistor 110 when the transistor 110 illustrated in FIG. 4A is provided with the back gate electrode 111 is illustrated in FIG. 4B. The back gate electrode 111 can be formed using a material and a structure which are similar to those of the gate electrode 101 or the source electrode 106 and the drain electrode 107.

As in this embodiment, how characteristics of the transistor are affected by high purification of the oxide semiconductor film by removal of impurities such as hydrogen, water, or the like contained in the oxide semiconductor film as much as possible will be described.

Figure 25:
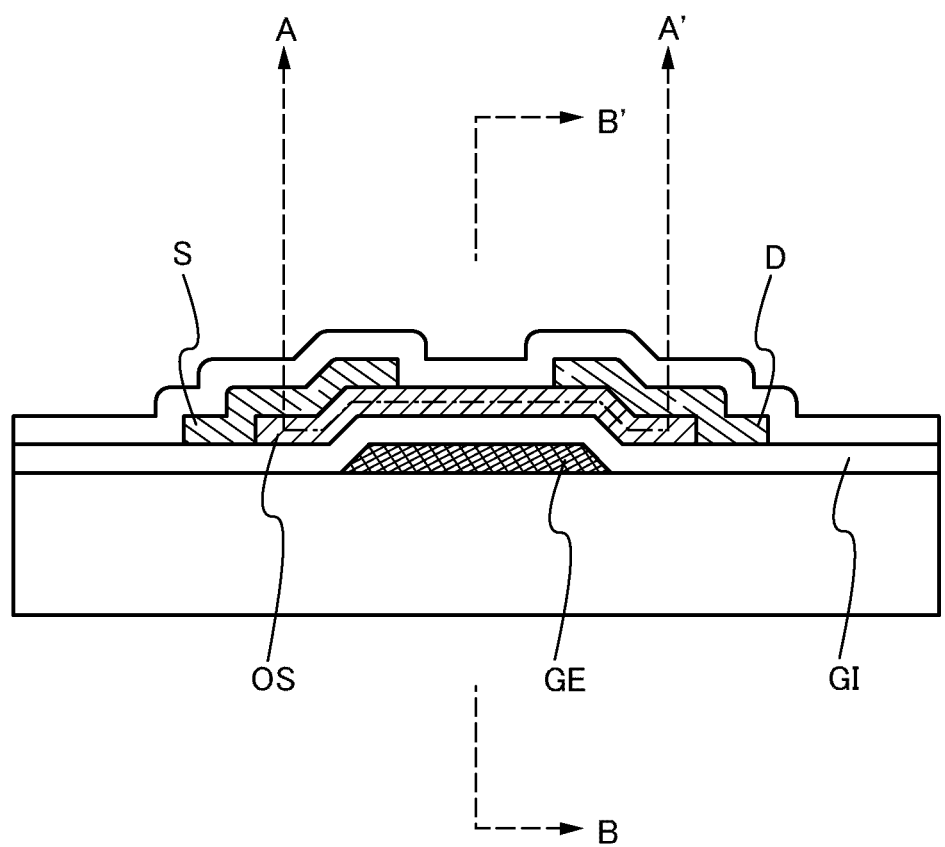
FIG. 25 is a cross-sectional view of an inverted staggered thin film transistor formed using an oxide semiconductor.

FIG. 25 is a longitudinal cross-sectional view of an inverted staggered thin film transistor formed using an oxide semiconductor. An oxide semiconductor film (OS) is provided over a gate electrode (GE) with a gate insulating film (GI) therebetween, and a source electrode (S) and a drain electrode (D) are provided thereover.

Figure 26A:
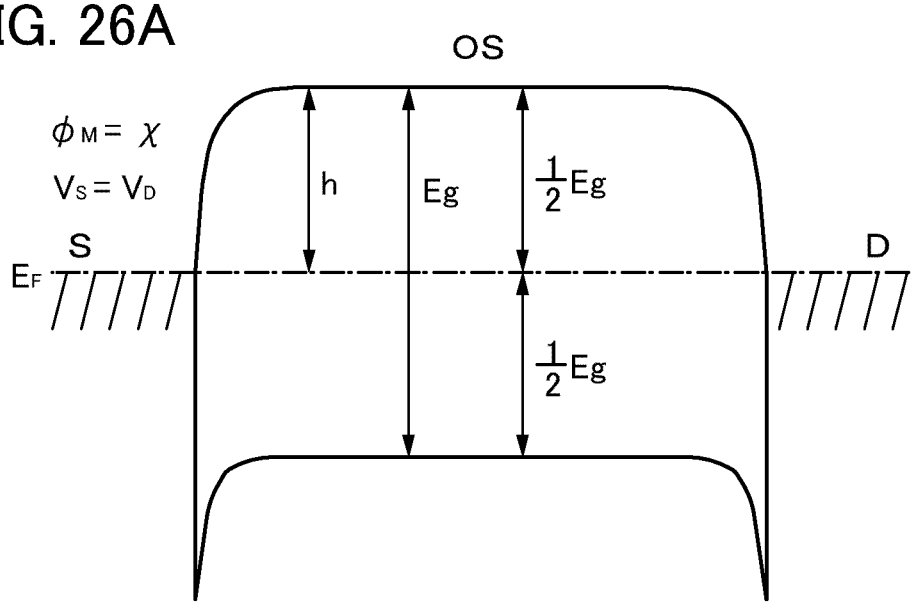
FIGS. 26A and 26B are energy band diagrams (schematic diagrams) of a cross section taken along line A-A' in FIG. 25.
Figure 26B:
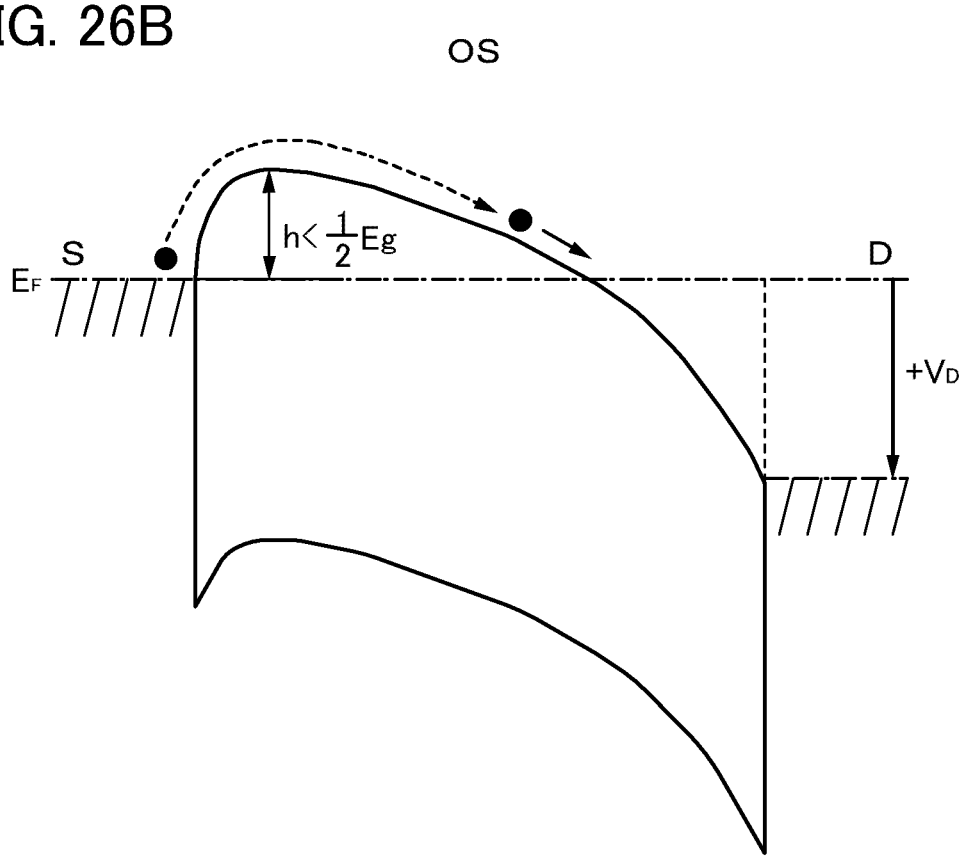

FIGS. 26A and 26B are energy band diagrams (schematic diagrams) of a cross-section taken along line A-A' in FIG. 25. FIG. 26A illustrates the case where voltage between the source electrode and the drain electrode is equipotential ($V_D$=0V), and FIG. 26B illustrates the case where a potential, which is positive when the potential of the source electrode is used as a reference potential, is applied to the drain electrode ($V_D$>0).

Figure 27A:
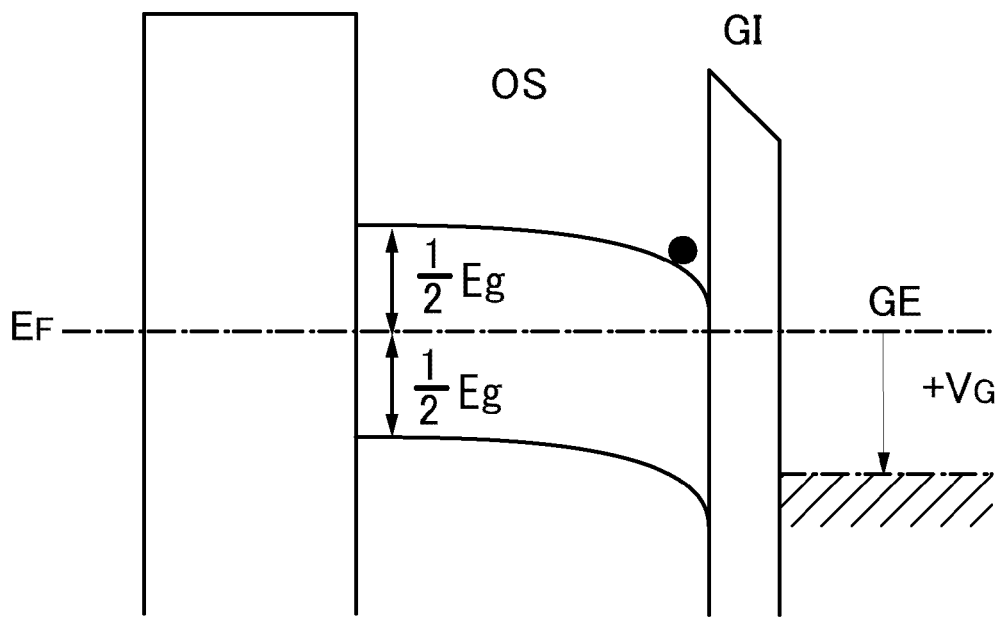
FIG. 27A is a diagram illustrating a state where a positive potential ($+V_G$) is applied to a gate (GI)
Figure 27B:
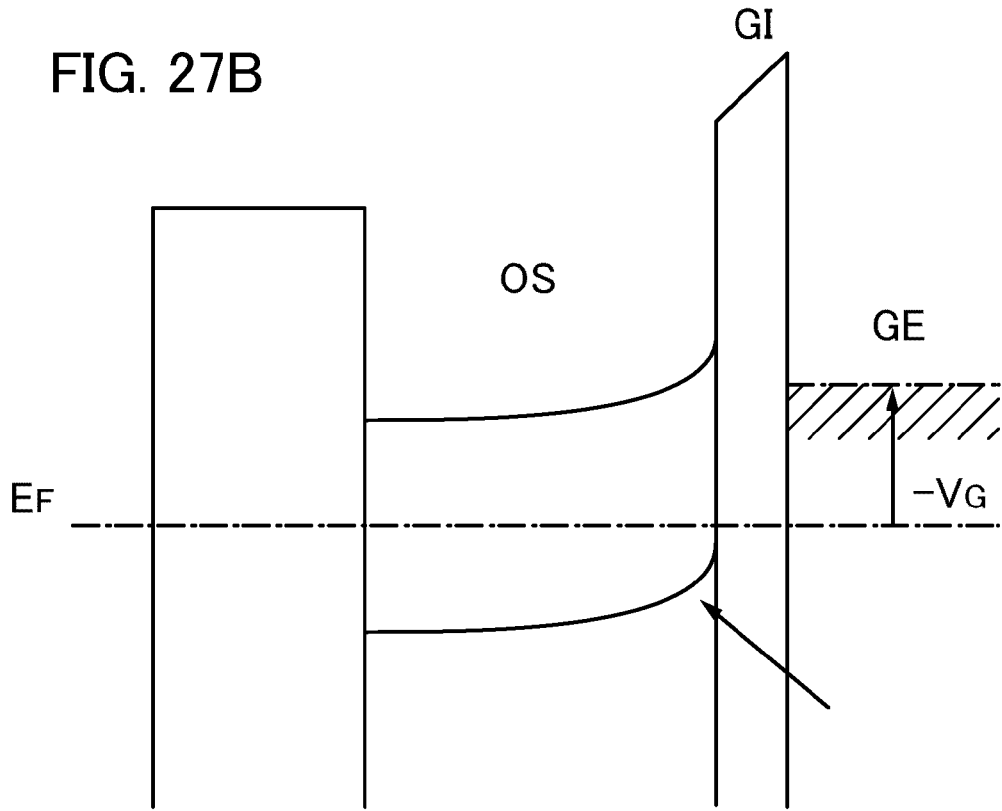
FIG. 27B is a diagram illustrating a state where a negative potential ($-V_G$) is applied to the gate (GI).

FIGS. 27A and 27B are energy band diagrams (schematic diagrams) of a cross-section taken along line B-B' in FIG. 25. FIG. 27A illustrates a state where a positive potential (+$V_G$) is applied to a gate electrode (GE) and an on state where carriers (electrons) flow between the source electrode and the drain electrode. FIG. 27B illustrates a state where a negative potential (-$V_G$) is applied to the gate electrode (GE) and an off state (a minority carrier does not flow).

Figure 28:
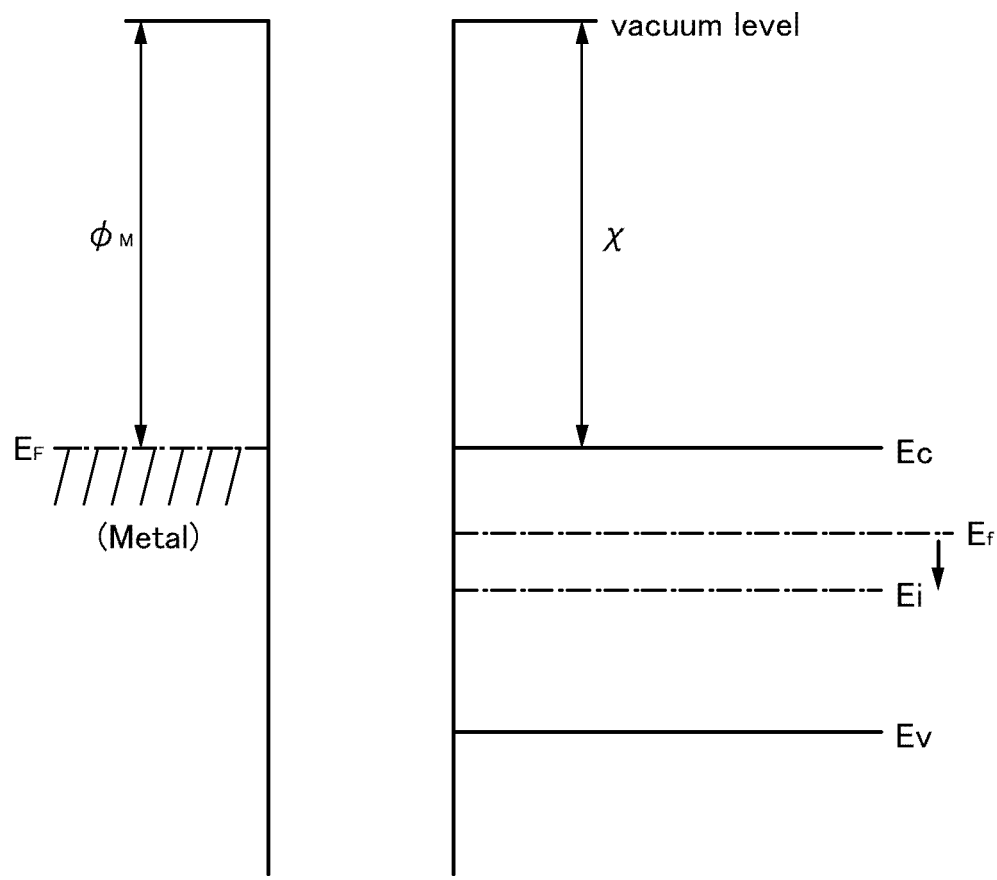
FIG. 28 is a diagram illustrating a relation among a vacuum level, a work function ($\phi M$) of a metal, and electron affinity ($\chi$) of an oxide semiconductor.

FIG. 28 illustrates a relation among a vacuum level, a work function ($\phi$M) of a metal, and electron affinity ($\chi$) of an oxide semiconductor.

Since a metal degenerates, a conduction band corresponds with a Fermi level. On the other hand, in general, a conventional oxide semiconductor is an n-type semiconductor, and the Fermi level ($E_F$) thereof is located nearer the conduction band (Ec) away from an intrinsic Fermi level (Ei) which is located in the center of the band gap. Note that it is known that hydrogen in the oxide semiconductor is a donor and one of factors that make the oxide semiconductor an n-type semiconductor.

On the other hand, according to one embodiment of the present invention, when a metal with a lower electronegativity than an electronegativity of hydrogen is used for the conductive film for the source electrode or the drain electrode, hydrogen which is an n-type impurity is removed from the oxide semiconductor and the oxide semiconductor is highly purified so that impurities that are not main components of the oxide semiconductor are included as little as possible in order that the oxide semiconductor may be made to be an intrinsic (i-type) semiconductor. That is, the oxide semiconductor becomes an i-type semiconductor not by addition of impurities but by removal of impurities such as hydrogen or water as much as possible to have high purity, so that an oxide semiconductor which is an intrinsic (i-type) semiconductor or is a substantially intrinsic (i-type) semiconductor is obtained. With the above structure, the Fermi level ($E_F$) can be substantially close to the same level as the intrinsic Fermi level (Ei), as indicated by arrows.

It is said that electron affinity ($\chi$) is 4.3 eV when the band gap (Eg) of the oxide semiconductor is 3.15 eV. The work function of titanium (Ti), by which the source electrode and the drain electrode are formed, is approximately equal to the electron affinity ($\chi$) of the oxide semiconductor. In that case, at the interface between a metal and the oxide semiconductor, a Schottky barrier for electrons is not formed.

That is, in the case where the work function ($\phi$M) of a metal is equal to the electron affinity ($\chi$) of the oxide semiconductor, an energy band diagram (schematic diagram) is shown as illustrated in FIG. 26A when the oxide semiconductor and the source electrode or the drain electrode are in contact with each other.

In FIG. 26B, a black dot (●) indicates an electron, and when a positive potential is applied to the drain electrode, the electron which crosses a barrier (h) is injected in the oxide semiconductor, and flows to the drain electrode. In that case, the height of the barrier (h) is changed depending on gate voltage and drain voltage. When positive drain voltage is applied, the height (h) of the barrier is smaller than the height (h) of the barrier of FIG. 26A without application of voltage, that is, ½ of the band gap (Eg).

At this time, the electron moves along the lowest part of the oxide semiconductor, which is energetically stable, at the interface between the gate insulating film and the highly purified oxide semiconductor as illustrated in FIG. 27A.

In FIG. 27B, when a negative potential (reverse bias) is applied to the gate electrode (GE), the number of holes that are minority carriers is substantially zero; thus, the current value becomes a value as close to zero as possible.

As described above, the oxide semiconductor film is highly purified so that the amount of impurities such as water or hydrogen which are not main components of the oxide semiconductor are minimized, whereby favorable operation of the thin film transistor can be obtained.

Next, the result that a sample in which an oxide semiconductor film and a conductive film are stacked is subjected to analysis of the secondary ion intensity distribution of hydrogen in the film thickness direction will be described.

First, a structure of the samples used for the analysis and a manufacturing method thereof will be described. Four samples, samples A to D, are used for the analysis. For each of the samples, a silicon oxynitride film having a thickness of approximately 80 nm and an In—Ga—Zn—O film having a thickness of approximately 30 nm are sequentially stacked over a glass substrate having a thickness of 0.7 mm, and then the films are subjected to heat treatment at 600° C. for six minutes in a nitrogen atmosphere. Further, for the sample A and the sample B, a titanium film having a thickness of approximately 100 nm and an aluminum film having a thickness of approximately 140 nm are sequentially stacked over the In—Ga—Zn—O film, whereas for the sample C and the sample D, a titanium film having a thickness of approximately 50 nm is formed over the In—Ga—Zn—O film. Lastly, the sample B and the sample D are subjected to heat treatment at 250° C. for one hour in a nitrogen atmosphere.

The secondary ion intensity distribution of hydrogen is analyzed by secondary ion mass spectroscopy (SIMS). The SIMS analyses of the sample A, the sample B, the sample C, and the sample D are illustrated in FIG. 29A, FIG. 29B, FIG. 30A, and FIG. 30B, respectively, which show secondary ion intensity distribution of hydrogen in the film thickness direction. The horizontal axis shows the depth from a sample surface, and a depth of 0 nm at the left edge corresponds to an approximate position of the sample surface. The vertical axis shows the secondary ion intensity of hydrogen on a logarithmic scale. The sample A of FIG. 29A and the sample B of FIG. 29B are analyzed in the direction from the aluminum film which is an outermost surface to the glass substrate. The sample C of FIG. 30A and the sample D of FIG. 30B are analyzed in the direction from the titanium film which is an outermost surface to the glass substrate.

Figure 29A:
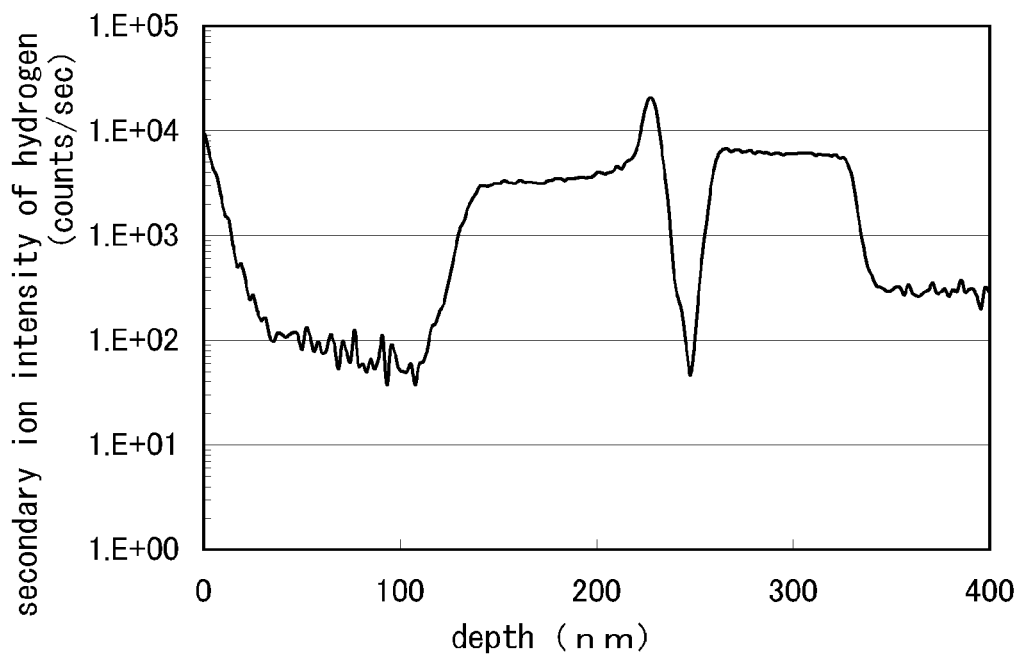
FIGS. 29A and 29B show results of analysis of secondary ion intensity of hydrogen by SIMS.
Figure 29B:
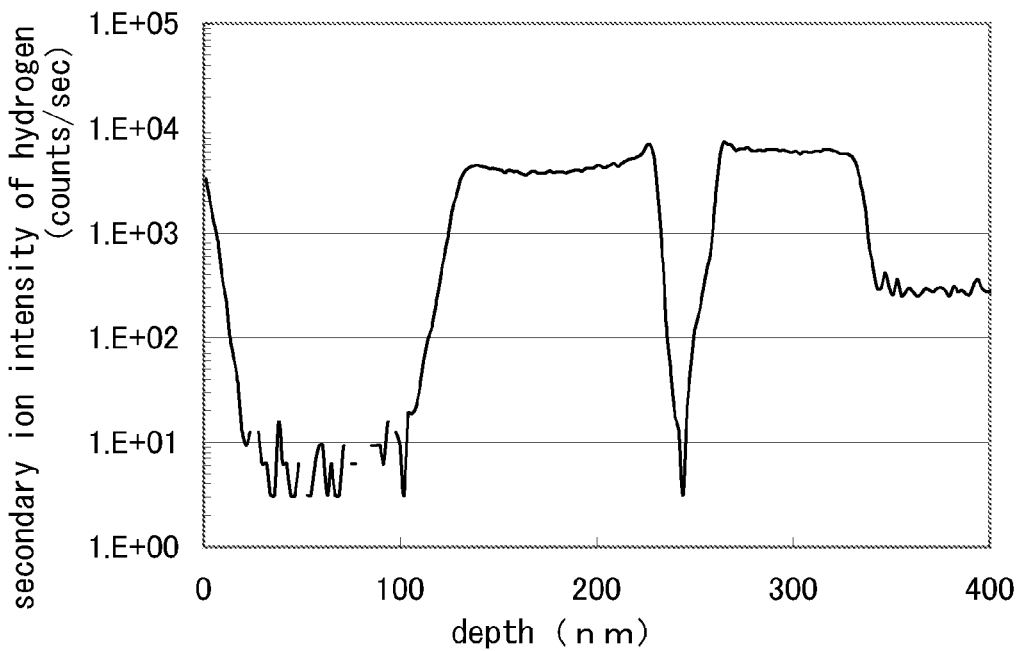

It is found that, from secondary ion intensity distributions of hydrogen in the sample A of FIG. 29A and the sample B of FIG. 29B, a valley-shaped peak showing a dramatic decrease in secondary ion intensity appears in a region having the In—Ga—Zn—O film where the depth from the sample surface is from approximately 240 nm to approximately 270 nm. In addition, it is found that, from secondary ion intensity distributions of hydrogen in the sample C of FIG. 30A and the sample D of FIG. 30B, a valley-shaped peak showing a dramatic decrease in secondary ion intensity appears in a region having the In—Ga—Zn—O film where the depth from the sample surface is from approximately 50 nm to approximately 80 nm.

Figure 30A:
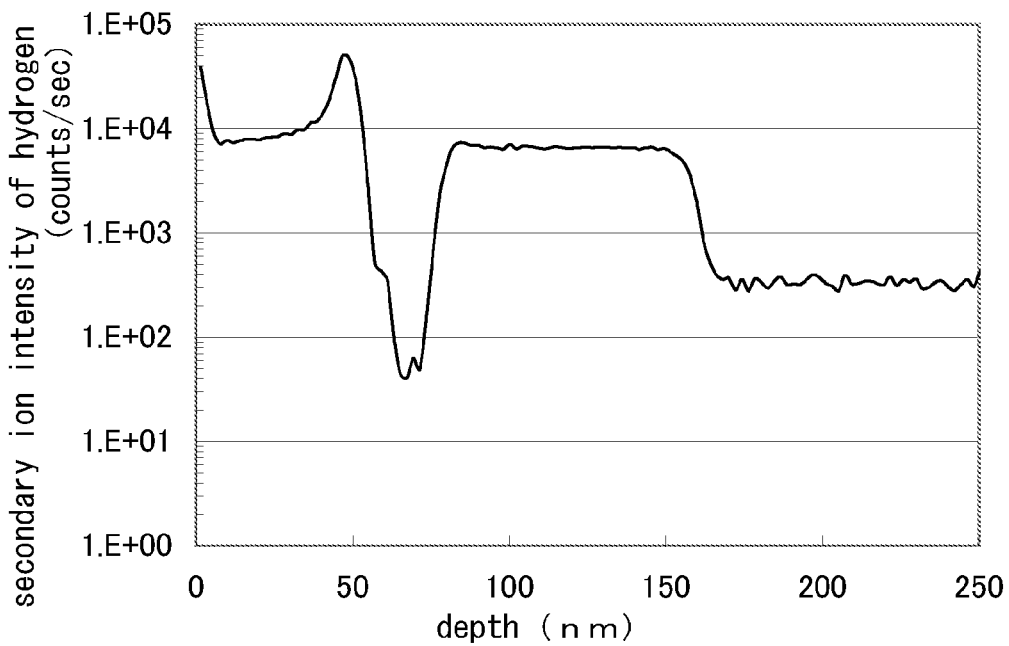
FIGS. 30A and 30B show results of analysis of secondary ion intensity of hydrogen by SIMS.
Figure 30B:
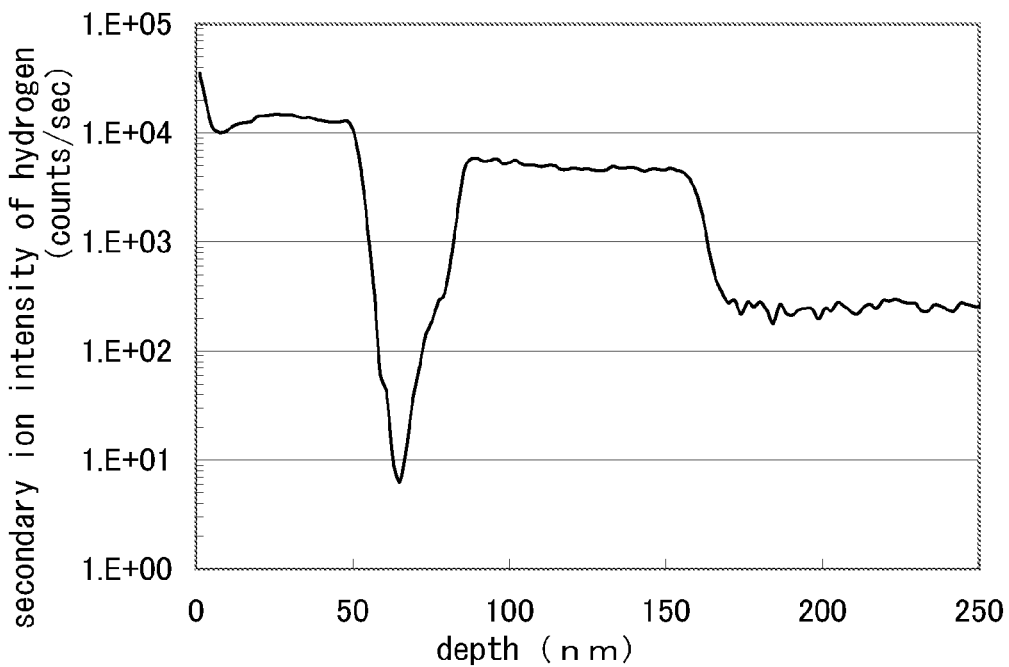

It is found that, from secondary ion intensity distribution of hydrogen of the sample A shown in FIG. 29A and secondary ion intensity distribution of hydrogen of the sample C shown in and FIG. 30A, secondary ion intensity of hydrogen in the titanium film is approximately 100 times as high as secondary ion intensity of hydrogen in the In—Ga—Zn—O film, before the heat treatment is performed. In addition, it is found that, from secondary ion intensity distribution of hydrogen of the sample B shown in FIG. 29B and secondary ion intensity distribution of hydrogen of the sample D shown in FIG. 30B, secondary ion intensity of hydrogen in the titanium film is approximately 1000 times as high as secondary ion intensity of hydrogen in the In—Ga—Zn—O film, after the heat treatment is performed. It is found that, from the comparison between the secondary ion intensity distributions of hydrogen before and after the heat treatment, secondary ion intensity of hydrogen is decreased by an order of magnitude or more by the heat treatment and elimination of hydrogen in the In—Ga—Zn—O film is promoted.

Embodiment 2

In this embodiment, a structure and a method for manufacturing a semiconductor device will be described with reference to FIGS. 5A to 5E, FIG. 6, and FIGS. 7A to 7C using a bottom gate thin film transistor having a channel protective structure as an example. Note that the same portions as Embodiment 1 or portions having functions similar to those of Embodiment 1 can be formed as in Embodiment 1, and also the same steps as Embodiment 1 or the steps similar to those of Embodiment 1 can be performed in a manner similar to those of Embodiment 1; therefore, repetition of the description is omitted.

Figure 5A:
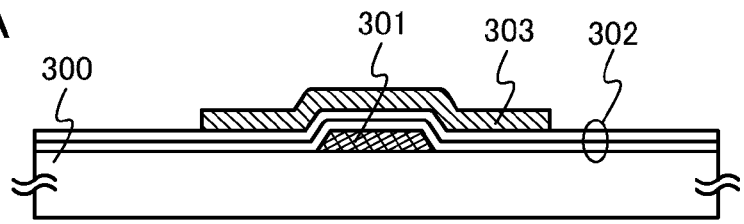
FIGS. 5A to 5E are views illustrating a method for manufacturing a semiconductor device.

As illustrated in FIG. 5A, a gate electrode 301 is formed over a substrate 300 having an insulating surface. An insulating film serving as a base film may be provided between the substrate 300 and the gate electrode 301. The descriptions of the material, the structure, and the thickness of the gate electrode 101 in Embodiment 1 may be referred to for those of the gate electrode 301. The descriptions of the material, the structure, and the thickness of the base film in Embodiment 1 may be referred to for those of the base film.

Next, a gate insulating film 302 is formed over the gate electrode 301. The descriptions of the material, the thickness, the structure, and the manufacturing method of the gate insulating film 102 in Embodiment 1 may be referred to for those of the gate insulating film 302.

Then, an island-shaped oxide semiconductor film 303 is formed over the gate insulating film 302. The descriptions of the material, the thickness, the structure, and the manufacturing method of the oxide semiconductor film 103 in Embodiment 1 may be referred to for those of the island-shaped oxide semiconductor film 303.

Figure 5B:
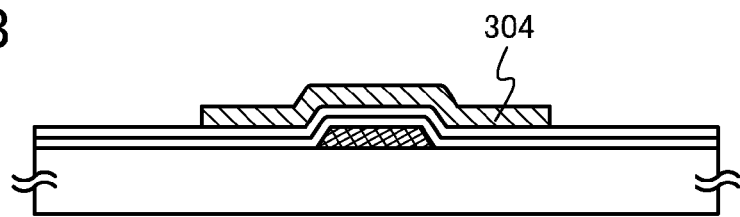

Next, heat treatment is performed on the island-shaped oxide semiconductor film 303 in a reduced atmosphere, an inert gas atmosphere of nitrogen, a rare gas, or the like, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb when measurement is performed using a dew-point meter of a cavity ring-down laser spectroscopy (CRDS) system). The heat treatment on the oxide semiconductor film 103 described in Embodiment 1 may be referred to for the heat treatment on the oxide semiconductor film 303. The oxide semiconductor film 303 is subjected to heat treatment in the above atmosphere, so that an island-shaped oxide semiconductor film 304 in which moisture or hydrogen contained in the oxide semiconductor film 303 is eliminated is formed as illustrated in FIG. 5B.

Impurities such as moisture or hydrogen are eliminated by the heat treatment, and the island-shaped oxide semiconductor film 304 becomes an intrinsic (i-type) semiconductor or a substantially i-type semiconductor; therefore, deterioration of characteristics of the transistor due to the impurities, such as shifts in threshold voltage, can be prevented from being promoted and off-state current can be reduced.

Figure 5C:
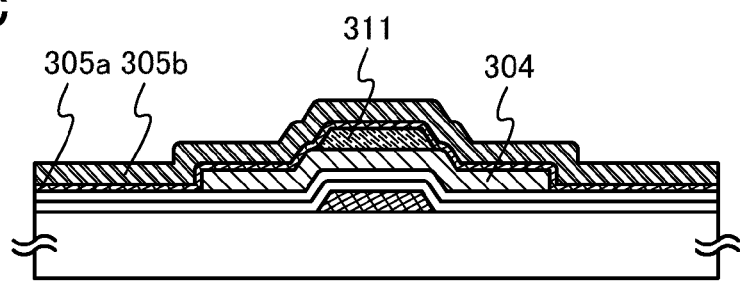

Next, as illustrated in FIG. 5C, a channel protective film 311 is formed over the oxide semiconductor film 304 so as to overlap with a portion of the oxide semiconductor film 304, which serves as a channel formation region. The channel protective film 311 can prevent the portion of the oxide semiconductor film 304, which serves as a channel formation region, from being damaged in a later step (for example, reduction in thickness due to plasma or an etchant in etching). Therefore, reliability of the thin film transistor can be improved.

The channel protective film 311 can be formed using an inorganic material including oxygen (such as silicon oxide, silicon oxynitride, or silicon nitride oxide). The channel protective film 311 can be formed by a vapor deposition method such as a plasma enhanced CVD method or a thermal CVD method, or a sputtering method. After the formation of the channel protective film 311, the shape thereof is processed by etching. Here, the channel protective film 311 is formed in such a manner that a silicon oxide film is formed by a sputtering method and processed by etching using a mask formed by photolithography.

When the channel protective film 311 which is an insulating film such as a silicon oxide film or a silicon oxynitride film is formed by a sputtering method, a PCVD method, or the like so as to be in contact with the island-shaped oxide semiconductor film 304, the resistance of at least a region of the island-shaped oxide semiconductor film 304, which is in contact with the channel protective film 311 is increased by supply of oxygen, so that a high-resistance oxide semiconductor region is formed. By the formation of the channel protective film 311, the oxide semiconductor film 304 can have the high-resistance oxide semiconductor region in the vicinity of the interface between the channel protective film 311 and the oxide semiconductor film 304.

Next, a first conductive film 305a formed using a metal with a low electronegativity; or a mixture, a metal compound, or an alloy which uses the metal and a second conductive film 305b are sequentially formed over the island-shaped oxide semiconductor film 304. The descriptions of the kind of the material, the structure, the thickness, and the manufacturing method of the first conductive film 105a and the second conductive film 105b in Embodiment 1 may be referred to for those of the first conductive film 305a and the second conductive film 305b. In this embodiment, a 100-nm-thick titanium film formed by a sputtering method is used as the first conductive film 305a, and a 200-nm-thick aluminum film formed by a sputtering method is used as the second conductive film 305b.

In one embodiment of the present invention, the first conductive film 305a is formed using a metal with a low electronegativity; or a mixture, a metal compound, or an alloy which uses the metal, so that impurities such as moisture or hydrogen existing in the oxide semiconductor film 304, the gate insulating film 302, or at an interface between the oxide semiconductor film 304 and another insulating film and the vicinity thereof are gettered by the first conductive film 305a. Therefore, by elimination of impurities such as moisture or hydrogen, the oxide semiconductor film 304 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

Note that in this embodiment, a two-layer conductive film in which the first conductive film 305a and the second conductive film 305b are stacked is used; however, one embodiment of the present invention is not limited to this structure. The first conductive film 305a having a metal with a low electronegativity may be used alone or a conductive film in which three or more conductive films are stacked may be used. In the case where a third conductive film is formed over the second conductive film 305b, the third conductive film is formed using a material which can prevent the surface of the second conductive film 305b from being oxidized. Specifically, the third conductive film can be formed using titanium, tantalum, tungsten, molybdenum, chromium, neodymium, or scandium; or a mixture, a metal, or an alloy containing one or more of the above metals.

After the first conductive film 305a and the second conductive film 305b are formed, the exposed second conductive film 305b may be subjected to heat treatment in an inert gas atmosphere such as a nitrogen atmosphere or a rare gas (argon, helium, or the like) atmosphere. The temperature range of the heat treatment for promoting gettering is preferably higher than or equal to 100° C. and lower than or equal to 350° C., more preferably, higher than or equal to 220° C. and lower than or equal to 280° C. as in Embodiment 1.

Figure 5D:
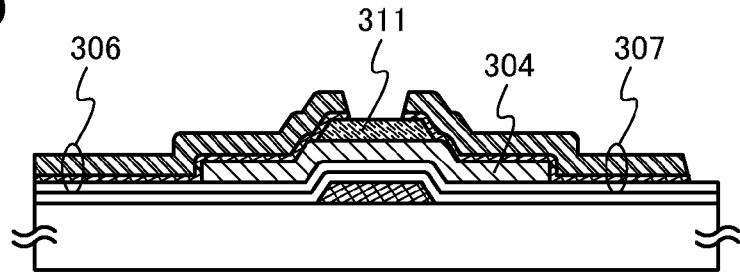

Next, as illustrated in FIG. 5D, the first conductive film 305a and the second conductive film 305b are processed (patterned) into desired shapes by etching or the like, whereby a source electrode 306 and a drain electrode 307 are formed. For example, when a titanium film is used for the first conductive film 305a and an aluminum film is used for the second conductive film 305b, after wet etching is performed on the second conductive film 305b using a solution containing phosphoric acid, wet etching may be performed on the first conductive film 305a using a solution (ammonia peroxide mixture) containing ammonia and hydrogen peroxide water. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, an aqueous solution in which hydrogen peroxide water of 31 wt %, ammonia water of 28 wt %, and water are mixed at a volume ratio of 5:2:2 is used. Alternatively, dry etching may be performed on the first conductive film 305a and the second conductive film 305b using a gas containing chlorine ($Cl_2$), boron chloride ($BCl_3$), or the like.

Figure 5E:
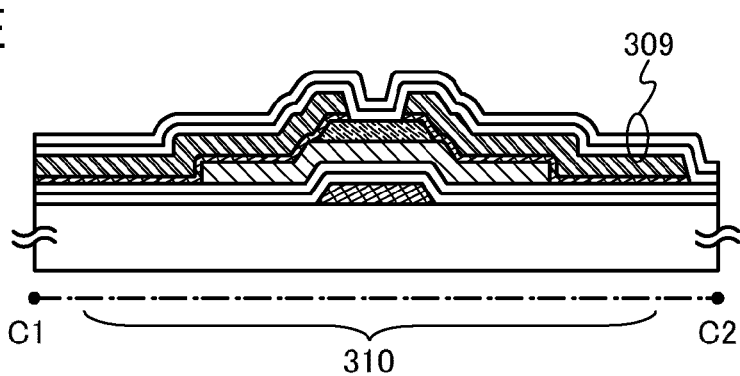

Then, as illustrated in FIG. 5E, after the source electrode 306 and the drain electrode 307 are formed, an insulating film 309 is formed so as to cover the oxide semiconductor film 304, the source electrode 306, the drain electrode 307, and the channel protective film 311. The kind of material, the structure, and the range of the thickness of the insulating film 309 are the same as those of the insulating film 109 described in Embodiment 1. In this embodiment, the insulating film 309 is formed to have a structure in which a 100-nm-thick silicon nitride film formed by a sputtering method is stacked over a 200-nm-thick silicon oxide film formed by a sputtering method. The substrate temperature in film formation may be higher than or equal to room temperature and lower than or equal to 300° C. and in this embodiment, is 100° C.

Note that after the insulating film 309 is formed, heat treatment may be performed. As for the condition of the heat treatment, the condition of the heat treatment which is performed after the insulating film 109 is formed in Embodiment 1 may be referred to.

Figure 6:
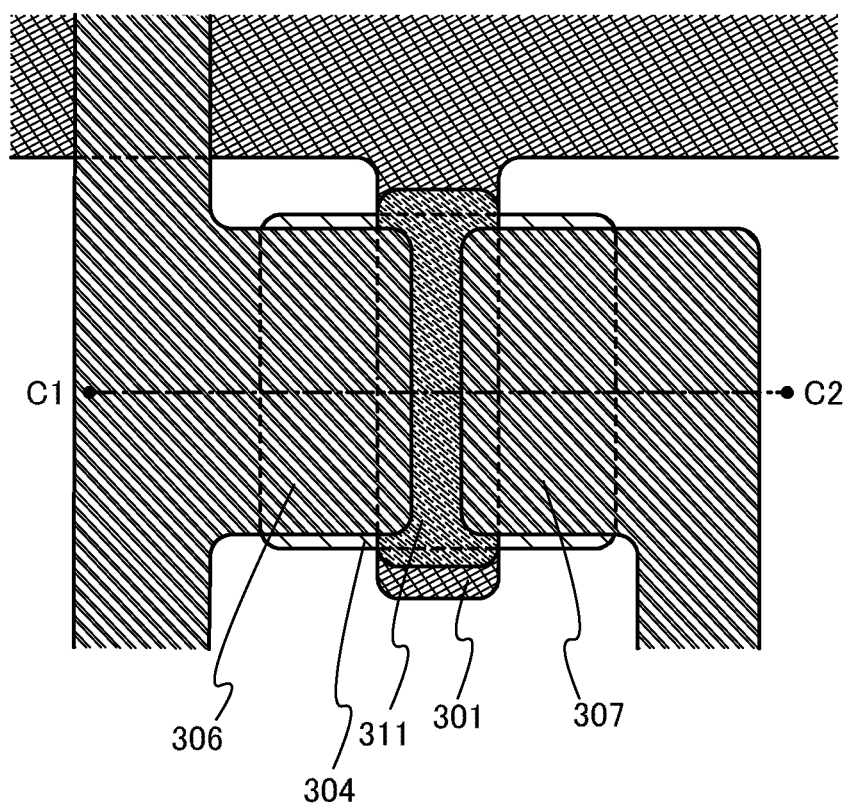
FIG. 6 is a top view of a thin film transistor.

FIG. 6 is a top view of the semiconductor device in FIG. 5E. FIG. 5E corresponds to a cross-sectional view taken along dashed line C1-C2 in FIG. 6.

A thin film transistor 310 formed in accordance with the manufacturing method has the gate electrode 301; the gate insulating film 302 over the gate electrode 301; the oxide semiconductor film 304 over the gate insulating film 302; the channel protective film 311 over the oxide semiconductor film 304; the source electrode 306 and the drain electrode 307 over the oxide semiconductor film 304; and the insulating film 309 over the oxide semiconductor film 304, the source electrode 306, the drain electrode 307, and the channel protective film 311.

Figure 7A:
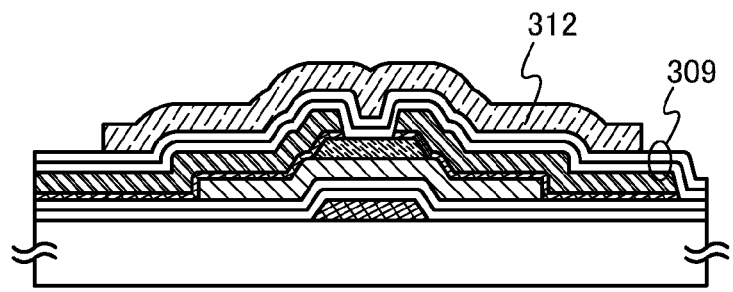
FIGS. 7A and 7B are cross-sectional views of a thin film transistor and FIG. 7C is a top view of the thin film transistor.

Next, as illustrated in FIG. 7A, after a conductive film is formed over the insulating film 309, the conductive film is patterned, so that a back gate electrode 312 may be formed so as to overlap with the oxide semiconductor film 304. Since the kind of material, the structure, and the range of the thickness of the back gate electrode 312 are similar to those of the back gate electrode 111 described in Embodiment 1, descriptions are omitted here.

Figure 7B:
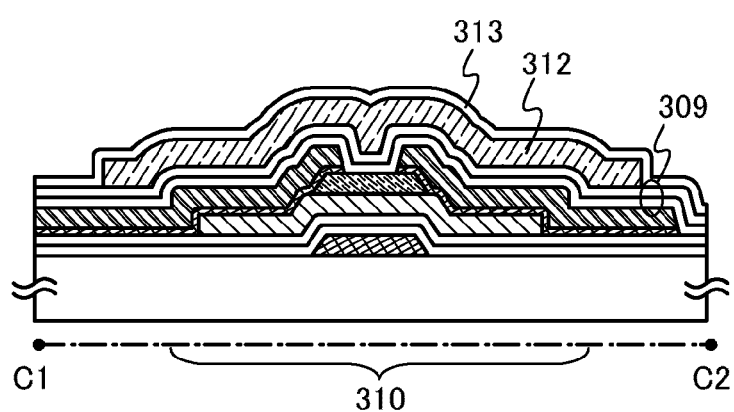

When the back gate electrode 312 is formed, an insulating film 313 is formed so as to cover the back gate electrode 312 as illustrated in FIG. 7B. Since the kind of material, the structure, and the range of the thickness of the insulating film 313 are similar to those of the insulating film 112 described in Embodiment 1, descriptions are omitted here.

Figure 7C:
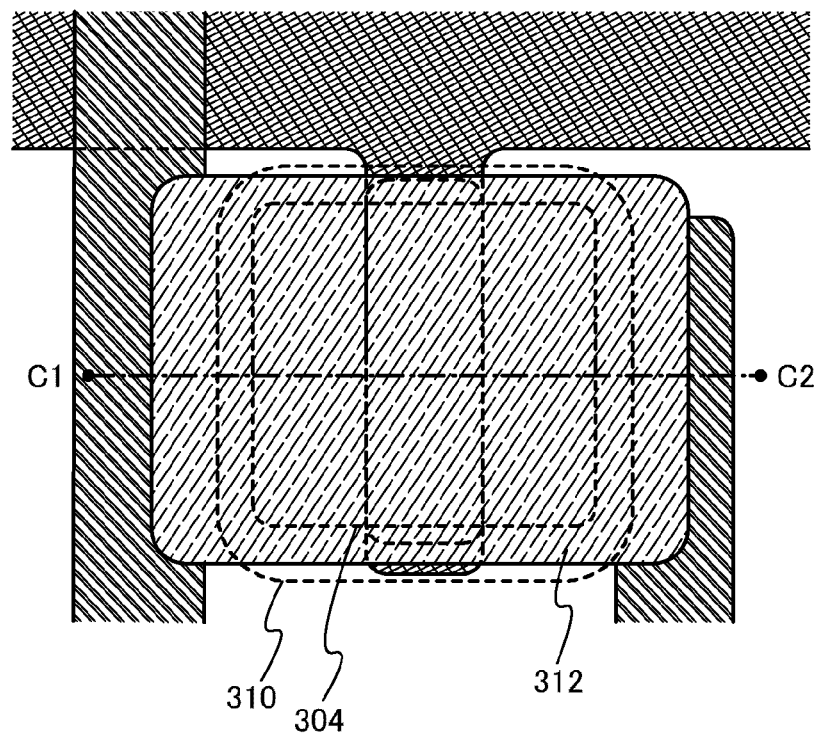

FIG. 7C is a top view of the semiconductor device in FIG. 7B. FIG. 7B corresponds to a cross-sectional view taken along dashed line C1-C2 in FIG. 7C.

Note that in this embodiment, an example is described in which the source electrode and the drain electrode are formed in accordance with the manufacturing method described in Embodiment 1; however, one embodiment of the present invention is not limited to this structure. The source electrode and the drain electrode may be formed in accordance with any of the manufacturing methods described in Embodiments 2 to 4.

This embodiment can be implemented by being combined as appropriate with any of the above-described embodiments.

Embodiment 3

In this embodiment, a structure and a method for manufacturing a semiconductor device will be described with reference to FIGS. 8A to 8E and FIG. 9 taking a bottom-contact thin film transistor as an example. Note that the same portions as Embodiment 1 or portions having functions similar to those of Embodiment 1 can be formed as in Embodiment 1, and also the same steps as Embodiment 1 or the steps similar to those of Embodiment 1 can be performed in a manner similar to those of Embodiment 1; therefore, repetition of the description is omitted.

Figure 8A:
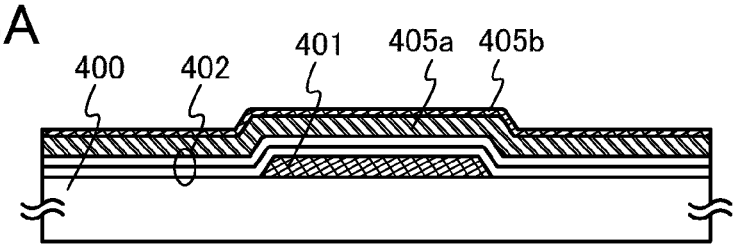
FIGS. 8A to 8E are cross-sectional views of a thin film transistor.

As illustrated in FIG. 8A, a gate electrode 401 is formed over a substrate 400 having an insulating surface. An insulating film serving as a base film may be provided between the substrate 400 and the gate electrode 401. The descriptions of the material, the structure, and the thickness of the gate electrode 101 in Embodiment 1 may be referred to for those of the gate electrode 401. The descriptions of the material, the structure, and the thickness of the base film in Embodiment 1 may be referred to for those of the base film.

Next, a gate insulating film 402 is formed over the gate electrode 401. The descriptions of the material, the thickness, the structure, and the manufacturing method of the gate insulating film 102 in Embodiment 1 may be referred to for those of the gate insulating film 402.

Next, over the gate insulating film 402, a first conductive film 405a and a second conductive film 405b which is formed using a metal with a low electronegativity; or a mixture, a metal compound, or an alloy which uses the metal are sequentially formed. The descriptions of the kind of the material, the structure, the thickness, and the manufacturing method of the first conductive film 105a and the second conductive film 105b in Embodiment 1 may be referred to for those of the second conductive film 405b and the first conductive film 405a. In this embodiment, a 200-nm-thick aluminum film formed by a sputtering method is used as the first conductive film 405a, and a 100-nm-thick titanium film formed by a sputtering method is used as the second conductive film 405b.

Note that in this embodiment, a two-layer conductive film in which the first conductive film 405a and the second conductive film 405b are stacked is used; however, one embodiment of the present invention is not limited to this structure. The second conductive film 405b having a metal with a low electronegativity may be used alone or a conductive film in which three or more conductive films are stacked may be used.

After the first conductive film 405a and the second conductive film 405b are formed, the exposed second conductive film 405b may be subjected to heat treatment in an inert gas atmosphere such as a nitrogen atmosphere or a rare gas (argon, helium, or the like) atmosphere. The temperature range of the heat treatment for promoting gettering is preferably higher than or equal to 100° C. and lower than or equal to 350° C., more preferably, higher than or equal to 220° C. and lower than or equal to 280° C. as in Embodiment 1.

Figure 8B:
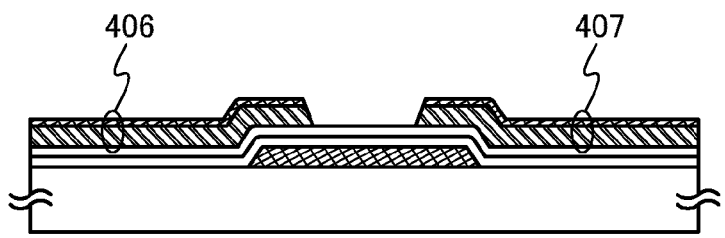

Next, as illustrated in FIG. 8B, the first conductive film 405a and the second conductive film 405b are processed (patterned) into desired shapes by etching or the like, whereby a source electrode 406 and a drain electrode 407 are formed. For example, when an aluminum film is used for the first conductive film 405a and a titanium film is used for the second conductive film 405b, after wet etching is performed on the second conductive film 405b using a solution (ammonia peroxide mixture) containing ammonia and hydrogen peroxide water, wet etching may be performed on the first conductive film 405a using a solution containing phosphoric acid. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, an aqueous solution in which hydrogen peroxide water of 31 wt %, ammonia water of 28 wt %, and water are mixed at a volume ratio of 5:2:2 is used. Alternatively, dry etching may be performed on the first conductive film 405a and the second conductive film 405b using a gas containing chlorine ($Cl_2$), boron chloride ($BCl_3$), or the like.

Figure 8C:
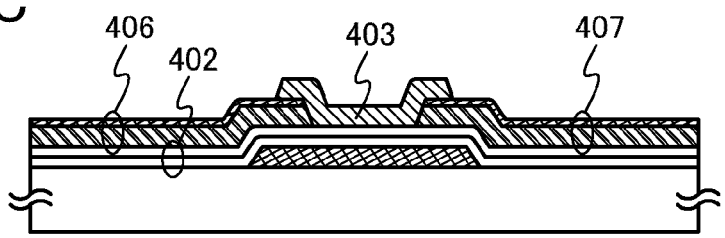

Next, as illustrated in FIG. 8C, an island-shaped oxide semiconductor film 403 is formed over the gate insulating film 402, the source electrode 406, and the drain electrode 407. The descriptions of the material, the thickness, the structure, and the manufacturing method of the oxide semiconductor film 103 in Embodiment 1 may be referred to for those of the island-shaped oxide semiconductor film 403.

Figure 8D:
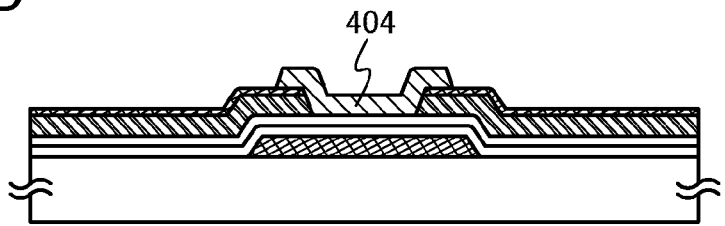

Next, heat treatment is performed on the island-shaped oxide semiconductor film 403 in a reduced atmosphere, an inert gas atmosphere of nitrogen, a rare gas, or the like, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb when measurement is performed using a dew-point meter of a cavity ring-down laser spectroscopy (CRDS) system). The descriptions of the heat treatment performed on the oxide semiconductor film 103 in Embodiment 1 may be referred to for the heat treatment performed on the oxide semiconductor film 403. The oxide semiconductor film 403 is subjected to heat treatment in the above atmosphere, so that an island-shaped oxide semiconductor film 404 in which moisture or hydrogen contained in the oxide semiconductor film 403 is eliminated is formed as illustrated in FIG. 8D. Impurities such as moisture or hydrogen are eliminated by the heat treatment, and the island-shaped oxide semiconductor film 404 becomes an intrinsic (i-type) semiconductor or a substantially i-type semiconductor; therefore, deterioration of characteristics of the transistor due to the impurities, such as shifts in threshold voltage, can be prevented from being promoted and off-state current can be reduced.

In one embodiment of the present invention, the second conductive film 405b is formed using a metal with a low electronegativity; or a mixture, a metal compound, or an alloy which uses the metal, so that impurities such as moisture or hydrogen existing in the oxide semiconductor film 404, the gate insulating film 402, or at an interface between the oxide semiconductor film 404 and another insulating film and the vicinity thereof are gettered by the second conductive film 405b. Therefore, by elimination of impurities such as moisture or hydrogen, the oxide semiconductor film 404 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

Note that in the case where a bottom gate transistor is used as in this embodiment, not only the second conductive film 405b but also the first conductive film 405a is in contact with the oxide semiconductor film 404. Accordingly, when a metal with a low electronegativity is used for the first conductive film 405a, impurities such as moisture or hydrogen existing in the oxide semiconductor film 404, the gate insulating film 402, or at an interface between the oxide semiconductor film 404 and another insulating film and the vicinity thereof may be gettered by the first conductive film 405a.

Figure 8E:
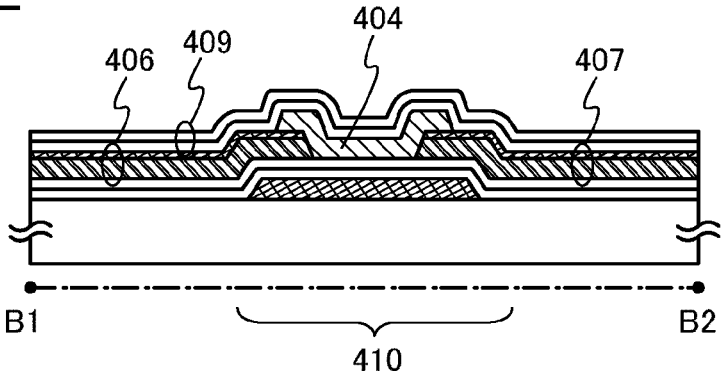

Then, as illustrated in FIG. 8E, after the source electrode 406 and the drain electrode 407 are formed, an insulating film 409 is formed so as to cover the oxide semiconductor film 404, the source electrode 406, and the drain electrode 407. The kind of material, the structure, and the range of the thickness of the insulating film 409 are the same as those of the insulating film 109 described in Embodiment 1. In this embodiment, the insulating film 409 is formed to have a structure in which a 100-nm-thick silicon nitride film formed by a sputtering method is stacked over a 200-nm-thick silicon oxide film formed by a sputtering method. The substrate temperature in film formation may be higher than or equal to room temperature and lower than or equal to 300° C. and in this embodiment, is 100° C.

Note that after the insulating film 409 is formed, heat treatment may be performed. As for the condition of the heat treatment, the condition of the heat treatment which is performed after the insulating film 109 is formed in Embodiment 1 may be referred to.

Figure 9:
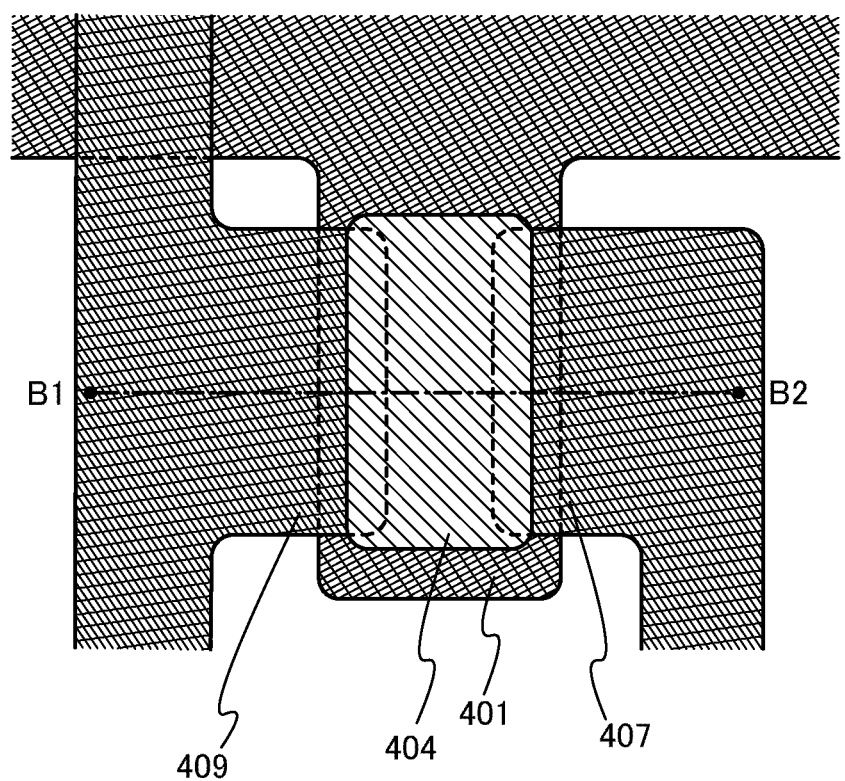
FIG. 9 is a top view of a thin film transistor.

FIG. 9 is a top view of the semiconductor device illustrated in FIG. 8E. FIG. 8E corresponds to a cross-sectional view taken along dashed line B1-B2 in FIG. 9.

A thin film transistor 410 formed in accordance with the manufacturing method has the gate electrode 401; the gate insulating film 402 over the gate electrode 401; the source electrode 406 and the drain electrode 407 over the gate insulating film 402; the oxide semiconductor film 404 over the gate insulating film 402, the source electrode 406, and the drain electrode 407; and the insulating film 409 over the oxide semiconductor film 404, the source electrode 406, and the drain electrode 407.

Next, after a conductive film is formed over the insulating film 409, the conductive film is patterned, so that a back gate electrode may be formed so as to overlap with the oxide semiconductor film 404. Since the kind of material, the structure, and the range of the thickness of the back gate electrode are similar to those of the back gate electrode 111 described in Embodiment 1, descriptions are omitted here.

When the back gate electrode is formed, an insulating film is formed so as to cover the back gate electrode. Since the kind of material, the structure, and the range of the thickness of the insulating film are similar to those of the insulating film 112 described in Embodiment 1, descriptions are omitted here.

This embodiment can be implemented by being combined as appropriate with any of the above-described embodiments.

Embodiment 4

In this embodiment, a method for manufacturing a semiconductor display device according to one embodiment of the present invention will be described with reference to FIGS. 10A to 10C, FIGS. 11A and 11B, FIGS. 12A and 12B, FIG. 13, FIG. 14, and FIG. 15.

Note that the term "successive film formation" in this specification means that during a series of a first film-formation step by sputtering and a second film-formation step by sputtering, an atmosphere in which a substrate to be processed is disposed is not contaminated by a contaminant atmosphere such as air, and is constantly controlled to be vacuum or an inert gas atmosphere (a nitrogen atmosphere or a rare gas atmosphere). By the successive film formation, film formation can be conducted to a substrate which has been cleaned, without re-attachment of moisture or the like.

Performing the process from the first film formation step to the second film formation step in the same chamber is within the scope of the successive formation in this specification.

In addition, the following is also within the scope of the successive formation in this specification: in the case of performing the process from the first film formation step to the second film formation step in plural chambers, the substrate is transferred after the first film formation step to another chamber without being exposed to air and subjected to the second film formation.

Note that between the first film formation step and the second film formation step, a substrate transfer step, an alignment step, a slow-cooling step, a step of heating or cooling the substrate to a temperature which is necessary for the second film formation step, or the like may be provided. Such a process is also within the scope of the successive formation in this specification.

A step in which liquid is used, such as a cleaning step, wet etching, or formation of a resist, may be provided between the first film formation step and the second film formation step. This case is not within the scope of the successive film formation in this specification.

Figure 10A:
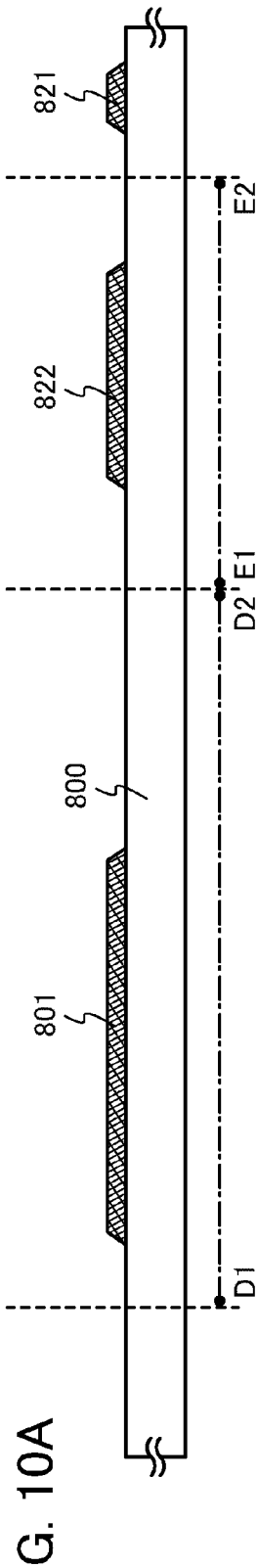
FIGS. 10A to 10C are cross-sectional views illustrating a method for manufacturing a semiconductor device.

In FIG. 10A, as a light-transmitting substrate 800, a glass substrate made by a fusion method or a float method; or a metal substrate such as a stainless steel alloy substrate, provided with an insulating film over its surface may be used. A substrate formed from a flexible synthetic resin, such as plastic, generally tends to have a low upper temperature limit, but can be used as the substrate 800 as long as the substrate can withstand processing temperatures in the later manufacturing process. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

In the case where a glass substrate is used and the temperature at which the heat treatment is to be performed in a later process is high, a glass substrate whose strain point is higher than or equal to 730° C. is preferably used. As the glass substrate, a glass material such as aluminosilicate glass, aluminoborosilicate glass, or barium borosilicate glass is used, for example. By containing a larger amount of barium oxide (BaO) than boric oxide, a more practical heat-resistant glass substrate is obtained. Therefore, a glass substrate containing BaO and $B_2O_3$ so that the amount of BaO is larger than that of $B_2O_3$ is preferably used.

Note that as the above glass substrate, a substrate formed using an insulator such as a ceramic substrate, a quartz substrate, or a sapphire substrate may be used. Alternatively, crystallized glass or the like may be used.

Next, after a conductive film is formed over an entire surface of the substrate 800, a first photolithography step is performed to form a resist mask, and unnecessary portions of the conductive film are removed by etching to form wirings and an electrode (a gate wiring including a gate electrode 801, a capacitor wiring 822, and a first terminal 821). At this time, etching is performed so that at least end portions of the gate electrode 801 may be tapered.

A material for the conductive film can be a single layer or a stacked layer using one or more of a metal material such as molybdenum, titanium, chromium, tantalum, tungsten, neodymium, or scandium; an alloy material which contains any of these metal materials as a main component; or a nitride of any of these metals. Note that aluminum or copper can also be used as such metal materials if it can withstand the temperature of heat treatment to be performed in a later process.

For example, as the conductive film having a two-layer structure, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure of a titanium nitride layer and a molybdenum layer. As a three-layer structure, the following structure is preferable: a stacked structure containing aluminum, an alloy of aluminum and silicon, an alloy of aluminum and titanium, or an alloy of aluminum and neodymium in a middle layer and any of tungsten, tungsten nitride, titanium nitride, and titanium in a top layer and a bottom layer.

A light-transmitting oxide conductive film can be used for part of the electrode and the wiring to increase the aperture ratio. For example, indium oxide, an indium-oxide tin-oxide alloy, an indium-oxide zinc-oxide alloy, zinc oxide, aluminum zinc oxide, aluminum zinc oxynitride, gallium zinc oxide, or the like can be used as the oxide conductive film.

The thickness of each of the gate electrode 801, the capacitor wiring 822, and the first terminal 821 is 10 nm to 400 nm, preferably 100 nm to 200 nm. In this embodiment, a conductive film for a gate electrode is formed to have a thickness of 100 nm by a sputtering method using a tungsten target. Then, the conductive film is processed (patterned) into a desired shape by etching, whereby the gate electrode 801, the capacitor wiring 822, and the first terminal 821 are formed.

Note that an insulating film serving as a base film may be formed between the substrate 800 and the gate electrode 801, the capacitor wiring 822, and the first terminal 821. As the base film, for example, a single layer or a stacked layer of any one of or a plurality of a silicon oxide film, a silicon oxynitride film, a silicon nitride film, a silicon nitride oxide film, an aluminum nitride film, and an aluminum nitride oxide film can be used. In particular, an insulating film having a high barrier property, for example, a silicon nitride film, a silicon nitride oxide film, an aluminum nitride film, or an aluminum nitride oxide film is used for the base film, so that impurities in an atmosphere, such as moisture or hydrogen, or impurities included in the substrate 800, such as an alkali metal or a heavy metal, can be prevented from entering the oxide semiconductor film, the gate insulating film or the interface between the oxide semiconductor film and another insulating film and the vicinity thereof.

Figure 10B:
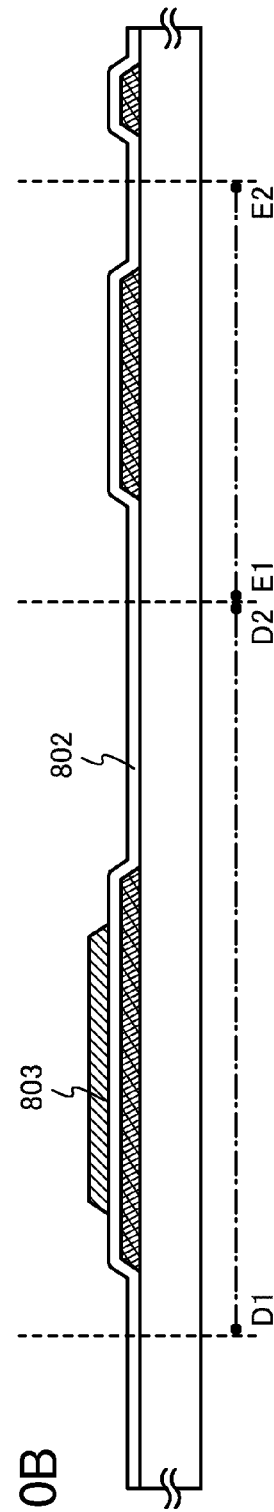

Next, a gate insulating film 802 is formed over the gate electrode 801, the capacitor wiring 822, and the first terminal 821 as illustrated in FIG. 10B. The gate insulating film 802 can be formed to have a single layer of a silicon oxide film, a silicon nitride film, a silicon oxynitride film, a silicon nitride oxide film, an aluminum oxide film, or a tantalum oxide film or a stacked layer thereof by a plasma enhanced CVD method, a sputtering method, or the like. It is preferable that the gate insulating film 802 include impurities such as moisture or hydrogen as little as possible. The gate insulating film 802 may have a structure in which an insulating film formed using a material having a high barrier property and an insulating film having lower proportion of nitrogen such as a silicon oxide film or a silicon oxynitride film are stacked. In that case, the insulating film such as a silicon oxide film or a silicon oxynitride film is formed between the insulating film having a barrier property and the oxide semiconductor film. As the insulating film having a high barrier property, for example, a silicon nitride film, a silicon nitride oxide film, an aluminum nitride film, an aluminum nitride oxide film, and the like can be given. The insulating film having a barrier property is used, so that impurities in an atmosphere, such as moisture or hydrogen, or impurities included in the substrate, such as an alkali metal or a heavy metal, can be prevented from entering the oxide semiconductor film, the gate insulating film 802, or the interface between the oxide semiconductor film and another insulating film and the vicinity thereof. In addition, the insulating film having lower proportion of nitrogen such as a silicon oxide film or a silicon oxynitride film is formed so as to be in contact with the oxide semiconductor film, so that the insulating film formed using a material having a high barrier property can be prevented from being in contact with the oxide semiconductor film directly.

In this embodiment, the gate insulating film 802 is formed to have a structure in which a 100-nm-thick silicon oxide film formed by a sputtering method is stacked over a 50-nm-thick silicon nitride film formed by a sputtering method.

Next, after the oxide semiconductor film is formed over the gate insulating film 802, the oxide semiconductor film is processed into a desired shape by etching or the like, whereby an island-shaped oxide semiconductor film 803 is formed. The oxide semiconductor film is formed by a sputtering method using an oxide semiconductor target. Moreover, the oxide semiconductor film can be formed by a sputtering method in a rare gas (for example, argon) atmosphere, an oxygen atmosphere, or an atmosphere including a rare gas (for example, argon) and oxygen.

Note that before the oxide semiconductor film is formed by a sputtering method, dust attached to a surface of the gate insulating film 802 is preferably removed by reverse sputtering in which an argon gas is introduced and plasma is generated. The reverse sputtering refers to a method in which, without application of voltage to a target side, an RF power supply is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

For the oxide semiconductor film, such an oxide semiconductor as above described can be used.

The thickness of the oxide semiconductor film is set to 10 nm to 300 nm, preferably, 20 nm to 100 nm. In this embodiment, film formation is performed using an oxide semiconductor target containing In, Ga, and Zn ($In_2O_3$:$Ga_2O_3$:ZnO=1:1:1 or $In_2O_3$:$Ga_2O_3$:ZnO=1:1:2 in a molar ratio) under the following conditions: the distance between a substrate and a target is 100 mm, the pressure is 0.6 Pa, the direct-current (DC) power supply is 0.5 kW, and the atmosphere is oxygen (the flow rate of oxygen is 100%). Note that a pulsed direct current (DC) power supply is preferable because dust can be reduced and the film thickness can be uniform. In this embodiment, as the oxide semiconductor film, an In—Ga—Zn—O-based non-single-crystal film having a thickness of 30 nm is formed with the use of an In—Ga—Zn—O-based oxide semiconductor target with a sputtering apparatus.

Note that after the plasma treatment, the oxide semiconductor film is formed without exposure to air, whereby adhesion of dust and moisture to an interface between the gate insulating film 802 and the oxide semiconductor film can be prevented. Further, a pulsed direct current (DC) power supply is preferable because dust can be reduced and a thickness distribution is uniform.

It is preferable that the relative density of the oxide semiconductor target is greater than or equal to 80%, more preferably, greater than or equal to 95%, further preferably, greater than or equal to 99.9%. The impurity concentration in the oxide semiconductor film which is formed using the target having high relative density can be reduced; thus, a thin film transistor having high electric characteristics or high reliability can be obtained.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering in which plasma generated with the use of microwaves is used without using glow discharge.

Furthermore, as a film formation method by a sputtering method, there are also a reactive sputtering method in which a target substance and a sputtering gas component are chemically reacted with each other during film formation to form a thin compound film thereof, and a bias sputtering method in which voltage is also applied to the substrate during film formation.

The substrate may be heated at a temperature higher than or equal to 400° C. and lower than or equal to 700° C. by light or a heater during the film formation by a sputtering method. The damage due to sputtering is repaired at the same time as the film formation by heating during film formation.

Preheat treatment is preferably performed so as to remove moisture or hydrogen remaining on an inner wall of the sputtering apparatus, on a surface of the target, or in a target material, before the oxide semiconductor film is formed. As the preheat treatment, a method in which the inside of the film formation chamber is heated to from 200° C. to 600° C. under reduced pressure, a method in which introduction and exhaust of nitrogen or an inert gas are repeated while the inside of the film formation chamber is heated, and the like can be given. After the preheat treatment, the substrate or the sputtering apparatus is cooled, and then the oxide semiconductor film is formed without exposure to air. In that case, not water but oil or the like is preferably used as a coolant for the target. Although a certain level of effect can be obtained when introduction and exhaust of nitrogen are repeated without heating, it is more preferable to perform the treatment with the inside of the film formation chamber heated.

It is preferable to remove moisture or the like remaining in the sputtering apparatus with the use of a cryopump before, during, or after the oxide semiconductor film is formed.

In a second photolithography step, the oxide semiconductor film is processed into a desired shape by wet etching using a solution of a mixture of phosphoric acid, acetic acid, and nitric acid for example, whereby the island-shaped oxide semiconductor film 803 can be formed. The island-shaped oxide semiconductor film 803 is formed so as to overlap with the gate electrode 801. In etching of the oxide semiconductor film, organic acid such as citric acid or oxalic acid can be used for an etchant. In this embodiment, the unnecessary portions are removed by wet etching using ITO07N (produced by Kanto Chemical Co., Inc.), whereby the island-shaped oxide semiconductor film 803 is formed. Note that etching here is not limited to wet etching and dry etching may be used.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

The etchant after the wet etching is removed together with the etched material by cleaning. The waste liquid including the etchant and the etched material may be purified and the material may be reused. When a material such as indium included in the oxide semiconductor film is collected from the waste liquid after the etching and reused, the resources can be efficiently used and the cost can be reduced.

In order to obtain a desired shape by etching, the etching conditions (such as an etchant, etching time, and temperature) are adjusted as appropriate depending on the material.

Figure 10C:
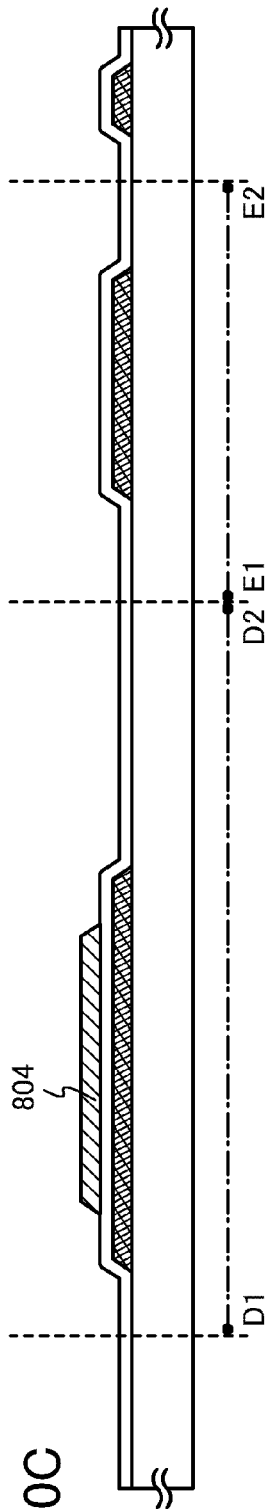

Next, as illustrated in FIG. 10C, heat treatment may be performed on the oxide semiconductor film 803 in a reduced atmosphere, an inert gas atmosphere of nitrogen, a rare gas, or the like, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb when measurement is performed using a dew-point meter of a cavity ring-down laser spectroscopy (CRDS) system). When the heat treatment is performed on the oxide semiconductor film 803, an oxide semiconductor film 804 is formed. Specifically, rapid thermal annealing (RTA) treatment can be performed in an inert gas (nitrogen, helium, neon, argon, or the like) atmosphere at a temperature higher than or equal to 500° C. and lower than or equal to 750° C. (or lower than or equal to a strain point of a glass substrate) for approximately greater than or equal to one minute and less than or equal to ten minutes, preferably, at 650° C. for approximately greater than or equal to three minutes and less than or equal to six minutes. Since dehydration or dehydrogenation can be performed in a short time by an RTA method, treatment can be performed even at a temperature over the strain point of the glass substrate. Note that the heat treatment is not necessarily performed after the island-shaped oxide semiconductor film 803 is formed, and the heat treatment may be performed on the oxide semiconductor film before etching treatment is performed. The heat treatment may be performed more than once after the island-shaped oxide semiconductor film 803 is formed.

In this embodiment, heat treatment is performed in a nitrogen atmosphere at 600° C. for six minutes in a state where the substrate temperature reaches the set temperature. A heating method using an electric furnace, a rapid heating method such as a gas rapid thermal annealing (GRTA) method using a heated gas or a lamp rapid thermal annealing (LRTA) method using lamp light, or the like can be used for the heat treatment. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

Note that it is preferable that in the heat treatment, moisture, hydrogen, or the like be not contained in nitrogen or a rare gas such as helium, neon, or argon. Alternatively, it is preferable that the purity of nitrogen or the rare gas such as helium, neon, or argon which is introduced into a heat treatment apparatus be set to be higher than or equal to 6N (99.9999%), preferably higher than or equal to 7N (99.99999%) (that is, the impurity concentration is lower than or equal to 1 ppm, preferably lower than or equal to 0.1 ppm).

Note that cross-sectional views taken along dashed lines D1-D2 and E1-E2 of FIG. 10C correspond to cross-sectional views taken along dashed lines D1-D2 and E1-E2 in a plan view illustrated in FIG. 13, respectively.

Next, as illustrated in FIG. 11A, a conductive film 806 used for a source electrode and a drain electrode is formed over the oxide semiconductor film 804 by a sputtering method or a vacuum evaporation method. In this embodiment, the conductive film 806 in which a second conductive film 806b is stacked over a first conductive film 806a formed using a metal with a low electronegativity; or a mixture, a metal compound, or an alloy which uses the metal.

As the metal with a low electronegativity, titanium, magnesium, yttrium, aluminum, tungsten, molybdenum, and the like can be given. A mixture, a metal compound, or an alloy each including one or more of the above metals can be used for the first conductive film 806a. The above material may be combined with a heat-resistant conductive material such as an element selected from tantalum, chromium, neodymium, and scandium; an alloy containing one or more of these elements as a component; or a nitride containing the element as a component.

The thickness of the first conductive film 806a is preferably 10 nm to 200 nm, more preferably, 50 nm to 150 nm. The thickness of the second conductive film 806b is preferably 100 nm to 300 nm, more preferably, 150 nm to 250 nm. In this embodiment, a 100-nm-thick titanium film formed by a sputtering method is used as the first conductive film 806a, and a 200-nm-thick aluminum film formed by a sputtering method is used as the second conductive film 806b.

In one embodiment of the present invention, the first conductive film 806a is formed using a metal with a low electronegativity; or a mixture, a metal compound, or an alloy which uses the metal, so that impurities such as moisture or hydrogen existing in the oxide semiconductor film 804, the gate insulating film 802, or at an interface between the oxide semiconductor film 804 and another insulating film and the vicinity thereof are gettered by the first conductive film 806a. Therefore, by elimination of impurities such as moisture or hydrogen, the oxide semiconductor film 804 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

In addition to the above structure, the exposed second conductive film 806b is subjected to heat treatment in an inert gas atmosphere such as a nitrogen atmosphere or a rare gas (argon, helium, or the like) atmosphere, so that gettering may be promoted. The temperature range of the heat treatment for promoting gettering is preferably higher than or equal to 100° C. and lower than or equal to 350° C., more preferably, higher than or equal to 220° C. and lower than or equal to 280° C. as in Embodiment 1. The heat treatment is performed, so that impurities such as moisture or hydrogen existing in the oxide semiconductor film 804, the gate insulating film 802 or at the interface between the oxide semiconductor film 804 and another insulating film and the vicinity thereof can be easily gettered by the first conductive film 806a.

Next, as illustrated in FIG. 11B, a third photolithography step is performed, and the first conductive film 806a and the second conductive film 806b are processed (patterned) into desired shapes by etching or the like, whereby a source electrode 807 and a drain electrode 808 are formed. For example, when a titanium film is used for the first conductive film 806a and an aluminum film is used for the second conductive film 806b, after wet etching is performed on the second conductive film 806b using a solution containing phosphoric acid, wet etching may be performed on the first conductive film 806a using a solution (ammonia peroxide mixture) containing ammonia and hydrogen peroxide water. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, an aqueous solution in which hydrogen peroxide water of 31 wt %, ammonia water of 28 wt %, and water are mixed at a volume ratio of 5:2:2 is used. Alternatively, dry etching may be performed on the first conductive film 806a and the second conductive film 806b using a gas containing chlorine ($Cl_2$), boron chloride ($BCl_3$), or the like.

When the source electrode 807 and the drain electrode 808 are formed by the patterning, part of an exposed portion of the island-shaped oxide semiconductor film 804 is etched in some cases. In this embodiment, the case where an island-shaped oxide semiconductor film 805 having a groove (a depressed portion) is formed is described.

In the third photolithography step, a second terminal 820 which is formed from the same material as the source electrode 807 and the drain electrode 808 is left in a terminal portion. Note that the second terminal 820 is electrically connected to a source wiring (a source wiring including the source electrode 807 and the drain electrode 808).

Further, by use of a resist mask which is formed using a multi-tone mask and has regions with plural thicknesses (for example, two different thicknesses), the number of resist masks can be reduced, resulting in simplified process and lower costs.

Figure 14:
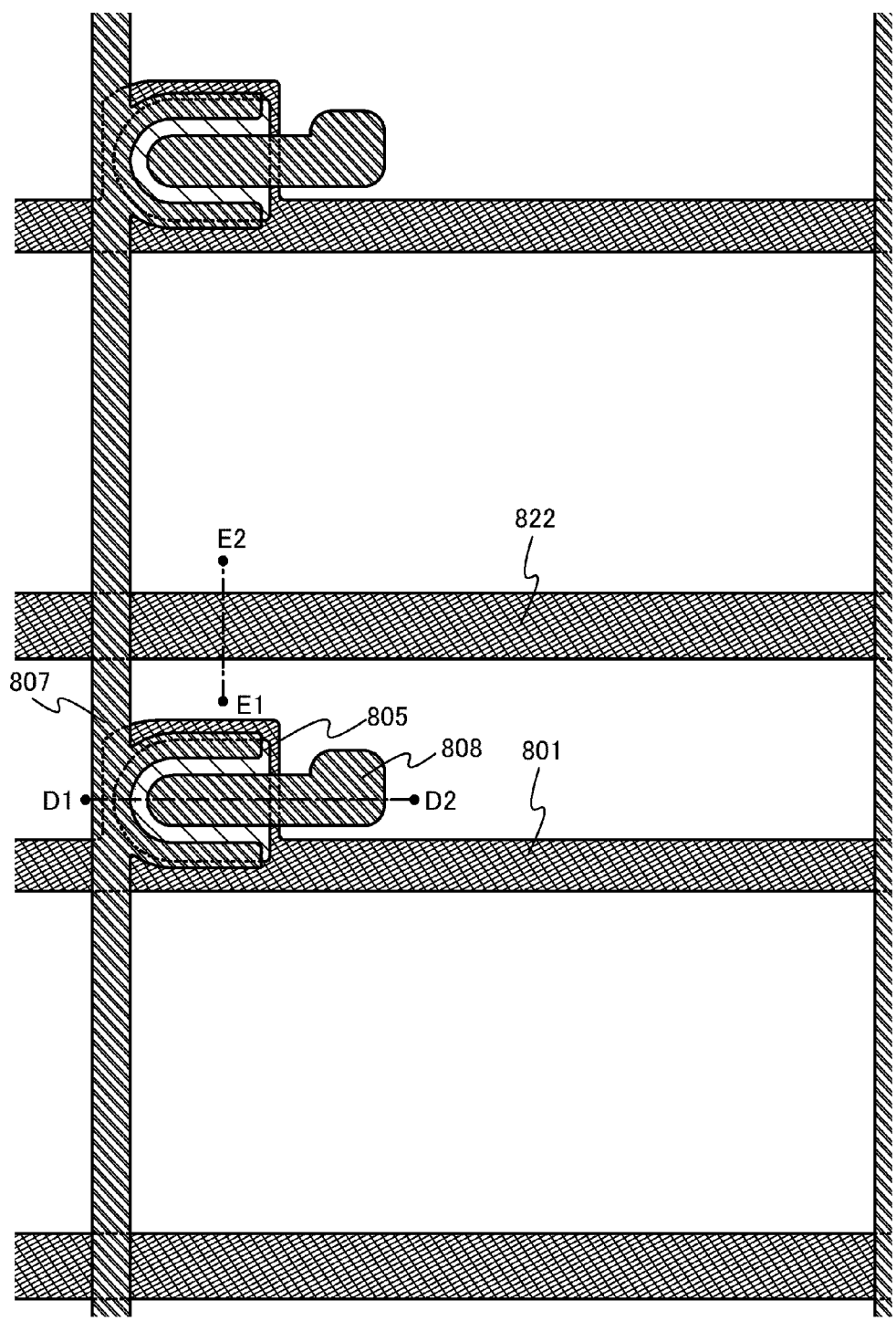
FIG. 14 is a top view illustrating a method for manufacturing a semiconductor device.
Figure 15:
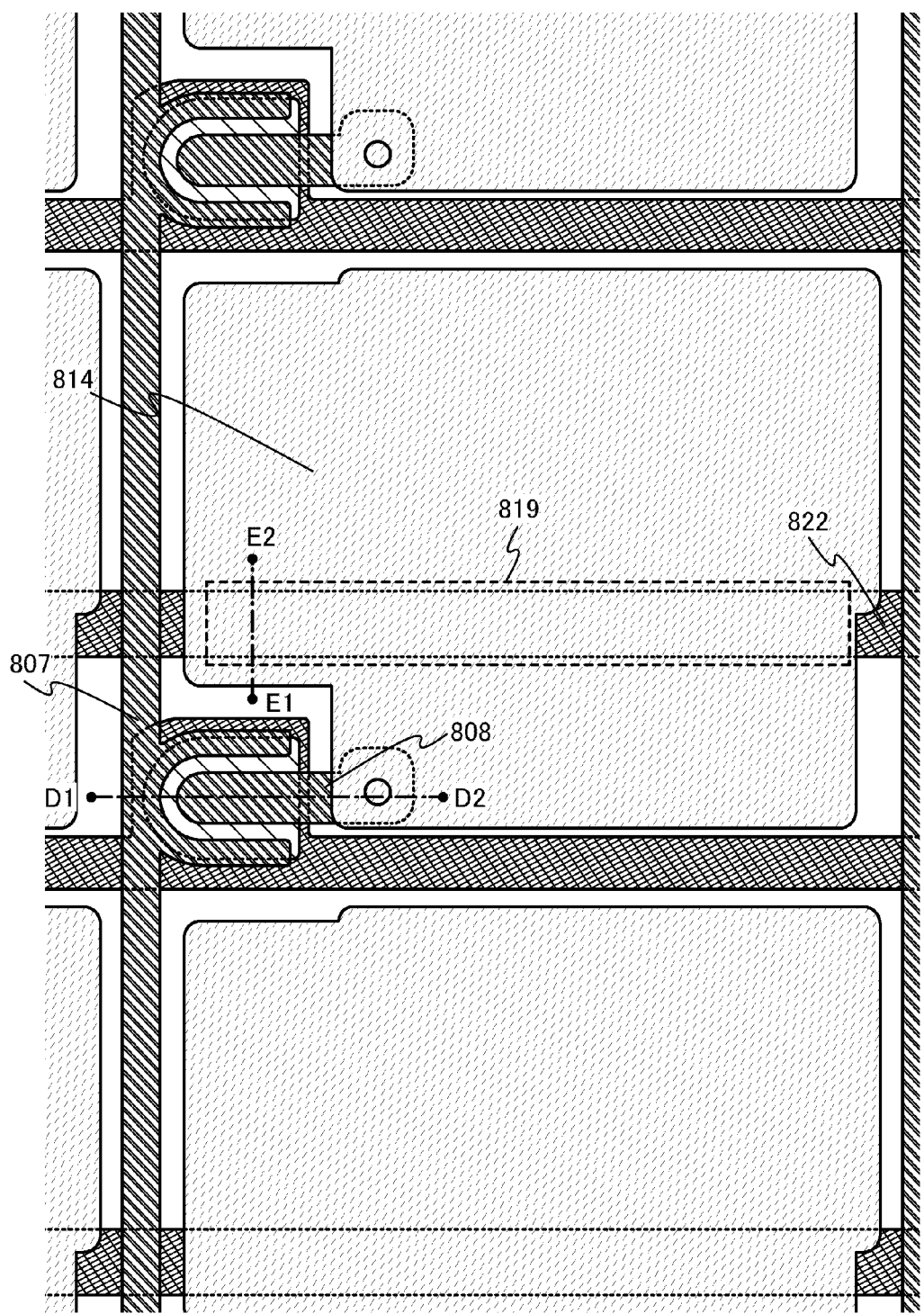
FIG. 15 is a top view illustrating a method for manufacturing a semiconductor device.

Note that cross-sectional views taken along dashed lines D1-D2 and E1-E2 of FIG. 11B correspond to cross-sectional views taken along dashed lines D1-D2 and E1-E2 in a plan view illustrated in FIG. 14, respectively.

Note that in this embodiment, a manufacturing method is described taking a transistor having the structure described in Embodiment 1 as an example; however, the transistor described in Embodiment 2 or 3 may be used.

As illustrated in FIG. 12A, after the source electrode 807 and the drain electrode 808 are formed, an insulating film 809 is formed so as to cover the source electrode 807, the drain electrode 808, and the oxide semiconductor film 805. The insulating film 809 preferably includes impurities such as moisture or hydrogen as little as possible, and the insulating film 809 may be formed using a single-layer insulating film or a plurality of insulating films stacked. A material having a high barrier property is preferably used for the insulating film 809. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen than the insulating film having a barrier property, such as a silicon oxide film or a silicon oxynitride film, is formed on the side closer to the oxide semiconductor film 805. Then, the insulating film having a barrier property is formed so as to overlap with the source electrode 807, the drain electrode 808, and the oxide semiconductor film 805 with the insulating film having lower proportion of nitrogen between the insulating film having a barrier property and the source electrode 807, the drain electrode 808, and the oxide semiconductor film 805. When the insulating film having a barrier property is used, the impurities such as moisture or hydrogen can be prevented from entering the oxide semiconductor film 805, the gate insulating film 802, or the interface between the oxide semiconductor film 805 and another insulating film and the vicinity thereof. In addition, the insulating film having lower proportion of nitrogen such as a silicon oxide film or a silicon oxynitride film is formed so as to be in contact with the oxide semiconductor film 805, so that the insulating film formed using a material having a high barrier property can be prevented from being in contact with the oxide semiconductor film 805 directly.

In this embodiment, the insulating film 809 is formed to have a structure in which a 100-nm-thick silicon nitride film formed by a sputtering method is stacked over a 200-nm-thick silicon oxide film formed by a sputtering method. The substrate temperature in film formation may be higher than or equal to room temperature and lower than or equal to 300° C. and in this embodiment, is 100° C.

An exposed region of the oxide semiconductor film 805 provided between the source electrode 807 and the drain electrode 808 and silicon oxide which forms the insulating film 809 are provided to be in contact with each other, so that oxygen is supplied to the oxide semiconductor film 805; therefore, the resistance of the region of the oxide semiconductor film 805 which is in contact with the insulating film 809 is increased, whereby the oxide semiconductor film 805 having a channel formation region with high resistance can be formed.

Next, after the insulating film 809 is formed, heat treatment may be performed. The heat treatment is performed at a temperature higher than or equal to 200° C. and lower than or equal to 400° C., for example, higher than or equal to 250° C. and lower than or equal to 350° C., in an air atmosphere or an inert gas (nitrogen, helium, neon, argon, or the like) atmosphere. For example, heat treatment is performed in a nitrogen atmosphere at 250° C. for one hour. Alternatively, RTA treatment may be performed at high temperature for a short time as in the previous heat treatment. By the heat treatment, the oxide semiconductor film 805 is heated while being in contact with silicon oxide which forms the insulating film 809. In addition, the resistance of the oxide semiconductor film 805 is increased by supply of oxygen. Accordingly, electric characteristics of the transistor can be improved and variation in the electric characteristics thereof can be reduced. There is no particular limitation on when to perform this heat treatment as long as it is performed after the formation of the insulating film 809. When this heat treatment also serves as heat treatment in another step, for example, heat treatment in formation of a resin film or heat treatment for reducing resistance of a transparent conductive film, the number of steps can be prevented from increasing.

Through the above steps, a thin film transistor 813 can be manufactured.

Next, in a fourth photolithography step, a resist mask is formed and the insulating film 809 and the gate insulating film 802 are etched, so that a contact hole is formed to expose parts of the drain electrode 808, the first terminal 821, and the second terminal 820. Next, the resist mask is removed, and then a transparent conductive film is formed. The transparent conductive film is formed of indium oxide ($In_2O_3$), an indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated particularly in etching ITO, an indium oxide-zinc oxide alloy ($In_2O_3$—$ZnO$) may be used to improve etching processability. Moreover, in the case where heat treatment for reducing resistance of the transparent conductive film, the heat treatment can also serve as the heat treatment which increases the resistance of the oxide semiconductor film 805 so that improvement and less variation in electric characteristics of the transistor may be achieved.

Next, in a fifth photolithography step, a resist mask is formed and unnecessary portions are removed by etching, so that a pixel electrode 814 which is connected to the drain electrode 808, a transparent conductive film 815 which is connected to the first terminal 821, and a transparent conductive film 816 which is connected to the second terminal 820 are formed.

The transparent conductive films 815 and 816 function as electrodes or wirings connected to an FPC. The transparent conductive film 815 formed over the first terminal 821 is a connection terminal electrode which functions as an input terminal of the gate wiring. The transparent conductive film 816 formed over the second terminal 820 is a connection terminal electrode which functions as an input terminal of the source wiring.

In this sixth photolithography step, the capacitor wiring 822 and the pixel electrode 814 together form a storage capacitor 819 with the use of the gate insulating film 802 and the insulating film 809 as dielectrics.

A cross-sectional view after the resist mask is removed is illustrated in FIG. 12B. Note that cross-sectional views taken along dashed lines D1-D2 and E1-E2 of FIG. 12B correspond to cross-sectional views taken along dashed lines D1-D2 and E1-E2 in a plan view illustrated in FIG. 15, respectively.

Through these six photolithography steps, the storage capacitor 819 and a pixel thin film transistor portion including the thin film transistor 813 which is a bottom-gate thin film transistor having an inverted staggered structure can be completed using the six photomasks. By disposing the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween.

Alternatively, a storage capacitor may be formed with a pixel electrode which overlaps with a gate wiring of an adjacent pixel, with an insulating film and a gate insulating film interposed therebetween, without provision of the capacitor wiring.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In the case of manufacturing a light-emitting display device, a partition including an organic resin film is provided between organic light-emitting elements in some cases. In that case, heat treatment performed on the organic resin film can also serve as the heat treatment which increases the resistance of the oxide semiconductor film 805 so that improvement and less variation in electric characteristics of the transistor may be achieved.

The use of an oxide semiconductor for a thin film transistor leads to reduction in manufacturing cost. In particular, impurities such as moisture or hydrogen are reduced by heat treatment and the purity of the oxide semiconductor film is increased. Therefore, a semiconductor display device including a highly reliable thin film transistor having favorable electric characteristics can be manufactured without using an ultrapure oxide semiconductor target or a special sputtering apparatus in which dew point in the film formation chamber is reduced.

Since the semiconductor film in the channel formation region is a region whose resistance is increased, electric characteristics of the thin film transistor are stabilized, and an increase in off-state current or the like can be prevented. Therefore, a semiconductor display device including highly reliable thin film transistors having favorable electric characteristics can be provided.

This embodiment can be implemented by being combined as appropriate with any of the above-described embodiments.

Embodiment 5

In this embodiment, a structure of a semiconductor display device which is referred to as electronic paper or digital paper and which is one of the semiconductor display devices formed using a manufacturing method of the present invention will be described.

A display element which can control grayscale by voltage application and has memory characteristics is used for electronic paper. Specifically, in the display element used for the electronic paper, a display element such as a non-aqueous electrophoretic display element; a display element using a PDLC (polymer dispersed liquid crystal) method, in which liquid crystal droplets are dispersed in a high molecular material which is between two electrodes; a display element which includes chiral nematic liquid crystal or cholesteric liquid crystal between two electrodes; a display element which includes charged fine particles between two electrodes and employs a particle-moving method by which the charged fine particles are moved through fine particles by using an electric field; or the like can be used. Further, a non-aqueous electrophoretic display element may be a display element in which a dispersion liquid, in which charged fine particles are dispersed, is sandwiched between two electrodes; a display element in which a dispersion liquid in which charged fine particles are dispersed is included over two electrodes between which an insulating film is interposed; a display element in which twisting balls having hemispheres which are different colors which charge differently are dispersed in a solvent between two electrodes; a display element which includes microcapsules, in which a plurality of charged fine particles is dispersed in a solution, between two electrodes; or the like.

Figure 16A:
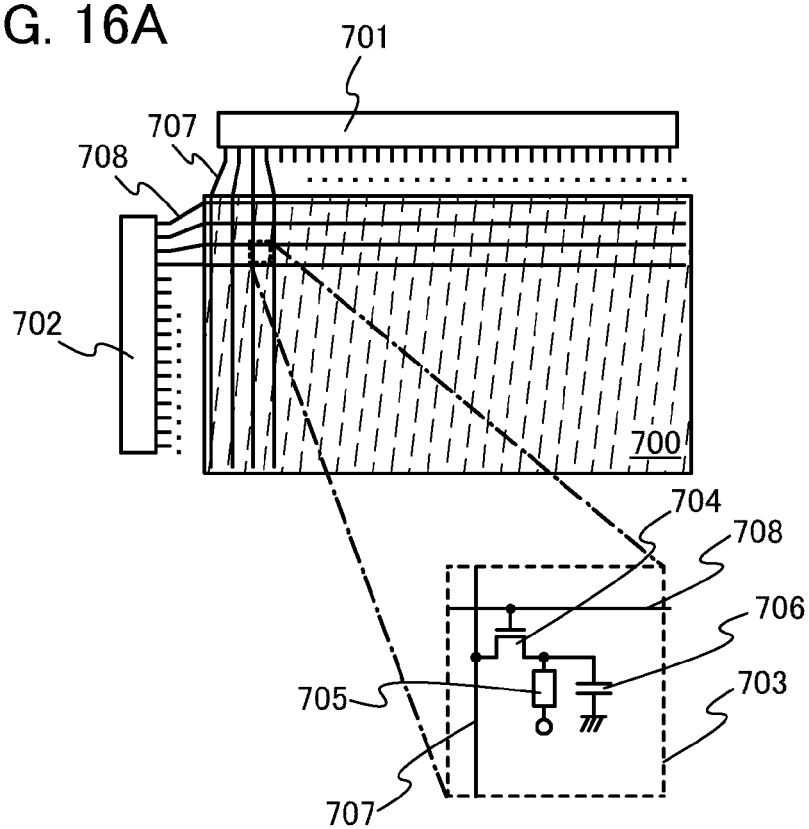
FIG. 16A is a top view of electronic paper and FIG. 16B is a cross-sectional view thereof.

FIG. 16A is a top view of a pixel portion 700, a signal line driver circuit 701, and a scan line driver circuit 702 of electronic paper.

The pixel portion 700 includes a plurality of pixels 703. A plurality of signal lines 707 is led into the pixel portion 700 from the signal line driver circuit 701. A plurality of scan lines 708 is led into the pixel portion 700 from the scan line driver circuit 702.

Each pixel 703 includes a transistor 704, a display element 705, and a storage capacitor 706. A gate electrode of the transistor 704 is connected to one of the scan lines 708. One of a source electrode and a drain electrode of the transistor 704 is connected to one of the signal lines 707, and the other of the source electrode and the drain electrode of the transistor 704 is connected to a pixel electrode of the display element 705.

Note that in FIG. 16A, the storage capacitor 706 is connected in parallel to the display element 705 so that voltage applied between the pixel electrode and a counter electrode of the display element 705 may be stored; however, in the case where the memory characteristics of the display element 705 are sufficiently high enough to maintain display, the storage capacitor 706 is not necessarily provided.

Although a structure of an active matrix pixel portion in which one transistor which serves as a switching element is provided in each pixel is illustrated in FIG. 16A, the electronic paper of one embodiment of the present invention is not limited to this structure. A plurality of transistors may be provided in each pixel. Further, in addition to transistors, elements such as capacitors, resistors, or coils may also be provided.

Figure 16B:
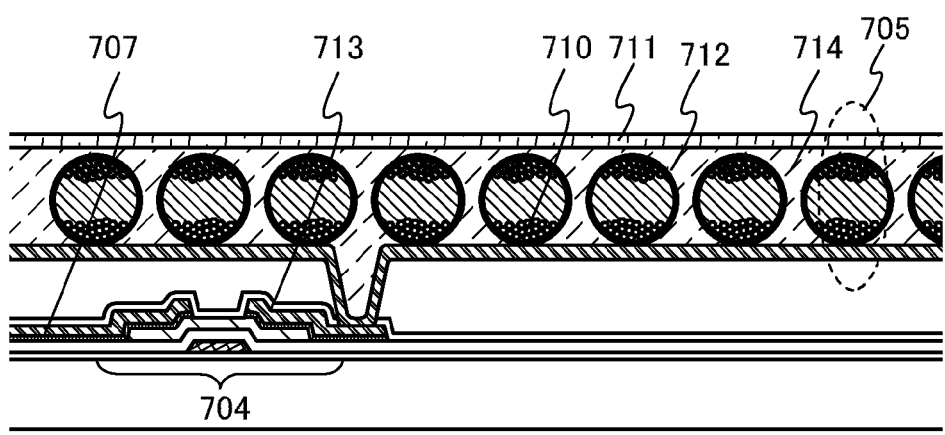

A cross-sectional view of the display element 705 provided in each pixel 703 is illustrated in FIG. 16B taking electrophoretic electronic paper having microcapsules as an example.

The display element 705 has a pixel electrode 710, a counter electrode 711, and a microcapsule 712 to which voltage is applied by the pixel electrode 710 and the counter electrode 711. One of a source electrode and a drain electrode 713 of the transistor 704 is connected to the pixel electrode 710.

In the microcapsule 712, a positively charged white pigment such as titanium oxide and a negatively charged black pigment such as carbon black are encapsulated together with a dispersion medium such as oil. Voltage is applied between the pixel electrode and the counter electrode in accordance with the voltage of a video signal applied to the pixel electrode 710, and the black pigment and the white pigment are drawn to a positive electrode side and a negative electrode side, respectively. Therefore, grayscales can be displayed.

In FIG. 16B, the microcapsule 712 is fixed by a light-transmitting resin 714 between the pixel electrode 710 and the counter electrode 711. However, one embodiment of the present invention is not limited to this structure, and a space formed by the microcapsule 712, the pixel electrode 710, and the counter electrode 711 may be filled with a gas such as air, an inert gas, or the like. Note that in that case, the microcapsule 712 is preferably fixed to one of or both the pixel electrode 710 and the counter electrode 711 by an adhesive agent or the like.

The number of the microcapsules 712 included in the display element 705 is not necessarily plural as illustrated in FIG. 16B. One display element 705 may have a plurality of the microcapsules 712, or a plurality of the display elements 705 may have one microcapsule 712. For example, two display elements 705 share one microcapsule 712, and positive voltage and negative voltage are applied to the pixel electrode 710 included in one of the display elements 705 and the pixel electrode 710 included in the other display element 705, respectively. In that case, in the microcapsule 712 in a region overlapping with the pixel electrode 710 to which positive voltage is applied, the black pigment is drawn to the pixel electrode 710 side and the white pigment is drawn to the counter electrode 711 side. On the other hand, in the microcapsule 712 in a region overlapping with the pixel electrode 710 to which negative voltage is applied, the white pigment is drawn to the pixel electrode 710 side and the black pigment is drawn to the counter electrode 711 side.

Next, the above electronic paper of the electrophoretic system is given as one example to describe a specific driving method of electronic paper.

The operation of the electronic paper can be described in accordance with the following periods: an initialization period, a writing period, and a holding period.

First, the grayscale levels of each of the pixels in a pixel portion are temporarily set to be equal in the initialization period before a display image is switched in order to initialize display elements. Initialization of the gray scale level prevents a residual image from remaining. Specifically, in an electrophoretic system, displayed grayscale level is adjusted by the microcapsule 712 included in the display element 705 such that the display of each pixel is white or black.

In this embodiment, an operation of initialization in the case where an initialization video signal for displaying white is input to a pixel after an initialization video signal for displaying black is input to a pixel will be described. For example, when the electronic paper of an electrophoretic system in which display of an image is performed with respect to the counter electrode 711 side, voltage is applied to the display element 705 such that the black pigment in the microcapsule 712 moves to the counter electrode 711 side and the white pigment in the microcapsule 712 moves to the pixel electrode 710 side. Next, voltage is applied to the display element 705 such that the white pigment in the microcapsule 712 moves to the counter electrode 711 side and the black pigment in the microcapsule 712 moves to the pixel electrode 710 side.

Further, when an initialization video signal is input to the pixel only once, the white pigment and the black pigment in the microcapsule 712 do not finish moving completely depending on the grayscale level displayed before the initialization period; thus, it is possible that a difference between displayed grayscale levels of pixels occurs even after the initialization period ends. Therefore, it is preferable that negative voltage −Vp with respect to common voltage Vcom be applied to the pixel electrode 710 a plurality of times so that black is displayed and positive voltage Vp with respect to the common voltage Vcom be applied to the pixel electrode 710 a plurality of times so that white is displayed.

Note that when grayscale levels displayed before the initialization period differ depending on display elements of each of the pixels, the minimum number of times for inputting an initialization video signal also varies. Accordingly, the number of times for inputting an initialization video signal may be changed between pixels in accordance with a grayscale level displayed before the initialization period. In that case, the common voltage Vcom is preferably input to a pixel to which the initialization video signal is not necessarily input.

Note that in order for the voltage Vp or the voltage −Vp which is an initialization video signal to be applied to the pixel electrode 710 a plurality of times, the following operation sequence is performed a plurality of times: the initialization video signal is input to a pixel of a line including the scan line in a period during which a pulse of a selection signal is supplied to each scan line. The voltage Vp or the voltage −Vp of an initialization video signal is applied to the pixel electrode 710 a plurality of times, whereby movement of the white pigment and the black pigment in the microcapsule 712 converges in order to prevent a difference of grayscale levels between pixels from occurring. Thus, initialization of a pixel in the pixel portion can be performed.

Note that in each pixel in the initialization period, the case where black is displayed after white as well as the case where white is displayed after black is acceptable. Alternatively, in each pixel in the initialization period, the case where black is displayed after white is displayed; and further, after that white is displayed is also acceptable.

Further, as for all of the pixels in the pixel portion, timing of starting the initialization period is not necessarily the same. For example, timing of starting the initialization period may be different for every pixel, or every pixel belonging to the same line, or the like.

Next in the writing period, a video signal having image data is input to the pixel.

In the case where an image is displayed on the entire pixel portion, in one frame period, a selection signal in which a pulse of voltage is shifted is sequentially input to all of the scan lines. Then, in one line period in which a pulse appears in a selection signal, a video signal having image data is input to all of the signal lines.

The white pigment and the black pigment in the microcapsule 712 are moved to the pixel electrode 710 side and the counter electrode 711 in accordance with the voltage of the video signal applied to the pixel electrode 710, so that the display element 705 displays a grayscale.

Note that also in the writing period, the voltage of a video signal is preferably applied to the pixel electrode 710 a plurality of times as in the initialization period. Accordingly, the following operation sequence is performed a plurality of times: the video signal is input to a pixel of a line including the scan line in a period during which a pulse of a selection signal is supplied to each scan line.

Next, in the holding period, a selection signal is not input to a scan line or a video signal is not input to a signal line after the common voltage Vcom is input to all of the pixels through signal lines. Accordingly, the positions of the white pigment and the black pigment in the microcapsule 712 included in the display element 705 is maintained unless positive or negative voltage is applied between the pixel electrode 710 and the common electrode 711, so that the grayscale level displayed on the display element 705 is held. Therefore, an image written in the writing period is maintained even in the holding period.

Note that voltage needed for changing the grayscale levels of the display element used for electronic paper tends to be higher than those of a liquid crystal element used for a liquid crystal display device or those of a light-emitting element such as an organic light-emitting element used for a light-emitting device. Therefore, the potential difference between the source electrode and the drain electrode of the transistor 704 of a pixel serving for a switching element in a writing period is large; as a result, off-state current is increased, and disturbance of display is likely to occur due to fluctuation of potentials of the pixel electrode 710. However, as described above, in one embodiment of the present invention, an oxide semiconductor film is used for an active layer of the transistor 704. Accordingly, off-state current of the transistor 704 in a state where voltage between the gate electrode and the source electrode is substantially zero, that is, leakage current is considerably low. Therefore, even when a potential difference between the source electrode and the drain electrode of the transistor 704 increases in the writing period, off-state current can be suppressed, and generation of disturbance of display due to the change in the potential of the pixel electrode 710 can be prevented. In addition, the potential difference between the source electrode and the drain electrode of the transistor 704 of the pixel serving for a switching element in the writing period is large, so that the transistor 704 easily deteriorates. However, in one embodiment of the present invention, variation in threshold voltage of the transistor 704 due to degradation over time can be reduced, so that reliability of the electronic paper can be enhanced.

This embodiment can be implemented by being combined as appropriate with any of the above-described embodiments.

Embodiment 6

Figure 17A:
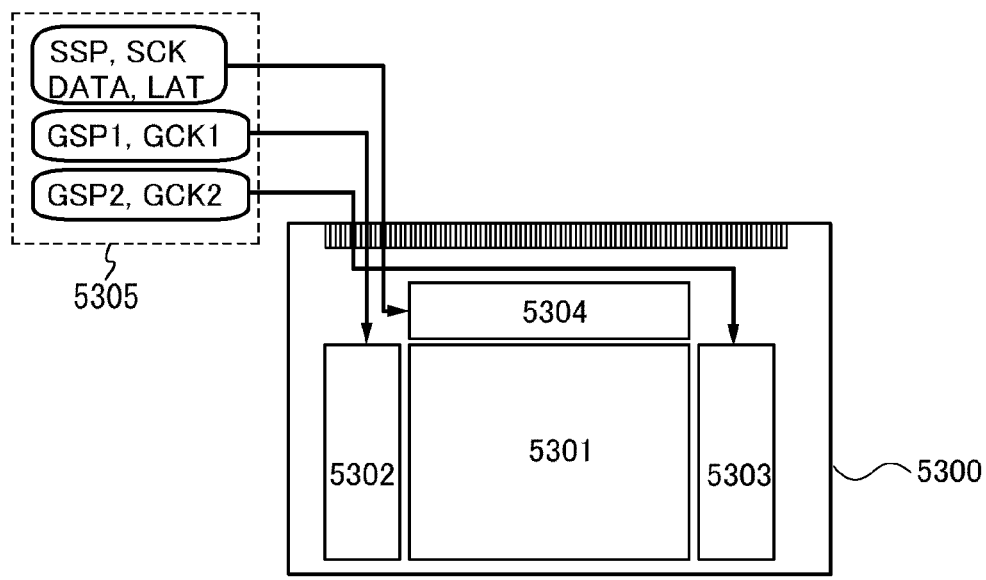
FIGS. 17A and 17B are block diagrams of a semiconductor device.

FIG. 17A is an example of a block diagram of an active matrix semiconductor display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines which is extended from the signal line driver circuit 5304 is provided and a plurality of scan lines which is extended from the first scan line driver circuit 5302 and the second scan line driver circuit 5303 is provided. Note that pixels which include display elements are provided in a matrix form in respective regions where the scan lines and the signal lines intersect with each other. Further, the substrate 5300 in the display device is connected to a timing control circuit 5305 (also referred to as a controller or a controller IC) through a connection point such as a flexible printed circuit (FPC).

In FIG. 17A, the first scan line driver circuit 5302, the second scan line driver circuit 5303, and the signal line driver circuit 5304 are formed over one substrate 5300 where the pixel portion 5301 is formed. Therefore, since the number of components provided outside, such as a driver circuit is reduced, it is possible not only to downsize the display device but also to reduce cost due to the decrease in the number of assembly steps and inspection steps. In addition, if the driver circuit is provided outside the substrate 5300, wiring would need to be extended and the number of wiring connections would be increased, but if the driver circuit is provided over the substrate 5300, the number of connections of the wirings can be reduced. Therefore, the decrease in yield due to defective connection of the driver circuit and the pixel portion can be prevented, and the decrease in reliability due to low mechanical strength at a connection point can be prevented.

Note that as an example, the timing control circuit 5305 supplies a first scan line driver circuit start signal (GSP1) (a start signal is also referred to as a start pulse) and a scan line driver circuit clock signal (GCK1) to the first scan line driver circuit 5302. The timing control circuit 5305 supplies, for example, a second scan line driver circuit start signal (GSP2) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Note that one of the first scan line driver circuit 5302 and the second scan line driver circuit 5303 can be omitted.

Figure 17B:
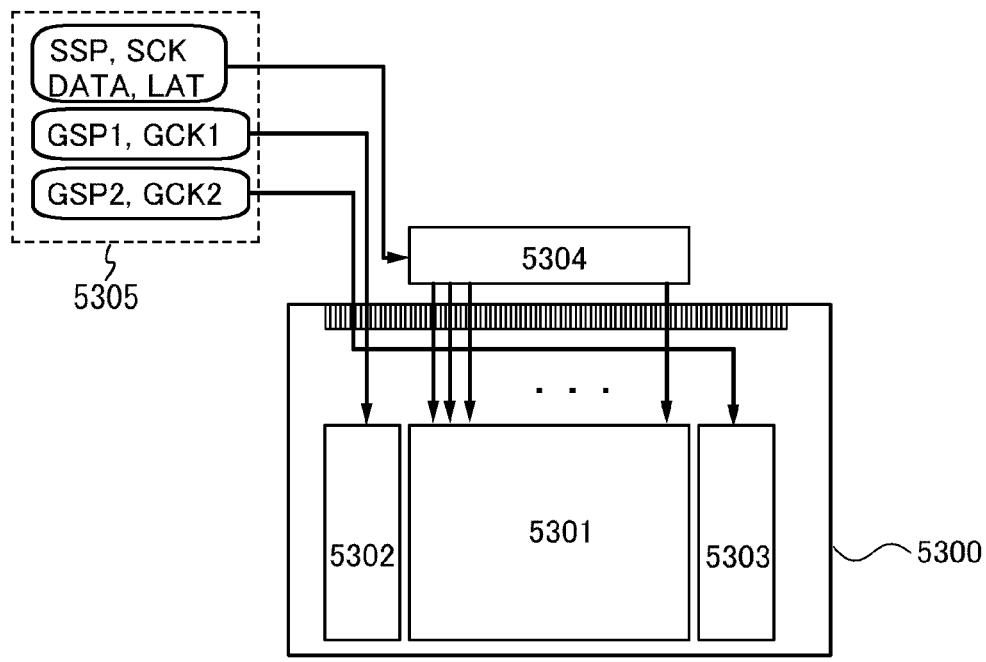

FIG. 17B illustrates a structure in which circuits with low driving frequency (for example, the first scan line driver circuit 5302 and the second scan line driver circuit 5303) are formed over one substrate 5300 where the pixel portion 5301 is formed and the signal line driver circuit 5304 is formed over another substrate which is different from the substrate provided with the pixel portion 5301. It is possible to form a circuit with low driving frequency such as an analog switch used for a sampling circuit in the signal line driver circuit 5304 partly over one substrate 5300 where the pixel portion 5301 is formed. Thus, a system-on-panel is partly employed, so that advantages of the system-on-panel such as the above-described prevention of decrease in yield due to the defective connection, or low mechanical strength at a connection point, and reduction in cost due to the decrease in the number of assembly steps and inspection steps can be obtained more or less. Further, as compared with the system-on-panel in which the pixel portion 5301, the first scan line driver circuit 5302, the second scan line driver circuit 5303, and the signal line driver circuit 5304 are formed over one substrate, the system-on-panel is partly employed, so that it is possible to increase the performance of a circuit with high driving frequency. Moreover, formation of a pixel portion having a large area is possible, which is difficult to realize in the case of using a single crystal semiconductor.

Next, a structure of a signal line driver circuit including an n-channel transistor will be described.

Figure 18A:
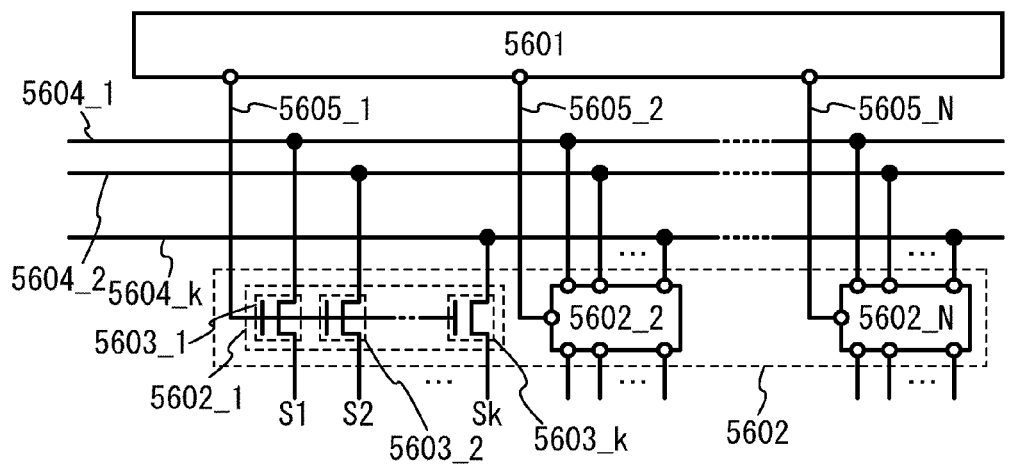
FIG. 18A is a diagram illustrating a structure of a signal line driver circuit and FIG. 18B is a timing chart thereof.

The signal line driver circuit illustrated in FIG. 18A includes a shift register 5601 and a sampling circuit 5602. The sampling circuit 5602 includes a plurality of switching circuits 5602_1 to 5602_N (N is a natural number). The switching circuits 5602_1 to 5602_N each include a plurality of n-channel transistors 5603_1 to 5603_$k$ ($k$ is a natural number).

A connection relation in the signal line driver circuit will be described taking the switching circuit 5602_1 as an example. Note that one of a source electrode and a drain electrode of a transistor is referred to as a first terminal, and the other is referred to as a second terminal below.

First terminals of the transistors 5603_1 to 5603_$k$ are connected to wirings 5604_1 to 5604_$k$, respectively. Note that a video signal is input to each of the wirings 5604_1 to 5604_$k$. Second terminals of the transistors 5603_1 to 5603_$k$ are connected to signal lines S1 to Sk, respectively. Gate electrodes of the transistors 5603_1 to 5603_$k$ are connected to the shift register 5601.

The shift register 5601 has the function of sequentially selecting the switching circuits 5602_1 to 5602_N by sequentially outputting timing signals having high level (H-level) voltage to wirings 5605_1 to 5605_N.

The switching circuit 5602_1 has a function of controlling a conduction state between the wirings 5604_1 to 5604_$k$ and the signal lines S1 to Sk (conduction between the first terminal and the second terminal), namely a function of controlling whether or not to supply potentials of the wirings 5604_1 to 5604_$k$ to the signal lines S1 to Sk by switching of the transistors 5603_1 to 5603_$k$.

Figure 18B:
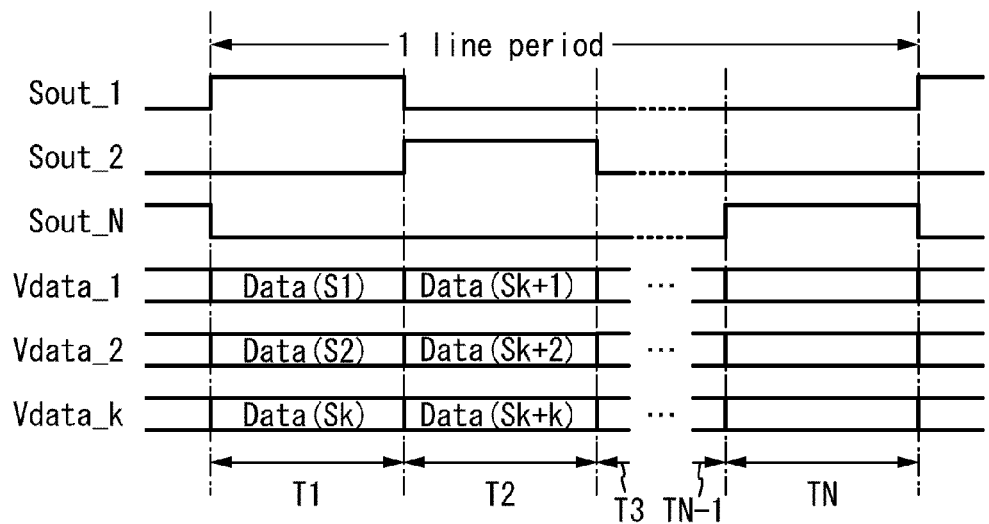

Next, the operation of the signal line driver circuit in FIG. 18A is described with reference to a timing chart in FIG. 18B. FIG. 18B illustrates the timing chart of the timing signals Sout_1 to Sout_N which are respectively input to the wirings 5605_1 to 5605_N and video signals Vdata_1 to Vdata_k which are respectively input to the wirings 5604_1 to 5604_$k$ from the shift register 5601, as an example.

Note that one operation period of the signal line driver circuit corresponds to one line period in a display device. In FIG. 18B, the case is illustrated in which one line period is divided into periods T1 to TN. The periods T1 to TN are periods for writing a video signal into one pixel in a selected row.

In the periods T1 to TN, the shift register 5601 sequentially outputs H-level timing signals to the wirings 5605_1 to 5605_N. For example, in the period T1, the shift register 5601 outputs an H level signal to the wiring 5605_1. Then, the transistors 5603_1 to 5603_$k$ included in the switching circuit 5602_1 are turned on, so that the wirings 5604_1 to 5604_$k$ and the signal lines S1 to Sk are brought into conduction. In that case, Data (S1) to Data (Sk) are input to the wirings 5604_1 to 5604_$k$, respectively. The Data (S1) to Data (Sk) are input to pixels in the first to kth columns in the selected row through the transistors 5603_1 to 5603_$k$. Thus, in the periods T1 to TN, video signals are sequentially written to the pixels in the selected row by k columns.

By writing video signals to pixels by a plurality of columns, the number of video signals or the number of wirings can be reduced. Thus, the number of connections with an external circuit such as a controller can be reduced. By writing video signals to pixels of every plurality of columns, writing time can be extended and insufficient writing of video signals can be prevented.

Next, one embodiment of a shift register which is used for a signal line driver circuit or a scan line driver circuit is described with reference to FIGS. 19A and 19B and FIGS. 20A and 20B.

Figure 19A:
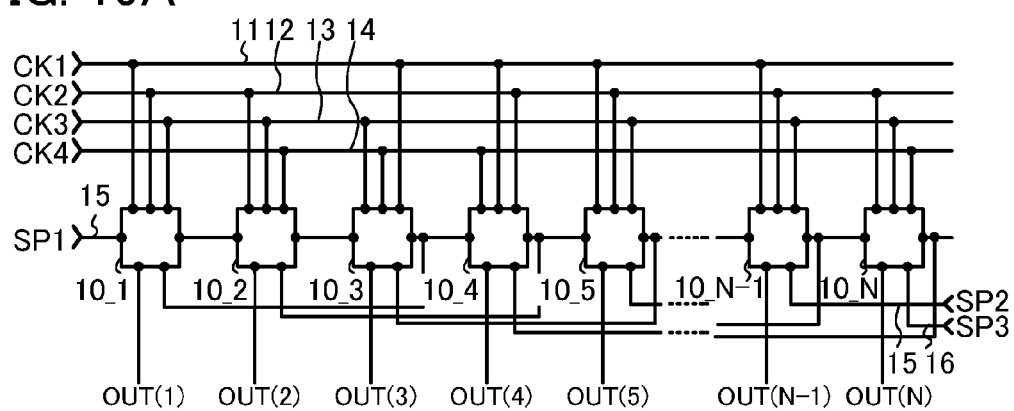
FIGS. 19A and 19B are circuit diagrams each illustrating a structure of a shift register.

The shift register includes first to Nth pulse output circuits 10_1 to 10_N (N is a natural number of 3 or more) (see FIG. 19A). A first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) from a fifth wiring 15 is input to the first pulse output circuit 10_1. Further, a signal from the pulse output circuit 10_(n−1) of the previous stage (referred to as a previous stage signal OUT (n−1)) (n is a natural number of 2 or more) is input to the nth pulse output circuit 10_n (n is a natural number of 2 or more and N or less) in a second or subsequent stage. A signal from the third pulse output circuit 10_3 which is two stages after the first pulse output circuit 10_1 is input to the first pulse output circuit 10_1. In a similar way, a signal from the (n+2)th pulse output circuit 10_(n+2) which is two stages after the nth pulse output circuit 10_n (referred to as the subsequent stage signal OUT(n+2)) is input to the nth pulse output circuit 10_n in the second stage or subsequent stage. Thus, the pulse output circuits of the respective stages output first output signals (OUT(1)(SR) to OUT(N)(SR)) to be input to the pulse output circuit of the subsequent stage and/or to the pulse output circuit of the stage before the previous stage, and second output signals (OUT(1) to OUT(N)) to be input to another circuit or the like. Note that as illustrated in FIG. 19A, a subsequent stage signal OUT(n+2) is not input to the last two stages of the shift register; therefore, as an example, a second start pulse SP2 and a third start pulse SP3 may be input thereto, respectively.

Note that the clock signal (CK) is a signal which alternates between an H level and an L level (low level voltage) at regular intervals. The first to fourth clock signals (CK1) to (CK4) are delayed by ¼ period sequentially. In this embodiment, by using the first to fourth clock signals (CK1) to (CK4), control or the like of driving of a pulse output circuit is performed.

A first input terminal 21, a second input terminal 22, and a third input terminal 23 are electrically connected to any of the first to fourth wirings 11 to 14. For example, in FIG. 19A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 102 is electrically connected to the third wiring 13, and the third input terminal 23 of the second pulse output circuit 102 is electrically connected to the fourth wiring 14.

Figure 19B:
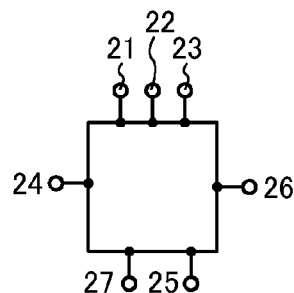

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 19B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent stage signal OUT(3) is input to the fifth input terminal 25; the first output signal OUT(1)(SR) is output from the first output terminal 26; and the second output signal OUT (1) is output from the second output terminal 27.

Next, an example of a specific circuit structure of a pulse output circuit will be described with reference to FIG. 20A.

Figure 20A:
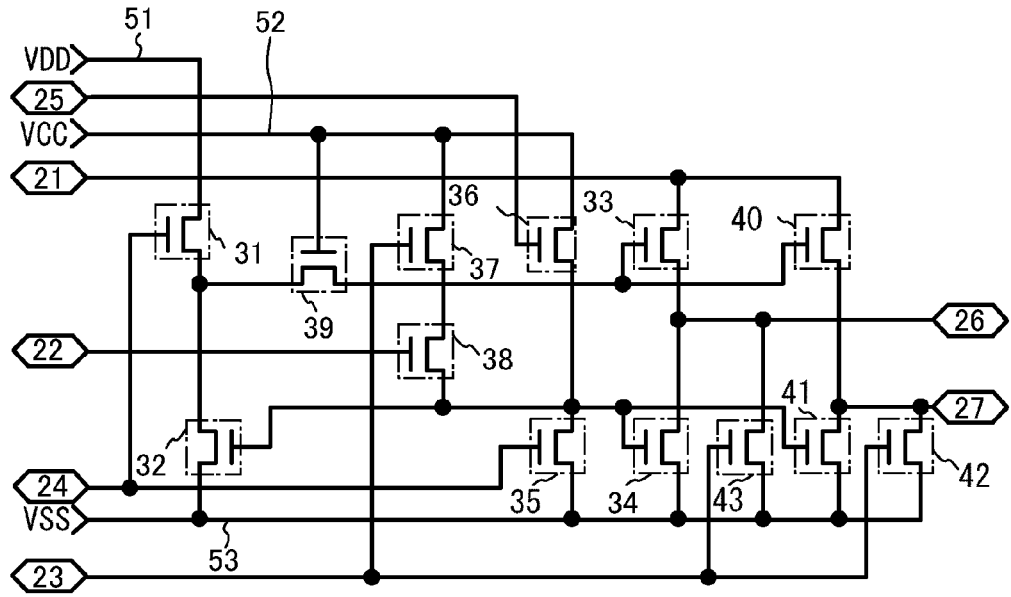
FIG. 20A is a circuit view of a shift register and FIG. 20B is a timing chart illustrating operations of the shift register.

Pulse output circuits each include first to thirteenth transistors 31 to 43 (see FIG. 20A). Signals or power supply potentials are supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the above-described first to fifth input terminals 21 to 25, the first output terminal 26, and the second output terminal 27. The relation of the power supply potentials of the power supply lines in FIG. 20A is as follows: the first power supply potential VDD is higher than or equal to the second power supply potential VCC, and the second power supply potential VCC is higher than the third power supply potential VSS. The first to fourth clock signals (CK1) to (CK4) are signals which become H-level signals and L-level signals repeatedly at regular intervals. The potential is VDD when the clock signal is at the H level, and the potential is VSS when the clock signal is at the L level. By making the first high power supply potential VDD of the power supply line 51 higher than the second high power supply potential VCC of the power supply line 52, a potential applied to a gate electrode of a transistor can be lowered, shift in the threshold voltage of the transistor can be reduced, and deterioration of the transistor can be suppressed without an adverse effect on the operation of the transistor.

In FIG. 20A, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode of the seventh transistor 37.

In FIG. 20A, a connection point of the gate electrode of the third transistor 33, the gate electrode of the tenth transistor 40, and the second terminal of the ninth transistor 39 is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 20A).

Figure 20B:
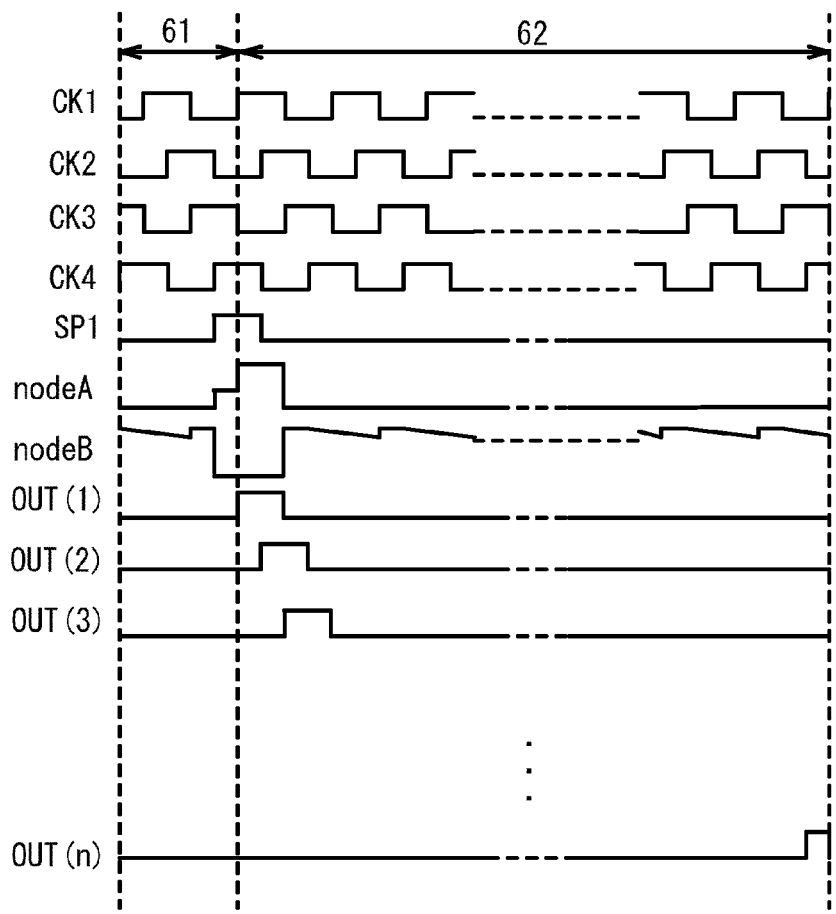

FIG. 20B illustrates a timing chart of the shift register including a plurality of pulse output circuits illustrated in FIG. 20A.

Note that the providing of the ninth transistor 39 in which the second power supply potential VCC is applied to the gate electrode as illustrated in FIG. 20A has the following advantages before and after bootstrap operation.

Without the ninth transistor 39 in which the second high power supply potential VCC is applied to the gate electrode, if a potential of the node A is raised by the bootstrap operation, a potential of the source electrode which is the second terminal of the first transistor 31 rises to a value higher than the first power supply potential VDD. Then, the first terminal of the first transistor 31, namely the power supply line 51, becomes to serve as the source electrode thereof. Consequently, in the first transistor 31, high bias voltage is applied and thus significant stress is applied between the gate electrode and the source electrode and between the gate electrode and the drain electrode, which might cause deterioration of the transistor. By providing of the ninth transistor 39 in which the second power supply potential VCC is applied to the gate electrode, the potential of the node A is raised by the bootstrap operation, but at the same time, an increase in the potential of the second terminal of the first transistor 31 can be prevented. In other words, the placement of the ninth transistor 39 can lower the level of negative bias voltage applied between the gate electrode and the source electrode of the first transistor 31. Accordingly, with a circuit structure in this embodiment, negative bias voltage applied between the gate electrode and the source electrode of the first transistor 31 can be lowered, so that deterioration of the first transistor 31, which is due to stress, can be further restrained.

Note that the ninth transistor 39 is provided so as to be connected between the second terminal of the first transistor 31 and the gate electrode of the third transistor 33 through the first terminal and the second terminal thereof. Note that when the shift register including a plurality of pulse output circuits in this embodiment is included in a signal line driver circuit having a larger number of stages than a scan line driver circuit, the ninth transistor 39 may be omitted, which is advantageous in that the number of transistors is reduced.

Note that an oxide semiconductor is used for active layers of the first to thirteenth transistors 31 to 43; thus, the off-state current of the transistors can be reduced, the on-state current and field effect mobility can be increased, and the degree of deterioration of the transistors can be reduced; thus, a malfunction in a circuit can be reduced. Further, the degree of deterioration of the transistor formed using an oxide semiconductor by application of a high potential to a gate electrode is smaller than that of a transistor formed using amorphous silicon. Therefore, even when the first power supply potential VDD is supplied to a power supply line to which the second power supply potential VCC is supplied, similar operation can be performed, and the number of power supply lines which are provided in a circuit can be reduced, so that the circuit can be miniaturized.

Note that a similar function is obtained even when the connection relation is changed so that a clock signal that is supplied to the gate electrode of the seventh transistor 37 from the third input terminal 23 and a clock signal that is supplied to the gate electrode of the eighth transistor 38 from the second input terminal 22 may be supplied from the second input terminal 22 and the third input terminal 23, respectively. Note that in the shift register shown in FIG. 20A, if the state where the seventh transistor 37 and the eighth transistor 38 are both on is changed through the state where the seventh transistor 37 is off and the eighth transistor 38 is on to the state where the seventh transistor 37 is off and the eighth transistor 38 is off, potential reduction at the node B, which is caused by potential reduction of the second input terminal 22 and the third input terminal 23, is caused twice due to the potential reduction of the gate electrode of the seventh transistor 37 and the potential reduction of the gate electrode of the eighth transistor 38. On the other hand, in the case where a state of the seventh transistor 37 and the eighth transistor 38 in the shift register illustrated in FIG. 20A is changed in such a manner that both the seventh transistor 37 and the eighth transistor 38 are on, then the seventh transistor 37 is on and the eighth transistor 38 is off, and then the seventh transistor 37 and the eighth transistor 38 are off, the potential reduction at the node B, which is caused by the potential reduction of the second input terminal 22 and the third input terminal 23, is caused only once by the potential reduction of the gate electrode of the eighth transistor 38. Consequently, the connection relation, in which the clock signal CK3 is supplied from the third input terminal 23 to the gate electrode of the seventh transistor 37 and the clock signal CK2 is supplied from the second input terminal 22 to the gate electrode of the eighth transistor 38, is preferable. That is because the number of times of the change in the potential of the node B can be reduced, and the noise can be decreased.

In this way, in a period during which the potentials of the first output terminal 26 and the second output terminal 27 are held at the L level, the H level signal is regularly supplied to the node B; therefore, malfunction of a pulse output circuit can be suppressed.

This embodiment can be implemented by being combined as appropriate with any of the above-described embodiments.

Embodiment 7

In a liquid crystal display device according to one embodiment of the present invention, a highly reliable thin film transistor with low off-state current is used; therefore, high contrast and high reliability are obtained. In this embodiment, a structure of the liquid crystal display device according to one embodiment of the present invention will be described.

Figure 21:
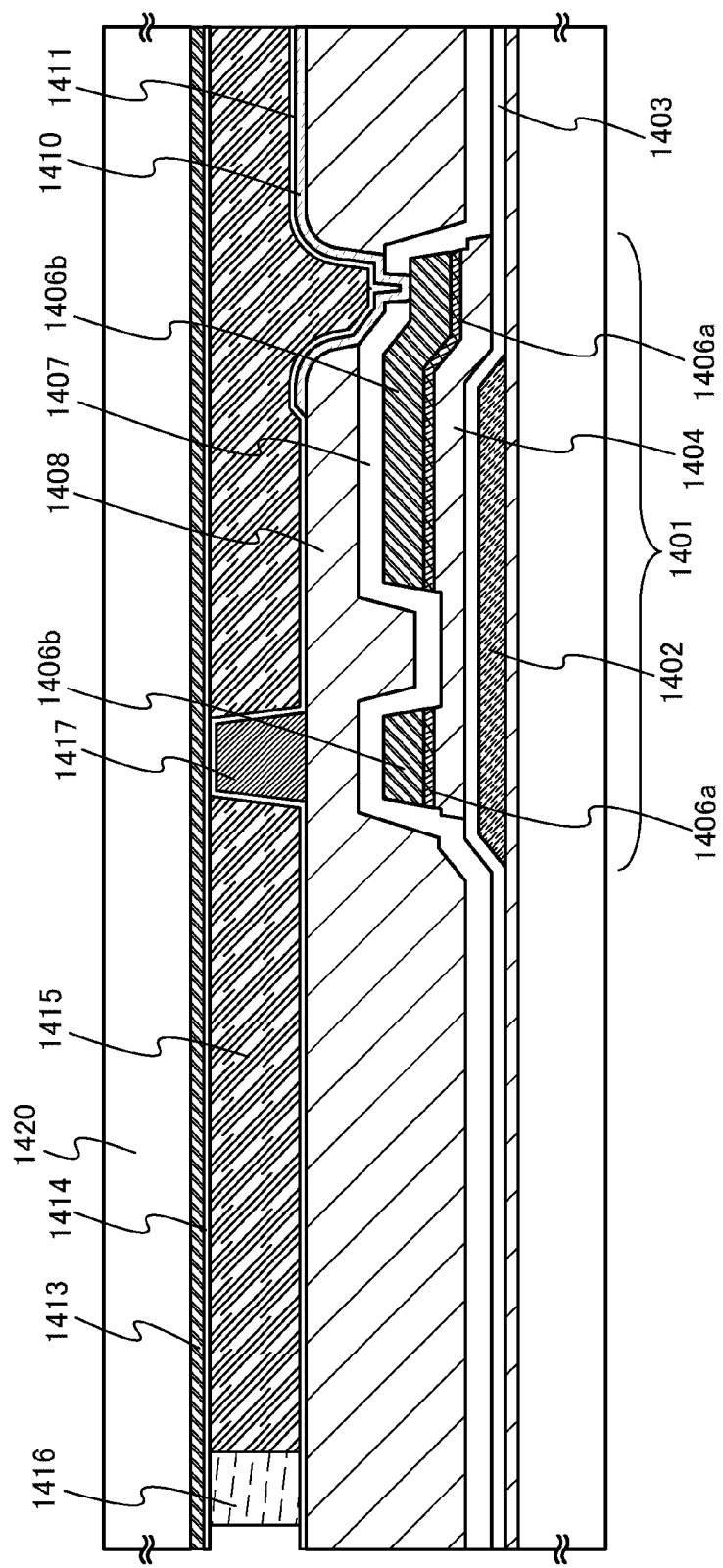
FIG. 21 is a cross-sectional view of a liquid crystal display device.

FIG. 21 is a cross-sectional view of a pixel of a liquid crystal display device according to one embodiment of the present invention, as an example. A thin film transistor 1401 illustrated in FIG. 21 has a gate electrode 1402 formed over an insulating surface, a gate insulating film 1403 over the gate electrode, an oxide semiconductor film 1404 which is over the gate insulating film 1403 and which overlaps with the gate electrode 1402, and a pair of conductive films 1406*a* and 1406*b* which function as a source electrode and a drain electrode and which are sequentially stacked over the oxide semiconductor film 1404. Further, the thin film transistor 1401 may include an insulating film 1407 formed over the oxide semiconductor film 1404 as a component. The insulating film 1407 is formed so as to cover the gate electrode 1402, the gate insulating film 1403, the oxide semiconductor film 1404, and the conductive films 1406*a* and 1406*b*.

Note that in this embodiment, the source electrode and the drain electrode which are formed in accordance with the manufacturing method described in Embodiment 1 are given as an example; however, the source electrode and the drain electrode which are formed in accordance with the manufacturing method described in any of Embodiments 2 to 4 may be used.

An insulating film 1408 is formed over the insulating film 1407. Part of the insulating film 1407 and the insulating film 1408 is provided with an opening, and a pixel electrode 1410 is formed so as to be in contact with one of the conductive films 1406*b* in the opening.

Further, a spacer 1417 for controlling a cell gap of a liquid crystal element is formed over the insulating film 1408. An insulating film is etched to have a desired shape, so that the spacer 1417 can be formed. A cell gap may also be controlled by dispersing a filler over the insulating film 1408.

An alignment film 1411 is formed over the pixel electrode 1410. Further, a counter electrode 1413 is provided in a position opposed to the pixel electrode 1410, and an alignment film 1414 is formed on the side of the counter electrode 1413 which is close to the pixel electrode 1410. The alignment film 1411 and the alignment film 1414 can be formed using an organic resin such as polyimide or polyvinyl alcohol. Alignment treatment such as rubbing is performed on their surfaces in order to align liquid crystal molecules in certain direction. Rubbing can be performed by rolling a roller wrapped with cloth of nylon or the like while applying pressure on the alignment film so that the surface of the alignment film is rubbed in certain direction. Note that it is also possible to form the alignment films 1411 and 1414 that have alignment characteristics by using an inorganic material such as silicon oxide by an evaporation method, without alignment process.

Furthermore, a liquid crystal 1415 is provided in a region which is surrounded by a sealant 1416 between the pixel electrode 1410 and the counter electrode 1413. Injection of the liquid crystal 1415 may be performed by a dispenser method (dripping method) or a dipping method (pumping method). Note that a filler may be mixed in the sealant 1416.

The liquid crystal element formed using the pixel electrode 1410, the counter electrode 1413, and the liquid crystal 1415 may overlap with a color filter through which light in a particular wavelength region can pass. The color filter may be formed on a substrate (counter substrate) 1420 provided with the counter electrode 1413. The color filter can be selectively formed by photolithography after application of an organic resin such as an acrylic-based resin in which a pigment is dispersed on the substrate 1420. Alternatively, the color filter can be selectively formed by etching after application of a polyimide-based resin in which a pigment is dispersed on the substrate 1420. Further alternatively, the color filter can be selectively formed by a droplet discharge method such as an ink jet method.

A light-blocking film which can block light may be formed in the pixels so that disclination due to variations between the pixels in the alignment of the liquid crystal 1415 is prevented from seeing. The light-blocking film can be formed using an organic resin containing a black pigment such as a carbon black or titanium lower oxide. Alternatively, a film of chromium can be used for the light-blocking film.

The pixel electrode 1410 and the counter electrode 1413 can be formed using a transparent conductive material such as indium tin oxide including silicon oxide (ITSO), indium tin oxide (ITO), zinc oxide (ZnO), indium zinc oxide (IZO), or gallium-doped zinc oxide (GZO), for example. Note that this embodiment describes an example of manufacturing a transmissive type liquid crystal element by using a light-transmitting conductive film for the pixel electrode 1410 and the counter electrode 1413; however, one embodiment of the present invention is not limited to this structure. The liquid crystal display device according to one embodiment of the present invention may be a transreflective liquid crystal display device or a reflective liquid crystal display device.

Although a liquid crystal display device of a TN (twisted nematic) mode is described in this embodiment, the thin film transistor of the present invention can be used for other liquid crystal display devices of a VA (vertical alignment) mode, an OCB (optically compensated birefringence) mode, an IPS (in-plane-switching) mode, and the like.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, a liquid crystal composition containing a chiral agent at 5 wt % or more so as to improve the temperature range is used for the liquid crystal 1415. The liquid crystal composition including liquid crystal exhibiting a blue phase and a chiral agent has a short response time of greater than or equal to 10 μsec and less than or equal to 100 μsec and is optically isotropic; therefore, alignment treatment is not necessary and viewing angle dependence is small.

Figure 22:
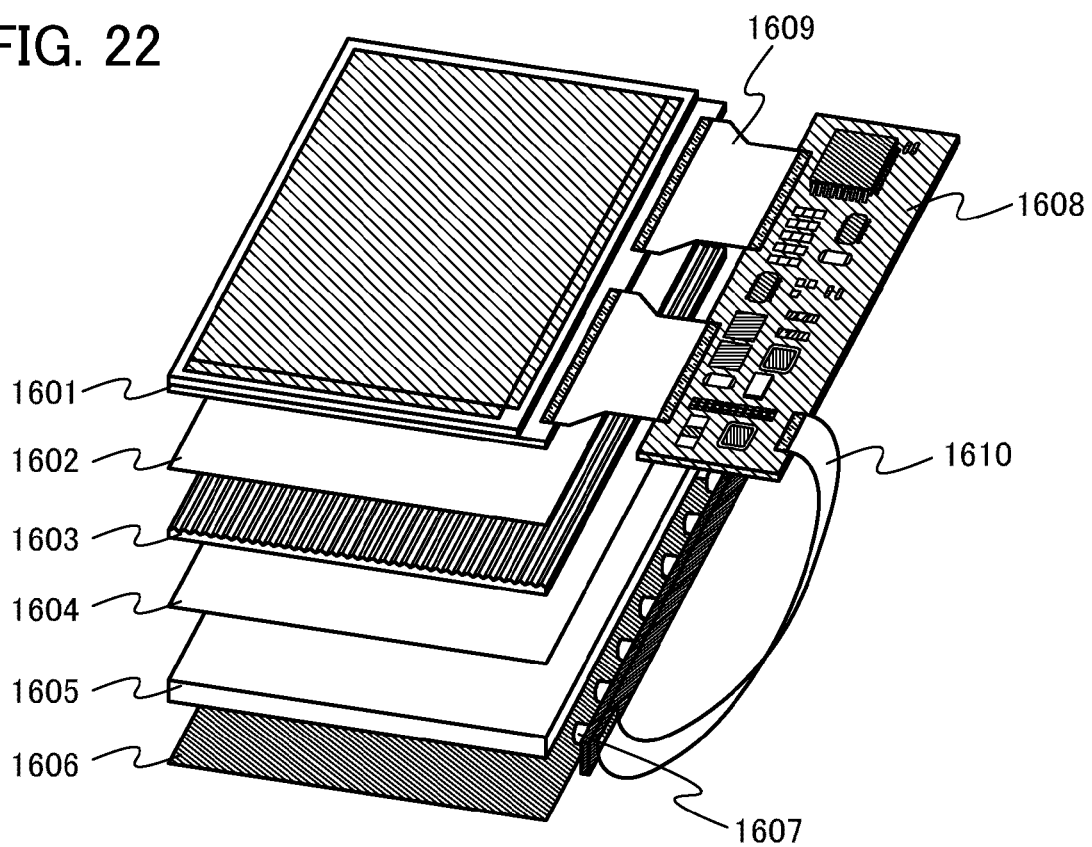
FIG. 22 is a cross-sectional view of a light-emitting device.

FIG. 22 illustrates an example of a perspective view showing a structure of a liquid crystal display device of the present invention. The liquid crystal display device illustrated in FIG. 22 is provided with a liquid crystal panel 1601 in which a liquid crystal element is formed between a pair of substrates; a first diffusion plate 1602; a prism sheet 1603; a second diffusion plate 1604; a light guide plate 1605; a reflection plate 1606; a light source 1607; and a circuit substrate 1608.

The liquid crystal panel 1601, the first diffusion plate 1602, the prism sheet 1603, the second diffusion plate 1604, the light guide plate 1605, and the reflection plate 1606 are sequentially stacked. The light source 1607 is provided at an end portion of the light guide plate 1605. The liquid crystal panel 1601 is uniformly irradiated with light from the light source 1607 which is diffused inside the light guide plate 1605, due to the first diffusion plate 1602, the prism sheet 1603, and the second diffusion plate 1604.

Although the first diffusion plate 1602 and the second diffusion plate 1604 are used in this embodiment, the number of diffusion plates is not limited thereto. The number of diffusion plates may be one, or may be three or more. It is acceptable as long as the diffusion plate is provided between the light guide plate 1605 and the liquid crystal panel 1601. Therefore, a diffusion plate may be provided only on the side closer to the liquid crystal panel 1601 than the prism sheet 1603, or may be provided only on the side closer to the light guide plate 1605 than the prism sheet 1603.

Further, the cross section of the prism sheet 1603 is not limited to a sawtooth-shape illustrated in FIG. 22. The prism sheet 1603 may have a shape with which light from the light guide plate 1605 can be concentrated on the liquid crystal panel 1601 side.

The circuit substrate 1608 is provided with a circuit which generates various kinds of signals input to the liquid crystal panel 1601, a circuit which processes the signals, or the like. In FIG. 22, the circuit substrate 1608 and the liquid crystal panel 1601 are connected to each other via a flexible printed circuit (FPC) 1609. Note that the circuit may be connected to the liquid crystal panel 1601 by using a chip on glass (COG) method, or part of the circuit may be connected to the FPC 1609 by using a chip on film (COF) method.

FIG. 22 illustrates an example in which the circuit substrate 1608 is provided with a control circuit which controls driving of the light source 1607 and the control circuit and the light source 1607 are connected to each other via an FPC 1610. Note that the above-described control circuit may be formed over the liquid crystal panel 1601. In that case, the liquid crystal panel 1601 and the light source 1607 are connected to each other via an FPC or the like.

Note that although FIG. 22 illustrates an edge-light type light source in which the light source 1607 is provided at an end portion of the liquid crystal panel 1601, a liquid crystal display device of the present invention may be a direct-below type in which the light source 1607 is provided directly below the liquid crystal panel 1601.

This embodiment can be implemented by being combined as appropriate with any of the above-described embodiments.

Embodiment 8

In this embodiment, a structure of a light-emitting device including the thin film transistor according to one embodiment of the present invention for a pixel will be described. In this embodiment, a cross-sectional structure of a pixel when a transistor for driving a light-emitting element is an n-channel transistor is described with reference to FIGS. 23A to 23C. Although the case where a first electrode is a cathode and a second electrode is an anode is described in FIGS. 23A to 23C, the first electrode may be an anode and the second electrode may be a cathode as well.

Figure 23A:
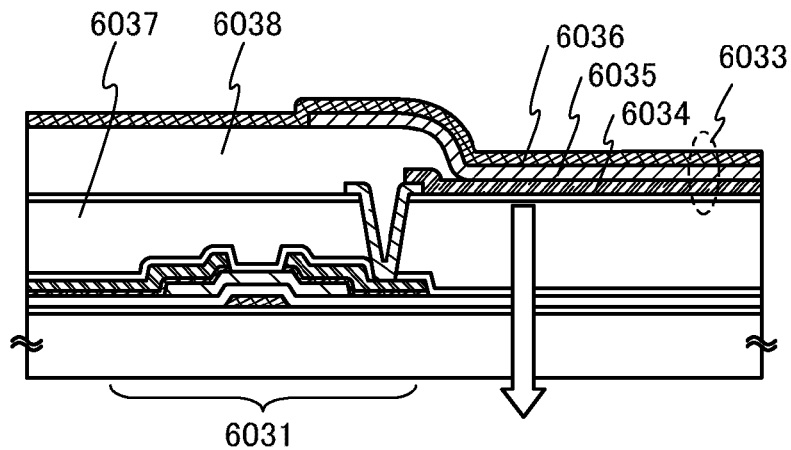
FIGS. 23A to 23C each illustrate a structure of a liquid crystal display device module.

FIG. 23A is the cross-sectional view of a pixel in the case where an n-channel transistor is employed as a transistor 6031, and light emitted from a light-emitting element 6033 is extracted from a first electrode 6034. The transistor 6031 is covered with an insulating film 6037, and over the insulating film 6037, a partition 6038 having an opening is formed. In the opening of the partition 6038, the first electrode 6034 is partly exposed, and the first electrode 6034, an electroluminescent layer 6035, and a second electrode 6036 are sequentially stacked in the opening.

The first electrode 6034 is formed using a material or to a thickness such that light transmits therethrough, and can be formed using a material having a low work function of a metal, an alloy, an electrically conductive compound, a mixture thereof, or the like. Specifically, an alkali metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron injection layer is provided, another conductive layer such as an aluminum layer may be used as well. Then, the first electrode 6034 is formed to a thickness such that light transmits therethrough (preferably, approximately 5 nm to 30 nm). Furthermore, the sheet resistance of the first electrode 6034 may be suppressed by formation of a light-transmitting conductive layer of a light-transmitting oxide conductive material so as to be in contact with and over or under the above-described conductive layer with a thickness such that light transmits therethrough. Alternatively, the first electrode 6034 may be formed using only a conductive layer of another light-transmitting oxide conductive material such as indium tin oxide (ITO), zinc oxide (ZnO), indium zinc oxide (IZO), or gallium-doped zinc oxide (GZO). Furthermore, a mixture in which zinc oxide (ZnO) is mixed at 2% to 20% in indium tin oxide including ITO and silicon oxide (hereinafter referred to as ITSO) or in indium oxide including silicon oxide may be used as well. In the case of using the light-transmitting oxide conductive material, it is preferable to provide an electron injection layer in the electroluminescent layer 6035.

The second electrode 6036 is formed using a material and to a thickness such that light is reflected or blocked, and can be formed using a material suitable for being used as an anode. For example, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6036.

The electroluminescent layer 6035 is formed using a single layer or a plurality of layers. When the electroluminescent layer 6035 is formed with a plurality of layers, these layers can be classified into a hole injection layer, a hole transport layer, a light-emitting layer, an electron transport layer, an electron injection layer, and the like in view of the carrier transport property. In the case where the electroluminescent layer 6035 includes at least one of a hole injection layer, a hole transport layer, an electron transport layer, and an electron injection layer in addition to a light-emitting layer, the electron injection layer, the electron transport layer, the light-emitting layer, the hole transport layer, and the hole injection layer are sequentially stacked over the first electrode 6034. Note that the boundary between each layer is not necessarily clear, and there may be the case where the boundary is unclear since a material for forming each layer is mixed with each other. Each layer may be formed with an organic material or an inorganic material. As the organic material, any of a high molecular weight material, a medium molecular weight material, and a low molecular weight material may be used. Note that the medium molecular weight material corresponds to a low polymer in which the number of repetitions of a structural unit (the degree of polymerization) is approximately 2 to 20. A distinction between a hole injection layer and a hole transport layer is not always distinct, which is the same as in the sense that a hole transport property (hole mobility) is a particularly important characteristic. A layer being in contact with the anode is referred to as a hole injection layer and a layer being in contact with the hole injection layer is referred to as a hole transport layer for convenience. The same is also true for the electron transport layer and the electron injection layer; a layer being in contact with the cathode is referred to as an electron injection layer and a layer being in contact with the electron injection layer is referred to as an electron transport layer. In some cases, the light-emitting layer also functions as the electron transport layer, and it is therefore referred to as a light-emitting electron transport layer, too.

In the case of the pixel illustrated in FIG. 23A, light emitted from the light-emitting element 6033 can be extracted from the first electrode 6034 as shown by a hollow arrow.

Figure 23B:
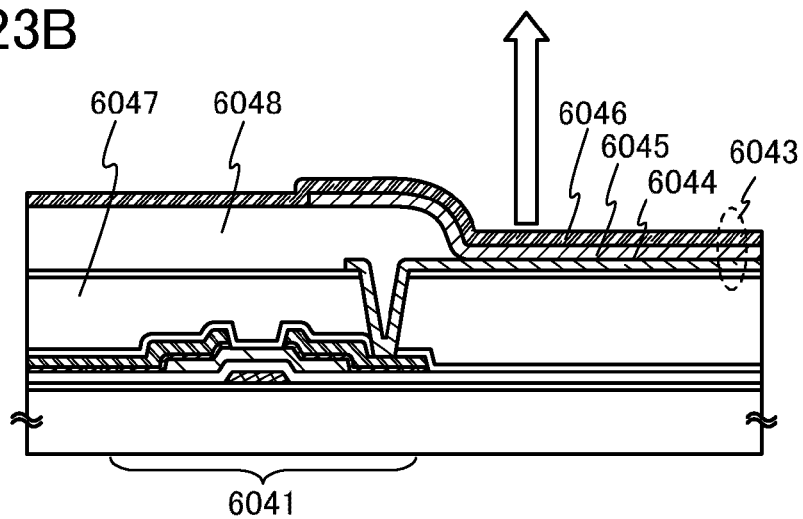

Next, a cross-sectional view of a pixel when a transistor 6041 is an n-channel transistor, and light emitted from a light-emitting element 6043 is extracted from a second electrode 6046 side is illustrated in FIG. 23B. The transistor 6041 is covered with an insulating film 6047, and over the insulating film 6047, a partition 6048 having an opening is formed. In the opening of the partition 6048, a first electrode 6044 is partly exposed, and the first electrode 6044, an electroluminescent layer 6045, and the second electrode 6046 are sequentially stacked in the opening.

The first electrode 6044 is formed using a material and to a thickness such that light is reflected or blocked, and can be formed using a material having a low work function of a metal, an alloy, an electrically conductive compound, a mixture thereof, or the like. Specifically, an alkali metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron injection layer is provided, another conductive layer such as an aluminum layer may be used as well.

The second electrode 6046 is formed using a material or to a thickness such that light transmits therethrough, and formed using a material suitable for being used as an anode. For example, another light-transmitting oxide conductive material such as indium tin oxide (ITO), zinc oxide (ZnO), indium zinc oxide (IZO), or gallium-doped zinc oxide (GZO) can be used for the second electrode 6046. Further, a mixture in which zinc oxide (ZnO) is mixed at 2% to 20% in indium tin oxide including ITO and silicon oxide (hereinafter referred to as ITSO) or in indium oxide including silicon oxide may be used as well for the second electrode 6046. Furthermore, other than the above-described light-transmitting oxide conductive material, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6046. However, in the case of using a material other than the light-transmitting oxide conductive material, the second electrode 6046 is formed to have a thickness such that light transmits therethrough (preferably, approximately 5 nm to 30 nm).

The electroluminescent layer 6045 can be formed in a manner similar to that of the electroluminescent layer 6035 of FIG. 23A.

In the case of the pixel illustrated in FIG. 23B, light emitted from the light-emitting element 6043 can be extracted from the second electrode 6046 side as shown by a hollow arrow.

Figure 23C:
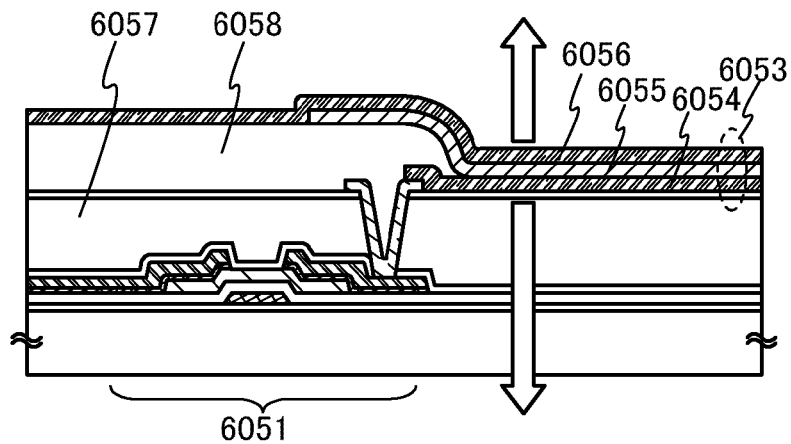

Next, a cross-sectional view of a pixel when a transistor 6051 is an n-channel transistor, and light emitted from a light-emitting element 6053 is extracted from a first electrode 6054 side and a second electrode 6056 side is illustrated in FIG. 23C. The transistor 6051 is covered with an insulating film 6057, and over the insulating film 6057, a partition 6058 having an opening is formed. In the opening of the partition 6058, the first electrode 6054 is partly exposed, and the first electrode 6054, an electroluminescent layer 6055, and the second electrode 6056 are sequentially stacked in the opening.

The first electrode 6054 can be formed in a manner similar to that of the first electrode 6034 in FIG. 23A. The second electrode 6056 can be formed in a manner similar to that of the second electrode 6046 of FIG. 23B. The electroluminescent layer 6055 can be formed in a manner similar to that of the electroluminescent layer 6035 of FIG. 23A.

In the case of the pixel illustrated in FIG. 23C, light emitted from the light-emitting element 6053 can be extracted from both sides of the first electrode 6054 and the second electrode 6056 as shown by hollow arrows.

This embodiment can be implemented by being combined as appropriate with any of the above-described embodiments.

Example 1

A semiconductor device according to one embodiment of the present invention is used, so that a highly reliable electronic device and an electronic device with low power consumption can be provided. In addition, a semiconductor display device according to one embodiment of the present invention is used, so that a highly reliable electronic device, an electronic device with high visibility, and an electronic device with low power consumption can be provided. In particular, in the case where a portable electronic device which has difficulty in continuously receiving power, a semiconductor device or a semiconductor display device with low power consumption according to one embodiment of the present invention is added to the component of the device, whereby an advantage in increasing the continuous duty period can be obtained. Further, by use of a transistor with low off-state current, redundant circuit design which is needed to cover a failure caused by high off-state current is unnecessary; therefore, the density of an integrated circuit used for the semiconductor device can be increased, and a higher performance semiconductor device can be formed.

Moreover, with the semiconductor device of the present invention, the heat treatment temperature in the manufacturing process can be suppressed; therefore, a highly reliable thin film transistor with excellent characteristics can be formed even when the thin film transistor is formed over a substrate formed using a flexible synthetic resin of which heat resistance is lower than that of glass, such as plastic. Accordingly, with the use of the manufacturing method according to one embodiment of the present invention, a highly reliable, lightweight, and flexible semiconductor device can be provided. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, and the like.

The semiconductor device according to one embodiment of the present invention can be used for display devices, laptops, or image reproducing devices provided with recording media (typically, devices which reproduce the content of recording media such as digital versatile discs (DVDs) and have displays for displaying the reproduced images). Other than the above, as an electronic device which can use the semiconductor device according to one embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 24A to 24F illustrate specific examples of these electronic devices.

Figure 24A:
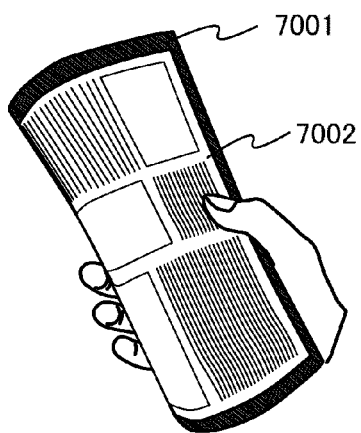
FIGS. 24A to 24F are views each illustrating an electronic device including a semiconductor device.

FIG. 24A illustrates an e-book reader including a housing 7001, a display portion 7002, and the like. The semiconductor display device according to one embodiment of the present invention can be used for the display portion 7002, so that a highly reliable e-book reader, an e-book reader capable of displaying an image with high visibility, and an e-book reader with low power consumption can be provided. The semiconductor device according to one embodiment of the present invention can be used for an integrated circuit for controlling driving of the e-book reader, so that a highly reliable e-book reader, an e-book reader with low power consumption, and a higher performance e-book reader can be provided. When a flexible substrate is used, a semiconductor device and a semiconductor display device can have flexibility, whereby a user-friendly e-book reader which is flexible and lightweight can be provided.

Figure 24B:
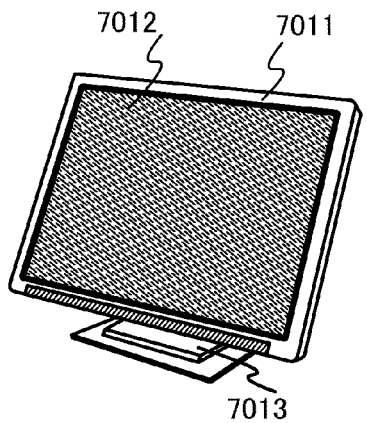

FIG. 24B illustrates a display device including a housing 7011, a display portion 7012, a supporting base 7013, and the like. The semiconductor display device according to one embodiment of the present invention can be used for the display portion 7012, so that a highly reliable display device, a display device capable of displaying an image with high visibility, and a display device with low power consumption can be provided. The semiconductor device according to one embodiment of the present invention can be used for an integrated circuit for controlling driving of the display device, so that a highly reliable display device, a display device with low power consumption, and a higher performance display device can be provided. Note that a display device includes all display devices for displaying information, such as display devices for personal computers, for receiving television broadcast, and for displaying advertisement, in its category.

Figure 24C:
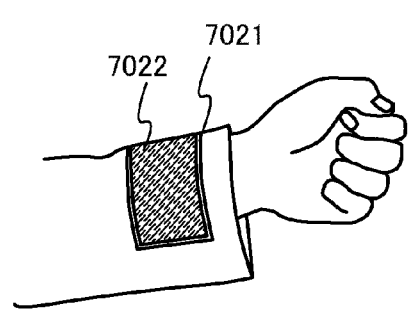

FIG. 24C illustrates a display device including a housing 7021, a display portion 7022, and the like. The semiconductor display device according to one embodiment of the present invention can be used for the display portion 7022, so that a highly reliable display device, a display device capable of displaying an image with high visibility, and a display device with low power consumption can be provided. The semiconductor device according to one embodiment of the present invention can be used for an integrated circuit for controlling driving of the display device, so that a highly reliable display device, a display device with low power consumption, and a higher performance display device can be provided. When a flexible substrate is used, a semiconductor device and a semiconductor display device can have flexibility, whereby a user-friendly display device which is flexible and lightweight can be provided. Accordingly, as illustrated in FIG. 24C, a display device can be used while being fixed to fabric or the like, and an application range of the display device is dramatically widened.

Figure 24D:
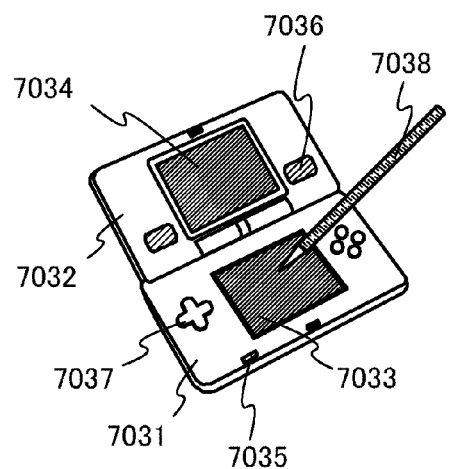

FIG. 24D illustrates a portable game machine including a housing 7031, a housing 7032, a display portion 7033, a display portion 7034, a microphone 7035, speakers 7036, an operation key 7037, a stylus 7038, and the like. The semiconductor display device according to one embodiment of the present invention can be used for the display portion 7033 and the display portion 7034, so that a highly reliable portable game machine, a portable game machine capable of displaying an image with high visibility, and a portable game machine with low power consumption can be provided. The semiconductor device according to one embodiment of the present invention can be used for an integrated circuit for controlling driving of the portable game machine, so that a highly reliable portable game machine, a portable game machine with low power consumption, and a higher performance portable game machine can be provided. Although the portable game machine illustrated in FIG. 24D includes two display portions 7033 and 7034, the number of display portions included in the portable game machine is not limited to two.

Figure 24E:
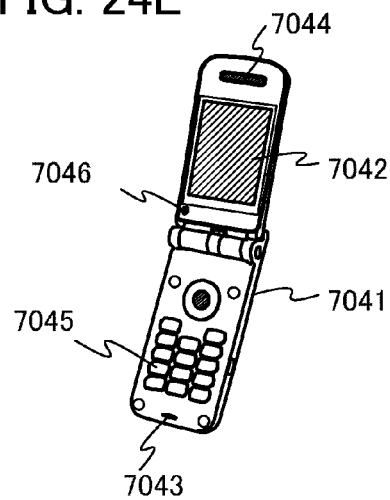

FIG. 24E illustrates a mobile phone including a housing 7041, a display portion 7042, an audio input portion 7043, an audio output portion 7044, operation keys 7045, a light-receiving portion 7046, and the like. Light received in the light-receiving portion 7046 is converted into electrical signals, whereby an outside image can be downloaded. The semiconductor display device according to one embodiment of the present invention can be used for the display portion 7042, so that a highly reliable mobile phone, a mobile phone capable of displaying an image with high visibility, and a mobile phone with low power consumption can be provided. The semiconductor device according to one embodiment of the present invention can be used for an integrated circuit for controlling driving of the mobile phone, so that a highly reliable mobile phone, a mobile phone with low power consumption, and a higher performance mobile phone can be provided.

Figure 24F:
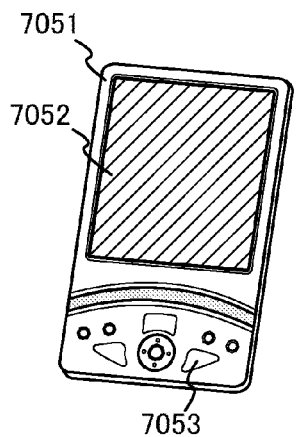

FIG. 24F illustrates a portable information terminal including a housing 7051, a display portion 7052, operation keys 7053, and the like. A modem may be incorporated in the housing 7051 of the portable information terminal illustrated in FIG. 24F. The semiconductor display device according to one embodiment of the present invention can be used for the display portion 7052, so that a highly reliable portable information terminal, a portable information terminal capable of displaying an image with high visibility, and a portable information terminal with low power consumption can be provided. The semiconductor device according to one embodiment of the present invention can be used for an integrated circuit for controlling driving of the portable information terminal, so that a highly reliable portable information terminal, a portable information terminal with low power consumption, and a higher performance portable information terminal can be provided.

This example can be implemented by being combined as appropriate with any of the above-described embodiments.

This application is based on Japanese Patent Application serial no. 2009-259859 filed with Japan Patent Office on Nov. 13, 2009, the entire contents of which are hereby incorporated by reference.

The invention claimed is:

1. A semiconductor device comprising:
   a gate electrode;
   an oxide semiconductor film adjacent to the gate electrode with a gate insulating film interposed therebetween; and
   a source electrode and a drain electrode which are in contact with one of a top surface of the oxide semiconductor film and a bottom surface of the oxide semiconductor film, wherein the source electrode and the drain electrode include a metal with a lower electronegativity than an electronegativity of hydrogen, and wherein a concentration of hydrogen in the source electrode and the drain electrode is greater than or equal to 1.2 times as high as a concentration of hydrogen in the oxide semiconductor film.

2. The semiconductor device according to claim 1, wherein the metal is one selected from the group consisting of magnesium, yttrium, and aluminum.

3. The semiconductor device according to claim 1, wherein the metal is one selected from the group consisting of titanium, molybdenum, and tungsten.

4. The semiconductor device according to claim 1, further comprising:

a first insulating film over the oxide semiconductor film, the source electrode, and the drain electrode; and a second insulating film over the first insulating film, wherein the first insulating film includes one of silicon oxide and silicon oxynitride, and wherein the second insulating film includes one of silicon nitride, silicon nitride oxide, aluminum nitride, and aluminum nitride oxide.

5. The semiconductor device according to claim 1, wherein the gate insulating film includes a first gate insulating film, and a second gate insulating film between the first gate insulating film and the oxide semiconductor film, wherein the first gate insulating film includes one of silicon nitride, silicon nitride oxide, aluminum nitride, and aluminum nitride oxide, and wherein the second gate insulating film includes one of silicon oxide and silicon oxynitride.

6. The semiconductor device according to claim 1, wherein the source electrode and the drain electrode comprise one selected from the group consisting of magnesium, yttrium, aluminum, titanium, molybdenum, and tungsten, and one selected from the group consisting of tantalum, chromium, neodymium, and scandium.

7. The semiconductor device according to claim 1, wherein the oxide semiconductor film is formed over the gate electrode.

8. A semiconductor device comprising:

a gate electrode;

an oxide semiconductor film adjacent to the gate electrode with a gate insulating film interposed therebetween; and a source electrode and a drain electrode, wherein each of the source electrode and the drain electrode includes a first conductive film in contact with one of a top surface of the oxide semiconductor film and a bottom surface of the oxide semiconductor film, and a second conductive film in contact with the first conductive film, wherein the first conductive film includes a metal with a lower electronegativity than an electronegativity of hydrogen, and wherein a concentration of hydrogen in the first conductive film is greater than or equal to 1.2 times as high as a concentration of hydrogen in the oxide semiconductor film.

9. The semiconductor device according to claim 8, wherein the metal is one selected from the group consisting of magnesium, yttrium, and aluminum.

10. The semiconductor device according to claim 8, wherein the metal is one selected from the group consisting of titanium, molybdenum, and tungsten.

11. The semiconductor device according to claim 8, further comprising:

a first insulating film over the oxide semiconductor film, the source electrode, and the drain electrode; and a second insulating film over the first insulating film, wherein the first insulating film includes one of silicon oxide and silicon oxynitride, and wherein the second insulating film includes one of silicon nitride, silicon nitride oxide, aluminum nitride, and aluminum nitride oxide.

12. The semiconductor device according to claim 8, wherein the gate insulating film includes a first gate insulating film, and a second gate insulating film between the first gate insulating film and the oxide semiconductor film, wherein the first gate insulating film includes one of silicon nitride, silicon nitride oxide, aluminum nitride, and aluminum nitride oxide, and wherein the second gate insulating film includes one of silicon oxide and silicon oxynitride.

13. The semiconductor device according to claim 8, wherein the source electrode and the drain electrode comprise one selected from the group consisting of magnesium, yttrium, aluminum, titanium, molybdenum, and tungsten, and one selected from the group consisting of tantalum, chromium, neodymium, and scandium.

14. The semiconductor device according to claim 8, wherein a conductivity of the second conductive film is lower than a conductivity of the first conductive film.

15. The semiconductor device according to claim 8, wherein the oxide semiconductor film is formed over the gate electrode.

16. A semiconductor device comprising:

a gate electrode;

an oxide semiconductor film adjacent to the gate electrode with a gate insulating film interposed therebetween; and a source electrode and a drain electrode which are in contact with one of a to surface of the oxide semiconductor film and a bottom surface of the oxide semiconductor film, wherein the source electrode and the drain electrode include a metal with a lower electronegativity than an electronegativity of hydrogen, and wherein a concentration of hydrogen in the source electrode and the drain electrode is greater than or equal to 5 times as high as a concentration of hydrogen in the oxide semiconductor film.

17. The semiconductor device according to claim 16, wherein the metal is one selected from the group consisting of magnesium, yttrium, and aluminum.

18. The semiconductor device according to claim 16, wherein the metal is one selected from the group consisting of titanium, molybdenum, and tungsten.

19. The semiconductor device according to claim 16, further comprising:

a first insulating film over the oxide semiconductor film, the source electrode, and the drain electrode; and a second insulating film over the first insulating film, wherein the first insulating film includes one of silicon oxide and silicon oxynitride, and wherein the second insulating film includes one of silicon nitride, silicon nitride oxide, aluminum nitride, and aluminum nitride oxide.

20. The semiconductor device according to claim 16,
wherein the gate insulating film includes a first gate insulating film, and a second gate insulating film between the first gate insulating film and the oxide semiconductor film,
wherein the first gate insulating film includes one of silicon nitride, silicon nitride oxide, aluminum nitride, and aluminum nitride oxide, and
wherein the second gate insulating film includes one of silicon oxide and silicon oxynitride.

21. The semiconductor device according to claim 16, wherein the source electrode and the drain electrode comprise one selected from the group consisting of magnesium, yttrium, aluminum, titanium, molybdenum, and tungsten, and one selected from the group consisting of tantalum, chromium, neodymium, and scandium.

22. The semiconductor device according to claim 16, wherein the oxide semiconductor film is formed over the gate electrode.

23. A semiconductor device comprising:
a gate electrode;
an oxide semiconductor film adjacent to the gate electrode with a gate insulating film interposed therebetween; and
a source electrode and a drain electrode,
wherein each of the source electrode and the drain electrode includes a first conductive film in contact with one of a top surface of the oxide semiconductor film and a bottom surface of the oxide semiconductor film, and a second conductive film in contact with the first conductive film,
wherein the first conductive film includes a metal with a lower electronegativity than an electronegativity of hydrogen, and
wherein a concentration of hydrogen in the first conductive film is greater than or equal to 5 times as high as a concentration of hydrogen in the oxide semiconductor film.

24. The semiconductor device according to claim 23, wherein the metal is one selected from the group consisting of magnesium, yttrium, and aluminum.

25. The semiconductor device according to claim 23, wherein the metal is one selected from the group consisting of titanium, molybdenum, and tungsten.

26. The semiconductor device according to claim 23, further comprising:
a first insulating film over the oxide semiconductor film, the source electrode, and the drain electrode; and
a second insulating film over the first insulating film,
wherein the first insulating film includes one of silicon oxide and silicon oxynitride, and
wherein the second insulating film includes one of silicon nitride, silicon nitride oxide, aluminum nitride, and aluminum nitride oxide.

27. The semiconductor device according to claim 23,
wherein the gate insulating film includes a first gate insulating film, and a second gate insulating film between the first gate insulating film and the oxide semiconductor film,
wherein the first gate insulating film includes one of silicon nitride, silicon nitride oxide, aluminum nitride, and aluminum nitride oxide, and
wherein the second gate insulating film includes one of silicon oxide and silicon oxynitride.

28. The semiconductor device according to claim 23, wherein the source electrode and the drain electrode comprise one selected from the group consisting of magnesium, yttrium, aluminum, titanium, molybdenum, and tungsten, and one selected from the group consisting of tantalum, chromium, neodymium, and scandium.

29. The semiconductor device according to claim 23, wherein a conductivity of the second conductive film is lower than a conductivity of the first conductive film.

30. The semiconductor device according to claim 23, wherein the oxide semiconductor film is formed over the gate electrode.

* * * * *

UNITED STATES PATENT AND TRADEMARK OFFICE
CERTIFICATE OF CORRECTION

PATENT NO. : 9,006,729 B2
APPLICATION NO. : 12/943558
DATED : April 14, 2015
INVENTOR(S) : Kengo Akimoto et al.

Page 1 of 1

It is certified that error appears in the above-identified patent and that said Letters Patent is hereby corrected as shown below:

In the Specification

At column 16, line 57, "bather" should be --barrier--;

At column 17, line 61, "bather" should be --barrier--;

At column 43, line 45, "circuit 102" should be --circuit 10_2--;

At column 43, line 47, "circuit 102" should be --circuit 10_2--;

In the Claims

In claim 16, at column 56, line 38, "a to" should be --a top--.

Signed and Sealed this
Sixth Day of October, 2015

Michelle K. Lee
*Director of the United States Patent and Trademark Office*